(12) United States Patent
Lee et al.

(10) Patent No.: US 11,705,341 B2
(45) Date of Patent: Jul. 18, 2023

(54) METHOD OF FABRICATING A SEMICONDUCTOR PACKAGE HAVING REDISTRIBUTION PATTERNS INCLUDING SEED PATTERNS AND SEED LAYERS

(71) Applicant: Samsung Electronics Co., Ltd., Suwon-si (KR)

(72) Inventors: Seokhyun Lee, Hwaseong-si (KR); Gwangjae Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/741,751

(22) Filed: May 11, 2022

(65) Prior Publication Data

US 2022/0270959 A1    Aug. 25, 2022

Related U.S. Application Data

(63) Continuation of application No. 16/885,546, filed on May 28, 2020, now Pat. No. 11,348,864.

(30) Foreign Application Priority Data

Oct. 18, 2019    (KR) ........................ 10-2019-0130111

(51) Int. Cl.
*H01L 21/48*    (2006.01)
*H01L 23/498*    (2006.01)

(52) U.S. Cl.
CPC ........ *H01L 21/4857* (2013.01); *H01L 21/486* (2013.01); *H01L 23/49822* (2013.01); *H01L 23/49838* (2013.01); *H01L 23/49894* (2013.01)

(58) Field of Classification Search
CPC ........ H01L 23/49822; H01L 23/49838; H01L 23/49894; H01L 21/4857; H01L 21/486
See application file for complete search history.

(56) References Cited

U.S. PATENT DOCUMENTS

| | | |
|---|---|---|
| 8,436,255 B2 | 5/2013 | Goh |
| 8,952,543 B2 | 2/2015 | Lee et al. |
| 10,332,792 B1 | 6/2019 | Gambee |
| 10,515,921 B2 | 12/2019 | Yu et al. |
| 10,872,864 B2 | 12/2020 | Wang et al. |

(Continued)

FOREIGN PATENT DOCUMENTS

| | | |
|---|---|---|
| TW | 201906029 A | 2/2019 |
| TW | 201911515 A | 3/2019 |

*Primary Examiner* — Michael Jung
(74) *Attorney, Agent, or Firm* — Muir Patent Law, PLLC

(57) ABSTRACT

Disclosed are redistribution substrates and semiconductor packages including the same. For example, a redistribution substrate including a dielectric pattern, and a first redistribution pattern in the dielectric pattern is provided. The first redistribution pattern may include: a first via part having a first via seed pattern and a first via conductive pattern on the first via seed pattern, and a first wiring part having a first wiring seed pattern and a first wiring conductive pattern, the first wiring part being disposed on the first via part and having a horizontal width that is different from a horizontal width of the first via part. Additionally, the first wiring seed pattern may cover a bottom surface and a sidewall surface of the first wiring conductive pattern, and the first via conductive pattern is directly connected to the first wiring conductive pattern.

20 Claims, 50 Drawing Sheets

(56) References Cited

U.S. PATENT DOCUMENTS

| | | |
|---|---|---|
| 2014/0252626 A1 | 9/2014 | Kang et al. |
| 2017/0330767 A1 | 11/2017 | Kang et al. |
| 2018/0005930 A1 | 1/2018 | Chiu et al. |
| 2018/0151500 A1 | 5/2018 | Chen et al. |
| 2019/0035728 A1 | 1/2019 | Venegoni et al. |
| 2019/0035757 A1 | 1/2019 | Yu et al. |
| 2019/0131228 A1 | 5/2019 | Chun et al. |
| 2019/0172865 A1 | 6/2019 | Cho et al. |
| 2019/0267314 A1* | 8/2019 | Lee ........................ H01L 25/117 |
| 2020/0075496 A1 | 3/2020 | Yu et al. |
| 2020/0126923 A1 | 4/2020 | Hu et al. |
| 2020/0295121 A1* | 9/2020 | Liao ...................... H01L 21/486 |

* cited by examiner

METHOD OF FABRICATING A SEMICONDUCTOR PACKAGE HAVING REDISTRIBUTION PATTERNS INCLUDING SEED PATTERNS AND SEED LAYERS

CROSS-REFERENCE TO RELATED APPLICATION

This U.S. nonprovisional application is continuation of and claims priority to U.S. patent application Ser. No. 16/855,546 filed May 28, 2020, which claims priority under 35 U.S.C § 119 to Korean Patent Application No. 10-2019-0130111 filed on Oct. 18, 2019, in the Korean Intellectual Property Office, the disclosures of which are hereby incorporated by reference in their entirety.

BACKGROUND

The present inventive concepts relate to semiconductor packages, and more particularly, to redistribution substrates and semiconductor packages including the same.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. With the development of the electronic industry, various studies have been conducted to improve reliability and durability of semiconductor packages.

SUMMARY

Some example embodiments of the present inventive concepts provide a redistribution substrate with improved reliability and durability and a method of fabricating the same.

According to some example embodiments of the present inventive concepts, a redistribution substrate including a dielectric pattern, and a first redistribution pattern in the dielectric pattern is provided. The first redistribution pattern may include: a first via part having a first via seed pattern and a first via conductive pattern on the first via seed pattern, and a first wiring part having a first wiring seed pattern and a first wiring conductive pattern, the first wiring part being disposed on the first via part and having a horizontal width that is different from a horizontal width of the first via part. Additionally, the first wiring seed pattern may cover a bottom surface and a sidewall surface of the first wiring conductive pattern, and the first via conductive pattern is directly connected to the first wiring conductive pattern.

According to some example embodiments of the present inventive concepts, a redistribution substrate including a dielectric pattern, and a first redistribution pattern in the dielectric pattern is provided. The first redistribution pattern may include: a first via part having a first via seed pattern and a first via conductive pattern on the first via seed pattern, the first via seed pattern being between the first via conductive pattern and the dielectric pattern, and a first wiring part disposed on the first via part and connected to the first via part, the first wiring part having a first wiring seed pattern and a first wiring conductive pattern. Additionally, the first wiring seed pattern may be between the dielectric pattern and a sidewall of the first wiring conductive pattern. Furthermore, a first angle between a bottom surface and a sidewall of the first via part is greater than a second angle between a bottom surface and a sidewall of the first wiring part.

According to some example embodiments of the present inventive concepts, a semiconductor package may including a redistribution substrate that includes a dielectric pattern and a first redistribution pattern in the dielectric pattern, and a semiconductor chip on the redistribution substrate are provided. The first redistribution pattern may include a first via part having a first via seed pattern and a first via conductive pattern on the first via seed pattern, the first via seed pattern may be between the dielectric pattern and the first via conductive pattern. The first redistribution pattern may further include a first wiring part having a first wiring seed pattern and a first wiring conductive pattern, the first wiring seed pattern extending onto a bottom surface and a sidewall of the first wiring conductive pattern. Additionally, a first angle between a bottom surface and a sidewall of the first via part may be greater than a second angle between a bottom surface and a sidewall of the first wiring part, and the first wiring conductive pattern may be directly connected to the first via conductive pattern.

DETAILED DESCRIPTION OF EMBODIMENTS

Figure 1A:
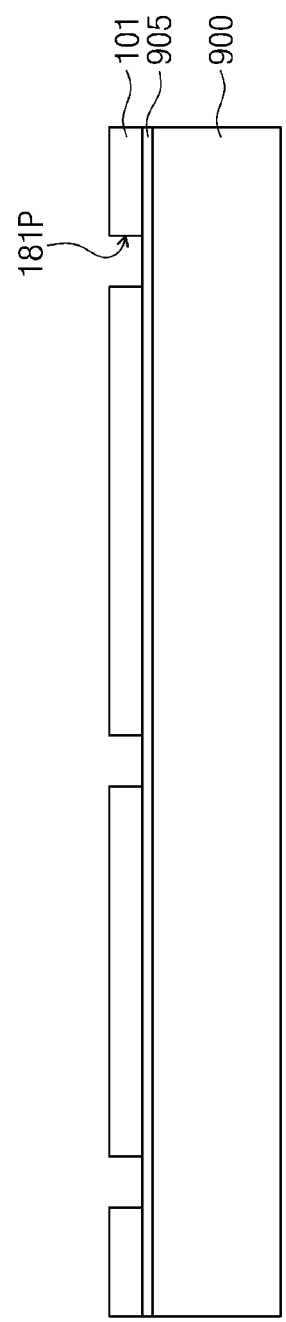
FIGS. 1A, 1B, 1D, 1E, 1G to 1K, 1M, 1N, 1P, and 1Q illustrate cross-sectional views showing a method of fabricating a semiconductor package according to some example embodiments.

In this description, like reference numerals may indicate like components. The following will now describe redistribution substrates, methods of fabricating the redistribution substrates, semiconductor packages, and methods of fabricating the semiconductor packages according to the present inventive concepts.

FIGS. 1A, 1B, 1D, 1E, 1G to 1K, 1M, 1N, 1P, and 1Q illustrate cross-sectional views showing a method of fabricating a semiconductor package according to some example embodiments. FIG. 1C illustrates an enlarged view showing section I of FIG. 1B. FIG. 1F illustrates an enlarged view showing section I of FIG. 1E. FIG. 1L illustrates an enlarged view showing section I of FIG. 1K. FIG. 1O illustrates an enlarged view showing section I of FIG. 1N. FIG. 1R illustrates an enlarged view showing section I of FIG. 1Q.

Referring to FIG. 1A, a first dielectric layer 101 may be formed on a carrier substrate 900. A carrier adhesive layer 905 may further be interposed between the carrier substrate 900 and the first dielectric layer 101. The carrier adhesive layer 905 may attach the first dielectric layer 101 to the carrier substrate 900. Herein, the phrase "a certain component is formed/provided on the carrier substrate 900" may include a meaning that the carrier adhesive layer 905 is interposed between the certain component and the carrier substrate 900. The phrase "the carrier substrate 900 is exposed" may include a meaning that the carrier adhesive layer 905 is exposed, at least partially. For example, the phrase "the carrier substrate 900 is exposed" may include a meaning where the carrier substrate 900 is exposed without being fully interposed between the certain component and the carrier substrate 900. The formation of the first dielectric layer 101 may be performed by a coating process, such as spin coating or slit coating, for example. The first dielectric layer 101 may include, for example, a photosensitive polymer. In this description, the photosensitive polymer may include, for example, one or more of photosensitive polyimide, polybenzoxazole, phenolic polymers, and benzocyclobutene based polymers.

The first dielectric layer 101 may be patterned to form a first preliminary hole 181P in the first dielectric layer 101. The first preliminary hole 181P may expose the carrier substrate 900 and/or the carrier adhesive layer 905. The patterning of the first dielectric layer 101 may be performed by exposure and development processes, for example. The exposure process may be a negative tone exposure process or a positive tone exposure process.

Figure 1B:
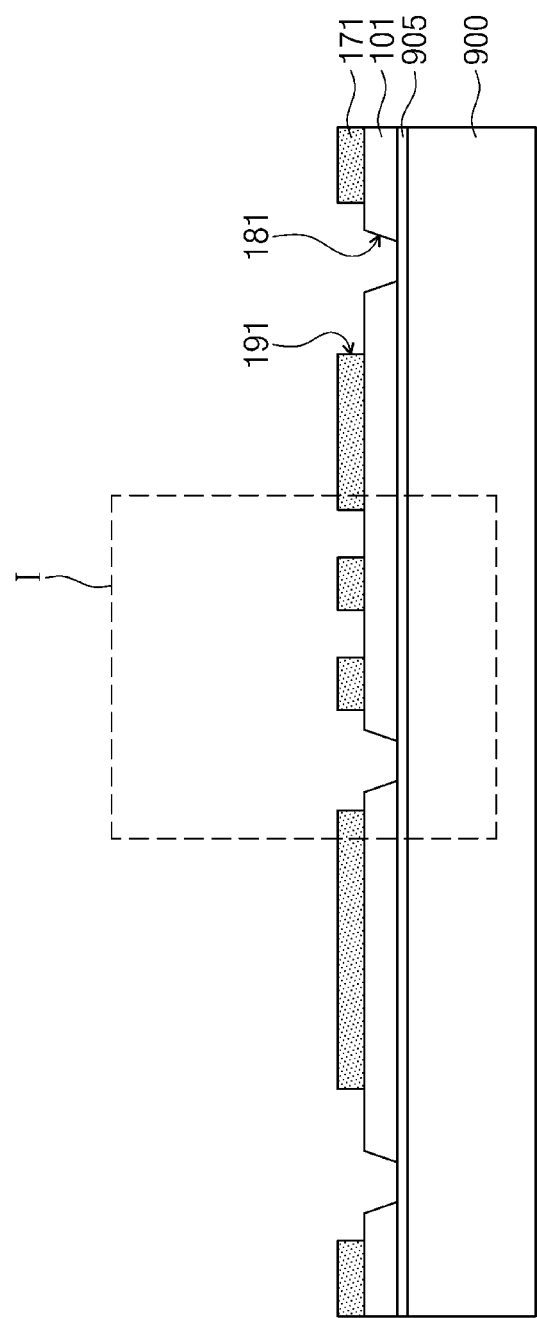
Figure 1C:
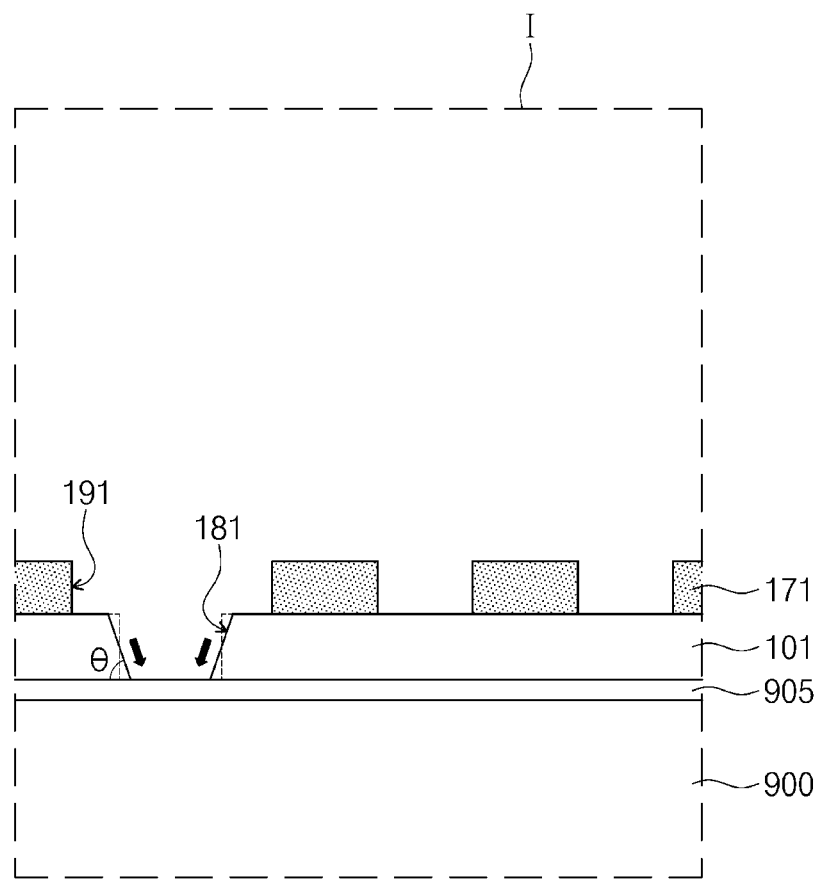
FIG. 1C illustrates an enlarged view showing section I of FIG. 1B.

Referring to FIGS. 1B and 1C, the first dielectric layer 101 may experience a curing process to form a first hole 181. The curing of the first dielectric layer 101 may be performed by a thermal curing process. During the curing process, as shown in FIG. 1C, a portion of the first dielectric layer 101 may flow toward the first preliminary hole 181P to form the first hole 181. The first hole 181 may have a tapered shape. For example, the first hole 181 may have a greater diameter (or cross-sectional length) at an upper portion thereof than at a lower portion thereof. In this case, the lower portion of the first hole 181 may be closer to the carrier substrate 900 than the upper portion of the first hole 181. The first hole 181 may expose an inner wall of the first dielectric layer 101. The inner wall of the first dielectric layer 101 may correspond to a sidewall of the first hole 181. Because the first hole 181 has the tapered shape as shown in FIG. 1C, the inner wall may have an acute angle θ relative to a bottom surface of the first dielectric layer 101. For example, the angle θ between the inner wall and the bottom surface of the first dielectric layer 101 may range from about 30° to about 80°.

A first resist pattern 171 may be formed on the first dielectric layer 101. The first resist pattern 171 may have a first trench 191. The first trench 191 may be spatially connected to the first hole 181, e.g., the first hole 181 may be disposed within an area corresponding to the first trench 191. The first trench 191 may expose at least a portion of a top surface of the first dielectric layer 101. The first resist pattern 171 may include a different material from that of the first dielectric layer 101. For example, the first resist pattern 171 may include a photoresist material. The photoresist material may include an organic material such as a polymer. In example embodiments where the first resist pattern 171 includes the photoresist material, no curing process may be required during the formation of the first resist pattern 171. Therefore, the first trench 191 may not change into a tapered shape and may instead have sidewalls that are approximately at right angles with respect to a surface of the first dielectric layer 101. According to some embodiments, the first trench 191 may have an angle of about 85° to about 95° between a sidewall and a bottom surface thereof.

Figure 1D:
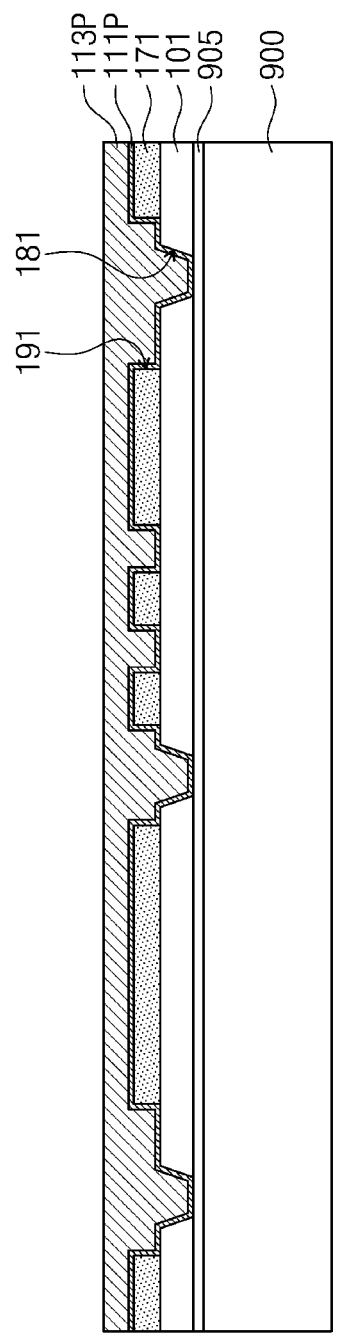

Referring to FIG. 1D, a first seed layer 111P and a first conductive layer 113P may be formed in the first hole 181 and the first trench 191. The first seed layer 111P may conformally cover a bottom surface and the sidewall surfaces of the first hole 181, the sidewall surfaces and the bottom surface of the first trench 191, and a top surface of the first resist pattern 171. For example, the first seed layer 111P and the first conductive layer 113P may completely fill the first hole 181 and the first trench 191. The bottom surface of the first hole 181 may correspond to a surface of the carrier substrate 900 or the carrier adhesive layer 905 exposed by the first dielectric layer 101. The bottom surface of the first trench 191 may correspond to the top surface of the first dielectric layer 101, and the sidewall of the first trench 191 may correspond to an inner wall of the first resist pattern 171. The first seed layer 111P may include a conductive material. For example, the first seed layer 111P may include one or both of titanium and tantalum.

The first conductive layer 113P may be formed on the first seed layer 111P, and may fill the first hole 181 and the first trench 191. The first conductive layer 113P may be formed by performing an electroplating process in which the first seed layer 111P is used as an electrode. The first conductive layer 113P may include metal, such as copper for example. The first conductive layer 113P may extend onto and along the top surface of the first resist pattern 171.

Figure 1E:
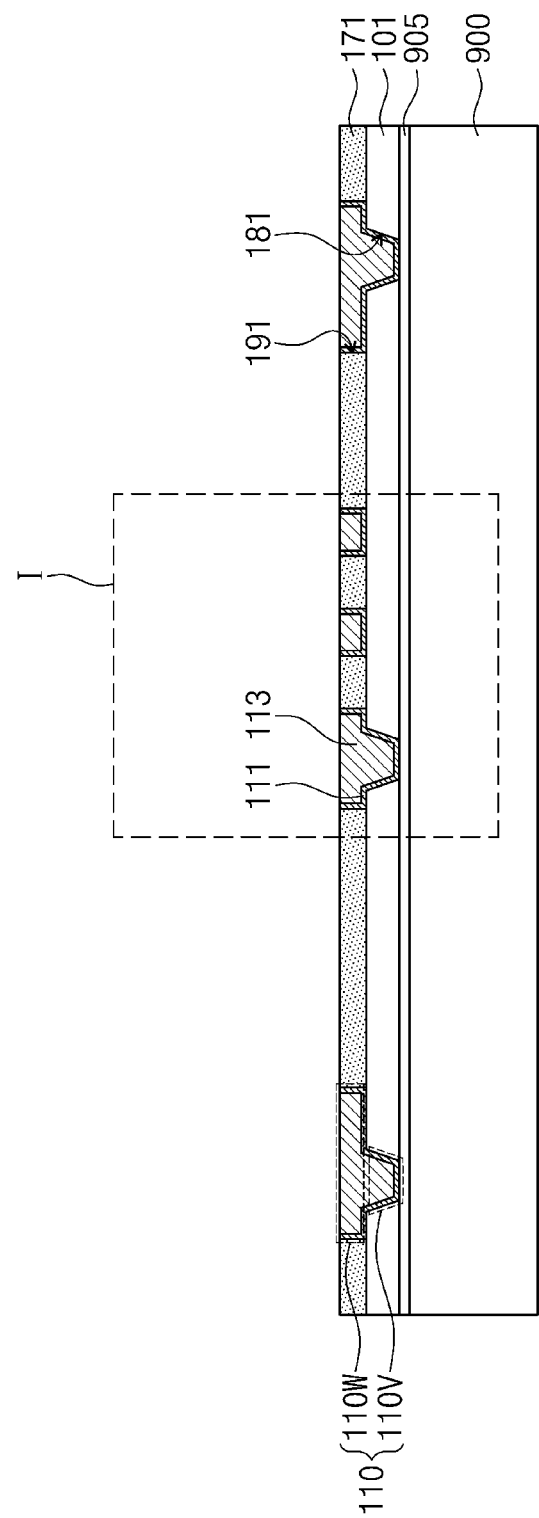
Figure 1F:
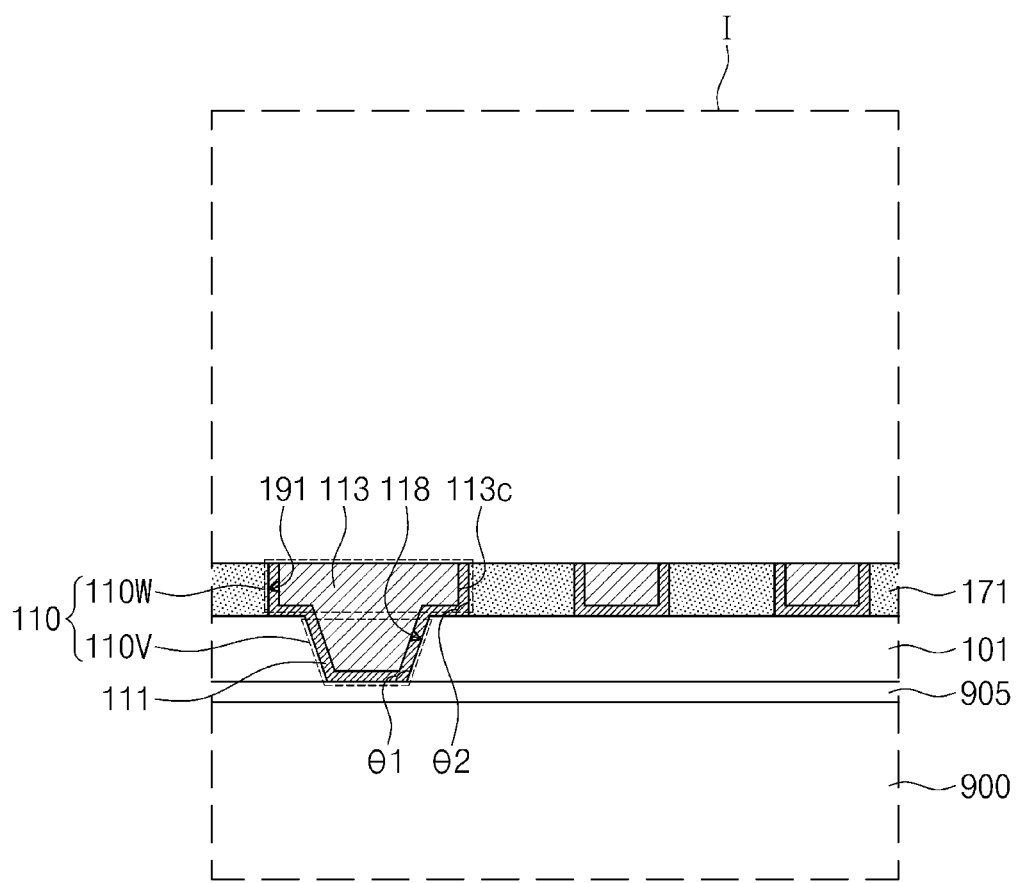
FIG. 1F illustrates an enlarged view showing section I of FIG. 1E.

Referring to FIGS. 1E and 1F, the first seed layer 111P and the first conductive layer 113P may experience a planarization process to form a first seed pattern 111 and a first conductive pattern 113. The planarization process may include, for example, a chemical mechanical polishing process. The planarization process may continue until the top surface of the first resist pattern 171 is exposed. The planarization process may remove the first seed layer 111P and the first conductive layer 113P from the top surface of the first resist pattern 171, thereby forming the first seed pattern 111 and the first conductive pattern 113. Each of the first seed pattern 111 and the first conductive pattern 113 may be confined in the first hole 181 and the first trench 191.

Accordingly, a first redistribution pattern 110 may be formed. In example embodiments, a first redistribution pattern 110 may include a first seed pattern 111 and a first conductive pattern 113 that are disposed inside of and/or confined by a first hole 181 and a first trench 191. Likewise, a first redistribution pattern 110 may include a plurality of first seed patterns 111 and a plurality of first conductive patterns 113 that are disposed inside of and/or confined by a plurality of first holes 181 and a plurality of first trenches 191. The first redistribution pattern 110 may include the first seed pattern 111 and the first conductive pattern 113. As a result of the planarization process, the first redistribution pattern 110 may have a relatively flat top surface.

The first redistribution pattern 110 may include a first via part 110V and a first wiring part 110W. The first via part 110V may be provided in the first hole 181 of the first dielectric layer 101. The first via part 110V may have a shape that corresponds to that of the first hole 181. Because the first hole 181 has the tapered shape, the first via part 110V may have a first angle θ1, or an obtuse angle, between a bottom surface and a sidewall thereof. For example, the first angle θ1 may range from about 100° to about 150°.

The first wiring part 110W may be provided on and connected to the first via part 110V. The first wiring part 110W may have a different width from that of the first via part 110V. For example, the first wiring part 110W may have an average width in a horizontal direction that is different than an average width of the first via part 110V in the horizontal direction. The first wiring part 110W may have a greater width or length in the horizontal direction than that of the first via part 110V. The first wiring part 110W may have a top surface substantially parallel to the bottom surface of the first dielectric layer 101 in the horizontal direction. The first wiring part 110W may be provided in the first trench 191 of the first resist pattern 171. The first wiring part 110W may have a shape that corresponds to that of the first trench 191. As shown in FIG. 1F, a second angle θ2 between a bottom surface and a sidewall of the first wiring part 110W may be different from the first angle θ1. The second angle θ2 may be less than the first angle θ1. For example, the second angle θ2 may range from about 85° to about 95°.

Each of the first via part 110V and the first wiring part 110W may include the first seed pattern 111 and the first conductive pattern 113. For example, the first seed pattern 111 may extend into both the first via part 110V and the first wiring part 110W. Likewise, the first conductive pattern 113 may extend into both the first via part 110V and the first wiring part 110W. In this way, a first via part 110V may be considered as having a first via seed pattern and a first via conductive pattern on the first via seed pattern and a first wiring part 110W may be considered as having a first wiring seed pattern and a first wiring conductive pattern. For example, the first seed pattern 111 may be considered as including both the first via seed pattern and the first wiring seed pattern. Likewise, the first conductive pattern 113 may be considered as including both the first via conductive pattern and the first wiring conductive pattern. Furthermore, the first wiring part 110W may be disposed on the first via part 110V and may have a horizontal width that is different from a horizontal width of the first via part 110V.

The first wiring part 110W and the first via part 110V may be formed in a single process. Therefore, the first conductive pattern 113 of the first via part 110V may be directly connected to the first conductive pattern 113 of the first wiring part 110W. For example, the first conductive patterns 113 of the first via part 110V and the first wiring part 110W may be integrally formed and connected with each other with no boundary therebetween. The first seed pattern 111 may not be provided between the first conductive pattern 113 of the first via part 110V and the first conductive pattern 113 of the first wiring part 110W.

The first seed pattern 111 of the first via part 110V may be directly connected to the first seed pattern 111 of the first wiring part 110W, with no boundary therebetween. The first seed pattern 111 may be provided on a bottom surface of the first conductive pattern 113 of the first via part 110V, and may be interposed between the first dielectric layer 101 and a sidewall of the first conductive pattern 113 of the first via part 110V. Additionally, the first seed pattern 111 may be disposed between the first dielectric layer 101 and a bottom surface of the first conductive pattern 113 of the first wiring part 110W. The first seed pattern 111 may extend onto and cover a sidewall 113c of the first conductive pattern 113 of the first wiring part 110W. The first seed pattern 111 may not cover a top surface of the first conductive pattern 113 of the first wiring part 110W.

Figure 1G:
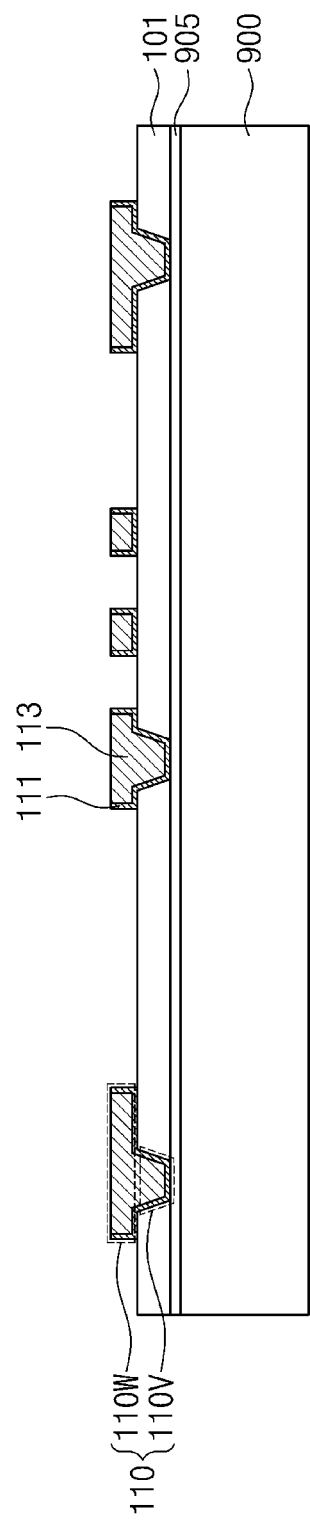

Referring to FIG. 1G, the first resist pattern 171 may be removed to expose the top surface of the first dielectric layer 101 and the sidewall of the first wiring part 110W. The sidewall of the first wiring part 110W may correspond to an outer wall of the first seed pattern 111. For example, the first wiring part 110W may conform to an outer wall of the first seed pattern 111. The removal of the first resist pattern 171 may be performed by a strip process, for example.

Figure 1H:
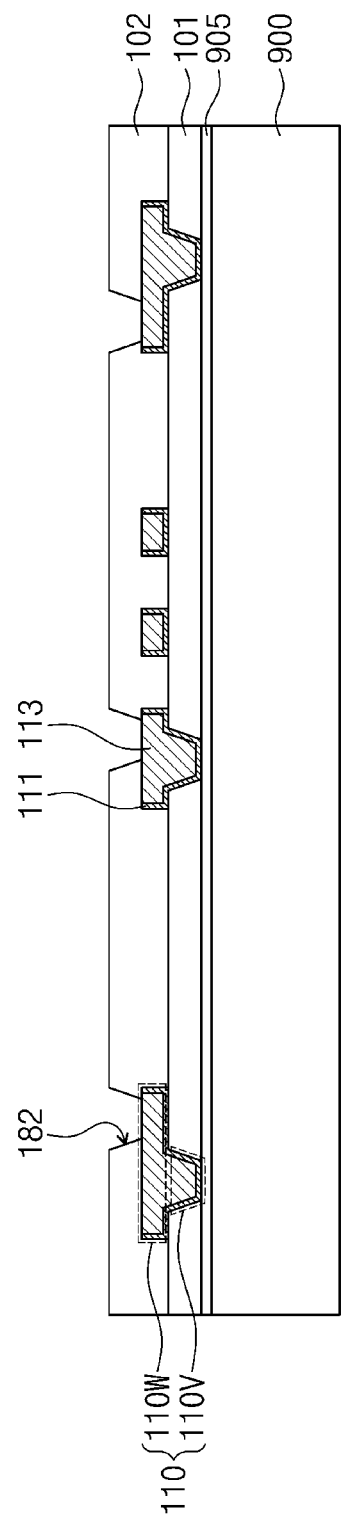

Referring to FIG. 1H, a second dielectric layer 102 may be formed on the first dielectric layer 101, and may cover the top surface of the first dielectric layer 101, the sidewall of the first wiring part 110W, and the top surface of the first wiring part 110W. The first seed pattern 111 may be interposed between the second dielectric layer 102 and the sidewall (see 113c of FIG. 1F) of the first conductive pattern 113 of the first wiring part 110W. The second dielectric layer 102 may not physically contact the sidewall 113c of the first conductive pattern 113 of the first wiring part 110W. For example, the second dielectric layer 102 may not physically contact any sidewall 113c of any first conductive pattern 113.

The second dielectric layer 102 may include, for example, a photosensitive polymer. A boundary between the first and second dielectric layers 101 and 102 may not be distinct, but inventive concepts are not limited thereto. For example, the first and second dielectric layers 101 and 102 may be integrally bonded. A second hole 182 may be formed in the second dielectric layer 102, and may expose the top surface of the first redistribution pattern 110. After the formation of the second hole 182, a curing process may be performed on the second dielectric layer 102. Therefore, the second hole 182 may have a tapered shape. For example, an angle of about 110° to about 150° may be formed between a bottom surface of the second hole 182 and a sidewall of the second hole 182.

Figure 1I:
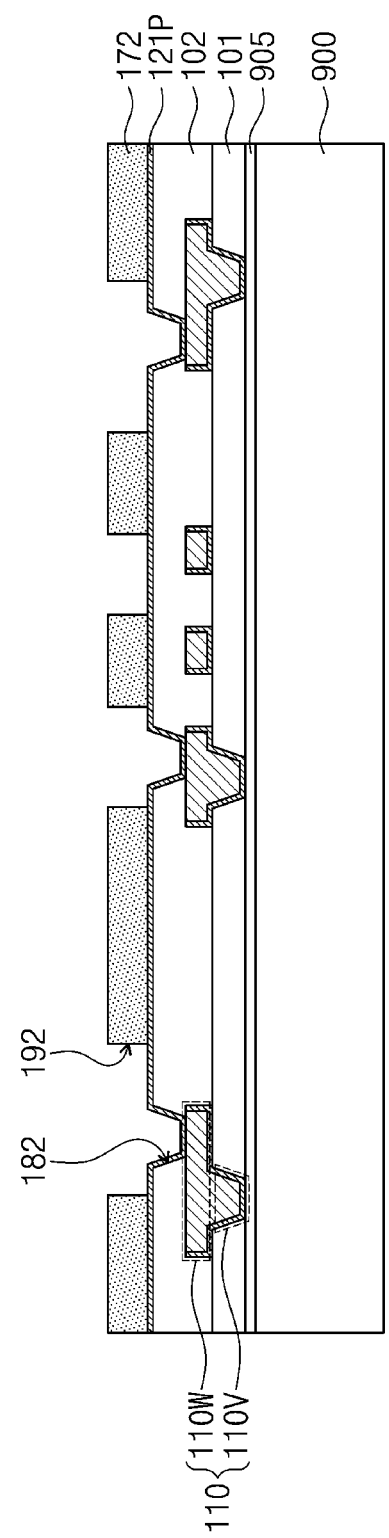

Referring to FIG. 1I, a second seed layer 121P may be formed in the second hole 182 and on a top surface of the second dielectric layer 102. The second seed layer 121P may conformally cover the exposed top surface of the first redistribution pattern 110, an inner wall of the second dielectric layer 102, and the top surface of the second dielectric layer 102. The second seed layer 121P may include a conductive material, such as titanium and/or tantalum.

A second resist pattern 172 may be formed on the second seed layer 121P. A second trench 192 may be formed in the second resist pattern 172 and may expose the second seed layer 121P. At least a portion of the second trench 192 may overlap the second hole 182. For example, the second trench 192 may be spatially connected to the second hole 182, e.g., the second hole 182 may be disposed within an area corresponding to the second trench 192. According to some embodiments, a curing process may not be performed on the second resist pattern 172. For example, an angle of 85° to 95° may be formed between a sidewall and a bottom surface of the second trench 192.

Figure 1J:
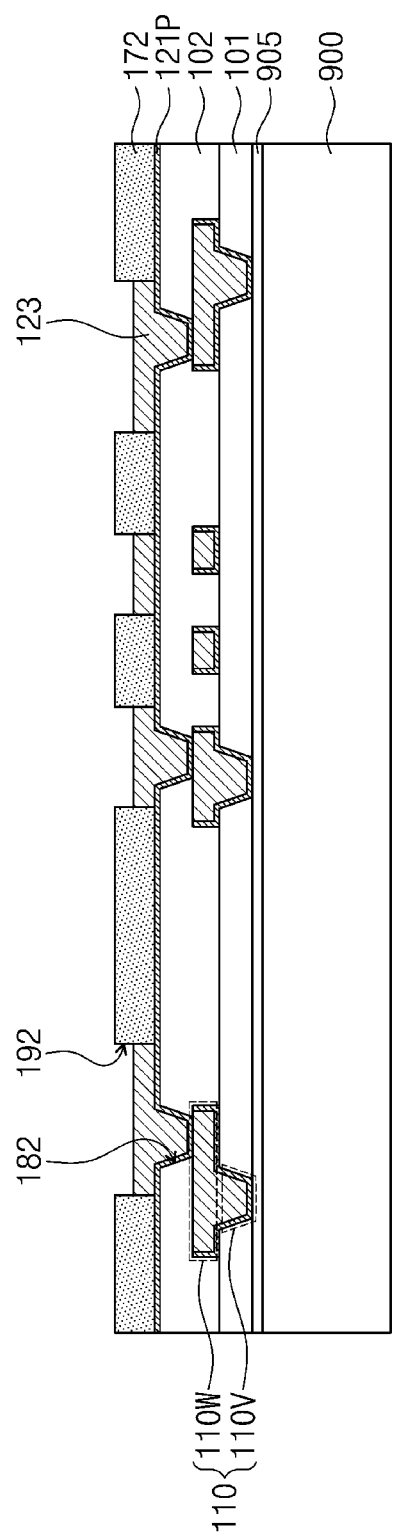

Referring to FIG. 1J, the second conductive pattern 123 may be formed in the second trench 192 and the second hole 182, and may cover the second seed layer 121P. The second conductive pattern 123 may be formed by performing an electroplating process in which the second seed layer 121P is used as an electrode. The second conductive pattern 123 may fill the second hole 182 and may not extend onto a top surface of the second resist pattern 172. For example, the second conductive pattern 123 may completely fill the second hole 182 and second trench 192 while also having a top surface that is at an even level (or height) with a top surface of the second resist pattern 172. Thus, a planarization process may not be performed separately. The second conductive pattern 123 may include metal, such as copper for example.

Figure 1K:
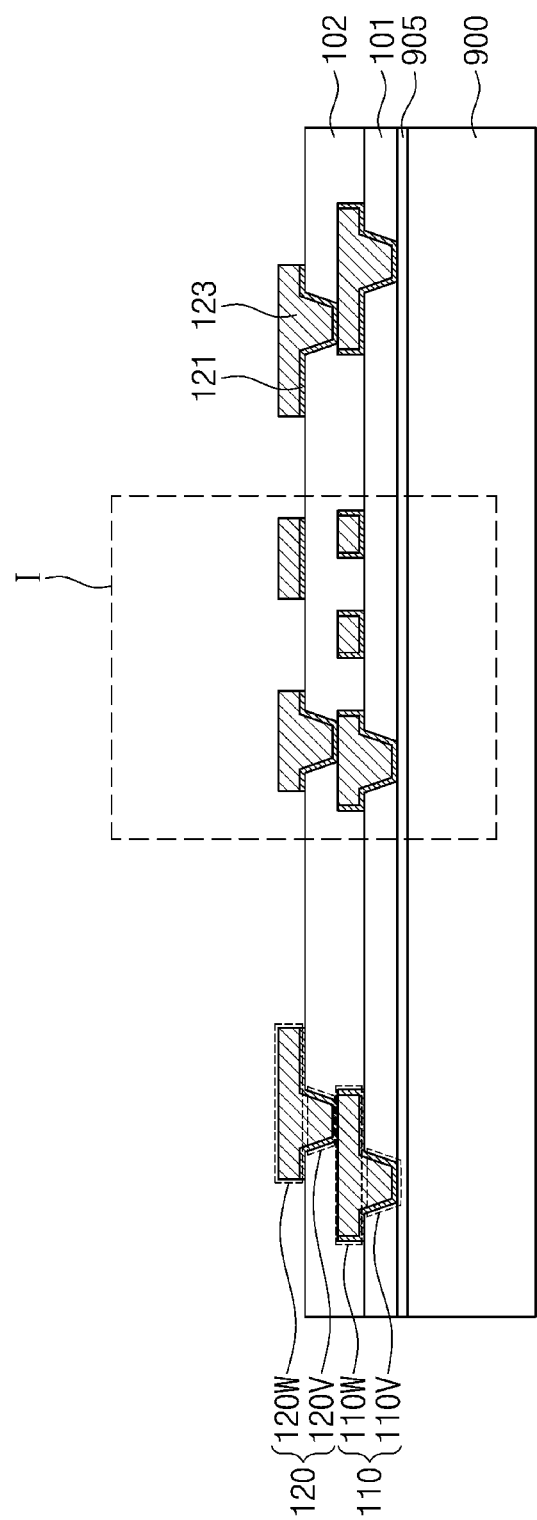
Figure 1L:
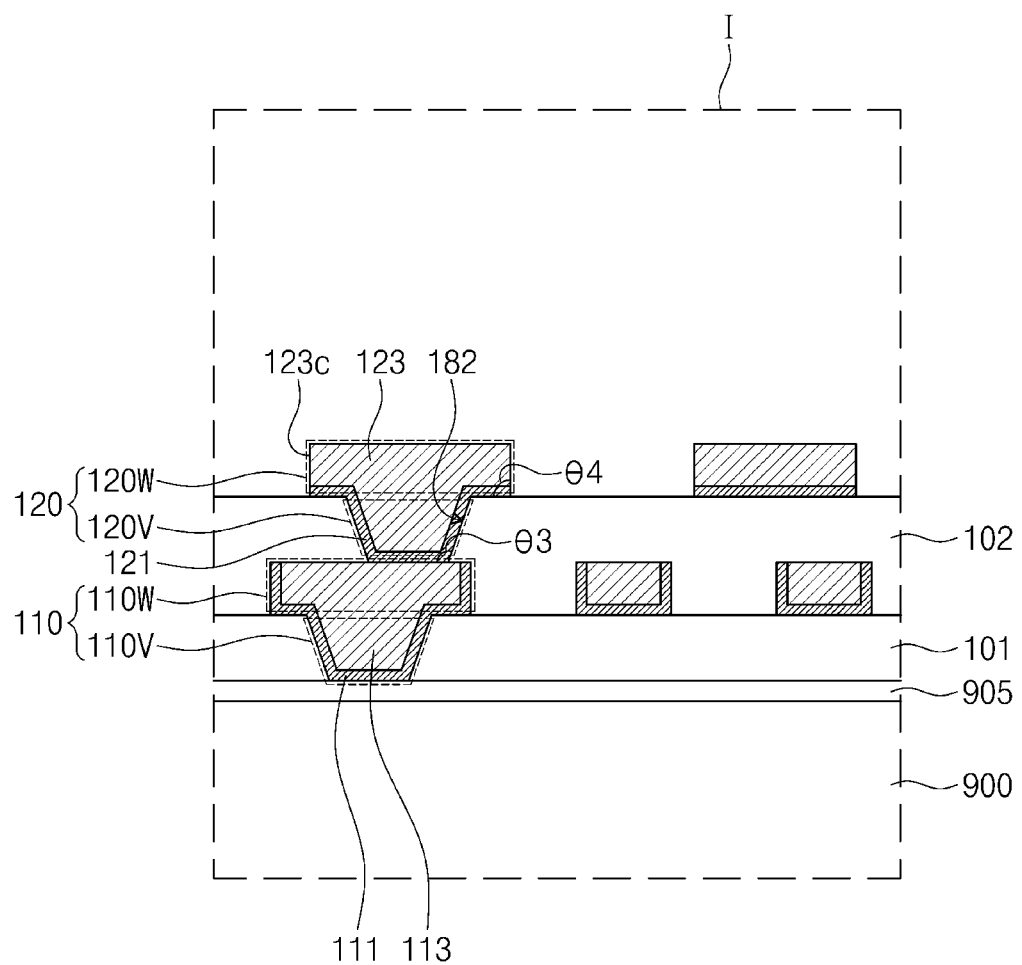
FIG. 1L illustrates an enlarged view showing section I of FIG. 1K.

Referring to FIGS. 1K and 1L, the second resist pattern 172 may be removed to expose a top surface of the second seed layer 121P and an upper sidewall of the second conductive pattern 123. An exposed portion of the second seed layer 121P may be removed to expose the top surface of the first dielectric layer 101. The removal of the second seed layer 121P may be performed by an etching process. In the etching process, the second conductive pattern 123 may have an etch selectivity with respect to the second seed layer 121P. Another portion of the second seed layer 121P may be disposed on a bottom surface of the second conductive pattern 123 and may thus not be removed in the etching process. After the etching process, the portion of the second seed layer 121P disposed on a bottom surface of the second conductive pattern 123 may constitute a second seed pattern 121. Accordingly, a second redistribution pattern 120 may be formed. The second redistribution pattern 120 may include the second seed pattern 121 and the second conductive pattern 123.

The second redistribution pattern 120 may include a second via part 120V and a second wiring part 120W. The second via part 120V may be provided in the second hole 182 of the second dielectric layer 102. The second via part 120V may have a shape that corresponds to that of the second hole 182. Because the second hole 182 has the tapered shape as shown in FIG. 1L, the second via part 120V may have a third angle θ3, or an obtuse angle, between a bottom surface and a sidewall thereof. For example, the third angle θ3 may range from about 100° to about 150°.

The second wiring part 120W may be provided on and connected to the second via part 120V. The second wiring part 120W may have a greater width or length in the horizontal direction than that of the second via part 120V. At least a portion of the second wiring part 120W may extend onto the second dielectric layer 102. The second wiring part 120W may have a shape that corresponds to that of the second trench 192 discussed above with reference to FIG. 1I. A fourth angle θ4 between a bottom surface and a sidewall of the second wiring part 120W may be different from the third angle θ3. The fourth angle θ4 may be less than the third angle θ3. For example, the fourth angle θ4 may range from about 85° to about 95°. The second wiring part 120W may have a top surface substantially parallel to the bottom surface of the first dielectric layer 101. In this description, the phrase "is parallel" may include a meaning where an error may have occurred in various manufacturing processes particularly when the error does not materially affect the operation of the redistribution structure. The top surface of the second wiring part 120W may be located at a different level from that of the top surface of the first wiring part 110W. For example, in a cross-section view, an elevation of the second wiring part 120W is different than an elevation the first wiring part 110W with respect to a bottommost surface of the redistribution substrate.

Each of the second via part 120V and the second wiring part 120W may include the second seed pattern 121 and the second conductive pattern 123. For example, the second seed pattern 121 may extend into both the second via part 120V and the second wiring part 120W. Likewise, the second conductive pattern 113 may extend into both the second via part 120V and the second wiring part 120W. In this way, a second via part 120V may be considered as having a second via seed pattern and a second via conductive pattern on the second via seed pattern and a second wiring part 120W may be considered as having a second wiring seed pattern and a second wiring conductive pattern. For example, the second seed pattern 121 may be considered as including both the second via seed pattern and the second wiring seed pattern. Likewise, the second conductive pattern 123 may be considered as including both the second via conductive pattern and the second wiring conductive pattern. Furthermore, the second wiring part 120W may be disposed on the second via part 120V and may have a horizontal width that is different from a horizontal width of the second via part 120V. In example embodiments where the second conductive pattern 123 of the second wiring part 120W is formed in a single process with the second conductive pattern 123 of the second via part 120V, the second conductive patterns 123 of the second via part 120V and the second wiring part 120W may be integrally formed and therefore connected to each other with no boundary therebetween. For example, they may be directly connected.

The second seed pattern 121 may be interposed between the second conductive pattern 123 and the first conductive pattern 113 and between the second conductive pattern 123 and the second dielectric layer 102. The second seed pattern 121 may cover a bottom surface of the second conductive pattern 123 of the second wiring part 120W and may expose a sidewall 123c of the second conductive pattern 123 of the second wiring part 120W. For example, the sidewall 123c of the second conductive pattern 123 may correspond to a sidewall of the second conductive pattern 123 of the second wiring part 120W that is not covered by the second seed pattern 121. For example still, the second seed pattern 121 does not cover any vertical sidewall surface of the second wiring conductive pattern 120W.

Figure 1M:
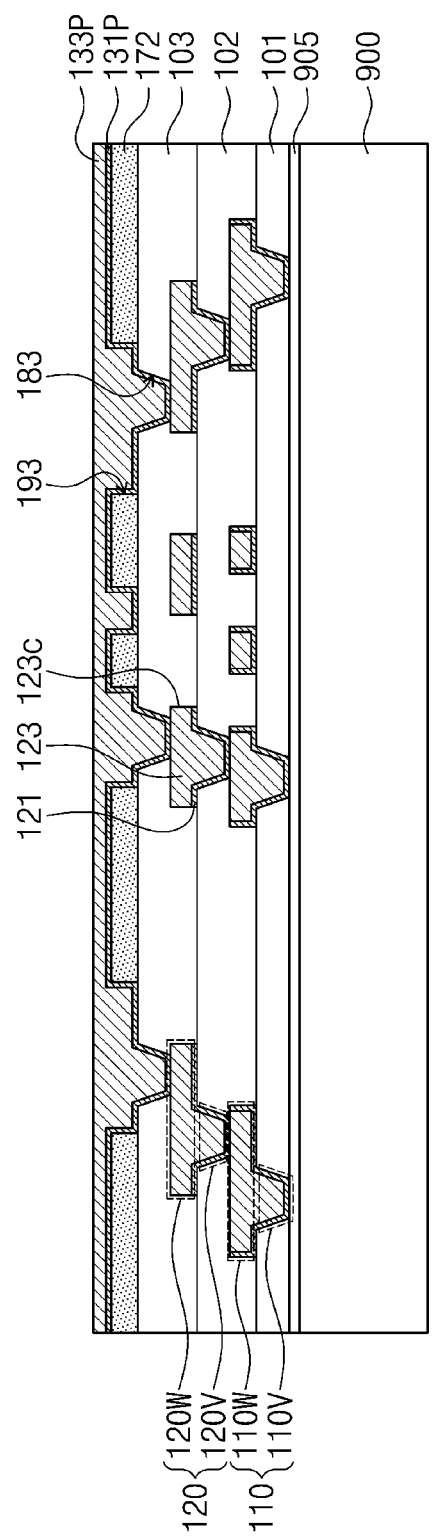

Referring to FIG. 1M, a third dielectric layer 103 may be formed on the second dielectric layer 102, and may cover the second redistribution pattern 120 and the top surface of the second dielectric layer 102. The sidewall 123c of the second conductive pattern 123 of the second wiring part 120W may be in direct physical contact with the third dielectric layer 103. For example, because the sidewall 123c is not covered by the second seed pattern 121, the sidewall 123c may be in direct physical contact with the third dielectric layer 103. The third dielectric layer 103 may include, for example, a photosensitive polymer. The third dielectric layer 103 and the second dielectric layer 102 may have a non-distinct boundary therebetween. A third hole 183 may be formed in the third dielectric layer 103, and may expose a top surface of the second redistribution pattern 120. After the formation of the third hole 183, a curing process may be performed on the third dielectric layer 103. The third hole 183 may have a tapered shape.

A third resist pattern 173 may be formed on the third dielectric layer 103. A third trench 193 may be formed in the third resist pattern 173. The third trench 193 may overlap the third hole 183 and may expose a top surface of the third dielectric layer 103. For example, the third trench 193 may be spatially connected to the third hole 183, e.g., the third hole 183 may be disposed within an area corresponding to the third trench 193. The third resist pattern 173 may include a photoresist material. It may not be required that a curing process be performed on the third resist pattern 173. Therefore, the third trench 193 may have an angle of 85° to 95° between a sidewall and a bottom surface thereof.

A third seed layer 131P and a third conductive layer 133P may be formed in the third hole 183 and the third trench 193. The third seed layer 131P may conformally cover a bottom surface of the third hole 183, an exposed inner wall and the top surface of the third dielectric layer 103, and an inner wall and a top surface of the third resist pattern 173. The bottom surface of the third hole 183 may correspond to the exposed top surface of the second redistribution pattern 120. The third seed layer 131P may be formed by a deposition process, for example. The third seed layer 131P may include a conductive material, such as titanium or tantalum.

The third conductive layer 133P may be formed by performing an electroplating process in which the third seed layer 131P is used as an electrode. The third conductive layer 133P may include metal, such as copper for example. The third conductive layer 133P may cover the third seed layer 131P. The third conductive layer 133P may fill remaining portions of the third hole 183 and the third trench 193, and may extend onto the top surface of the third resist pattern 173.

Figure 1N:
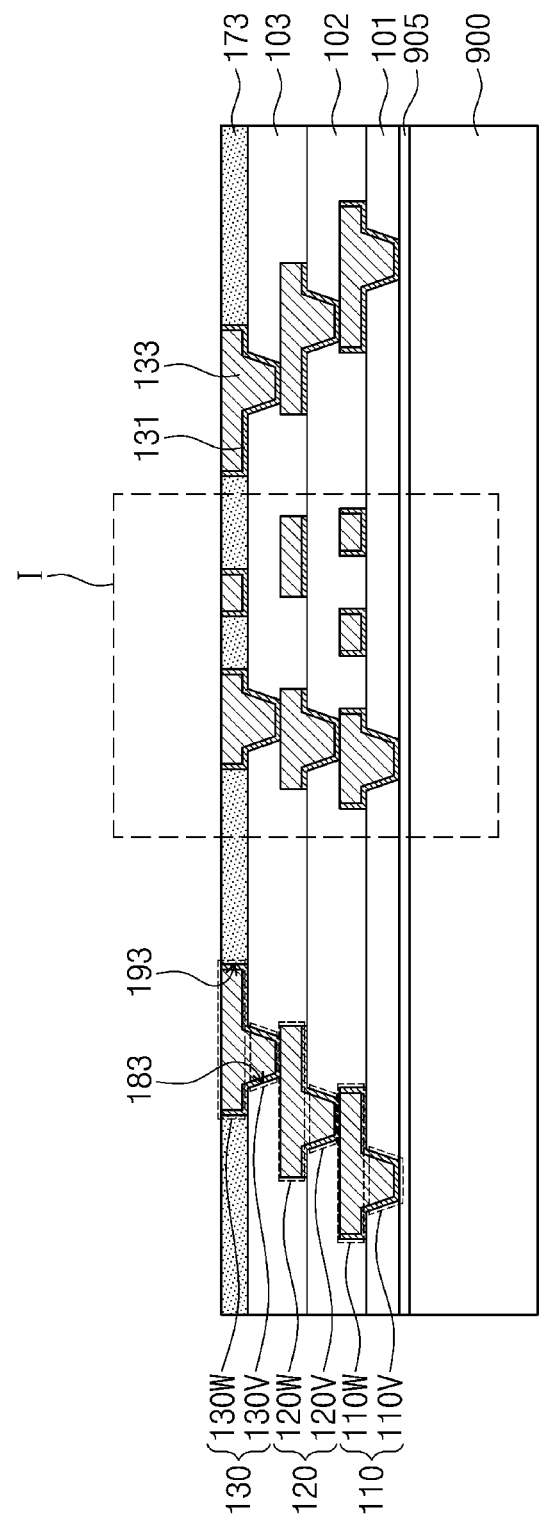
Figure 1O:
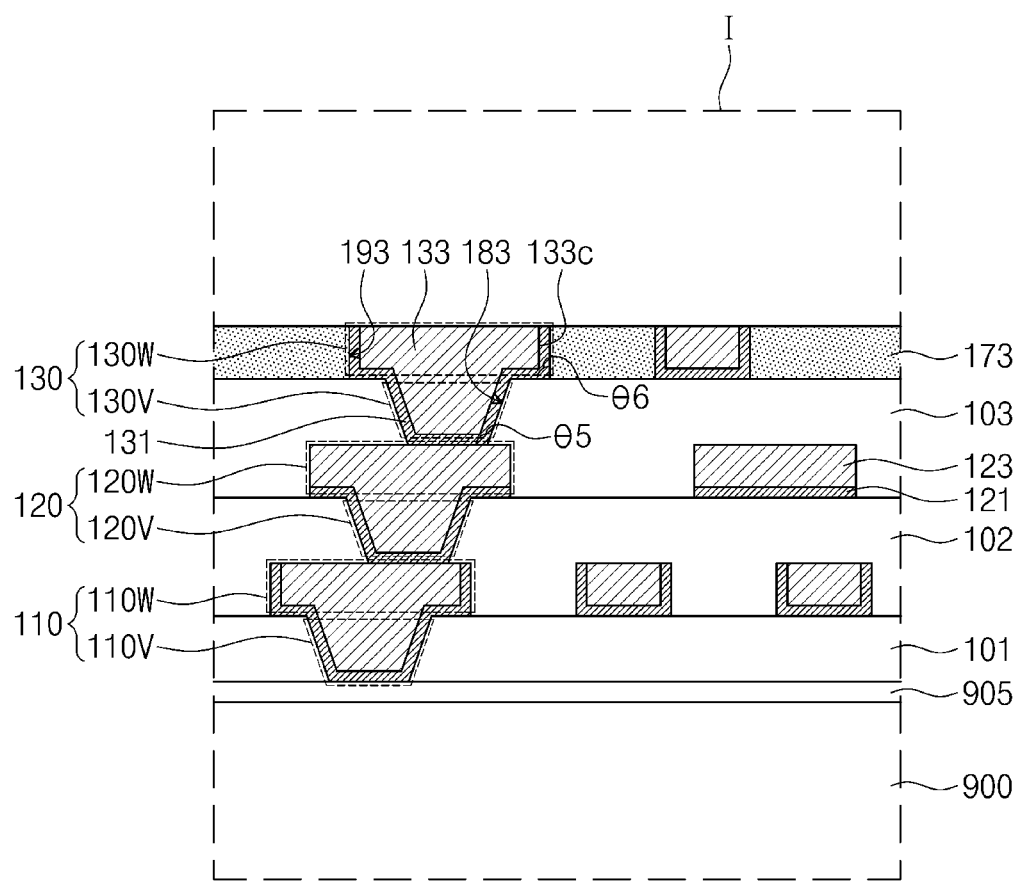
FIG. 1O illustrates an enlarged view showing section I of FIG. 1N.

Referring to FIGS. 1N and 1O, the third seed layer 131P and the third conductive layer 133P may experience a planarization process to form a third seed pattern 131 and a third conductive pattern 133. The third seed layer 131P and the third conductive layer 133P may be planarized to form the third seed pattern 131 and the third conductive pattern 133, respectively. Accordingly, a third redistribution pattern 130 may be formed. The third redistribution pattern 130 may include the third seed pattern 131 and the third conductive pattern 133. The third redistribution pattern 130 may be confined in the third hole 183 and the third trench 193. On the third seed pattern 131, the third conductive pattern 133 may fill the third hole 183 and the third trench 193. The planarization process may cause the third redistribution pattern 130 to have a relatively flat top surface, e.g., a planar top surface. For example, the third conductive pattern 133 may have a top surface whose surface roughness is less than that of a top surface of the second conductive pattern 123.

The third redistribution pattern 130 may include a third via part 130V and a third wiring part 130W. The third via part 130V may be provided in the third hole 183 of the third dielectric layer 103. The third via part 130V may have a shape that corresponds to that of the third hole 183. As shown in FIG. 1O, the third via part 130V may have a fifth angle θ5, or an obtuse angle, between a bottom surface and a sidewall thereof. For example, the fifth angle θ5 may range from about 100° to about 150°.

The third wiring part 130W may be provided on and connected to the third via part 130V. The third wiring part 130W may have a top surface that is substantially parallel to the bottom surface of the first dielectric layer 101, and that is located at a different level (or elevation) from that of the top surface of the first wiring part 110W and that of the top surface of the second wiring part 120W. The third wiring part 130W may be provided in the third trench 193 of the third resist pattern 173. The third wiring part 130W may have a shape that corresponds to that of the third trench 193. A sixth angle θ6 between a bottom surface and a sidewall of the third wiring part 130W may be different from the fifth angle θ5. The sixth angle θ6 may be less than the fifth angle θ5. For example, the sixth angle θ6 may range from about 85° to about 95°.

Each of the third via part 130V and the third wiring part 130W may include the third seed pattern 131 and the third conductive pattern 133. For example, the third seed pattern 131 may extend into both the third via part 130V and the third wiring part 130W. Likewise, the third conductive pattern 133 may extend into both the third via part 130V and the third wiring part 130W. In this way, a third via part 130V may be considered as having a third via seed pattern and a third via conductive pattern on the third via seed pattern and a third wiring part 130W may be considered as having a third wiring seed pattern and a third wiring conductive pattern. For example, the third seed pattern 131 may be considered as including both the third via seed pattern and the third wiring seed pattern. Likewise, the third conductive pattern 133 may be considered as including both the third via conductive pattern and the third wiring conductive pattern. Furthermore, the third wiring part 130W may be disposed on the third via part 130V and may have a horizontal width that is different from a horizontal width of the third via part 130V. The third wiring part 130W and the third via part 130V may be formed in a single process. Therefore, the third conductive pattern 133 of the third via part 130V may be directly connected to the third conductive pattern 133 of the third wiring part 130W. For example, the third conductive pattern 133 of the third via part 130V and the third conductive pattern 133 of the third wiring part 130W may be integrally formed and directly connected with each other with no boundary between the third conductive patterns 133.

The third seed pattern 131 may not be interposed between the third conductive pattern 133 of the third via part 130V and the third conductive pattern 133 of the third wiring part 130W. The third seed pattern 131 may be interposed between the second redistribution pattern 120 and the third conductive pattern 133 and between the third dielectric layer 103 and the third conductive pattern 133, and may cover a sidewall 133c of the third conductive pattern 133 of the third wiring part 130W. For example, the third seed pattern 131 may be provided on a bottom surface of the third conductive pattern 133 of the third via part 130V, a sidewall of the third conductive pattern 133 of the third via part 130V, and a bottom surface of the third conductive pattern 133 of the third wiring part 130W, while also extending onto the sidewall 133c of the third conductive pattern 133 of the third wiring part 130W. The third seed pattern 131 may not cover a top surface of the third conductive pattern 133 of the third wiring part 130W.

Figure 1P:
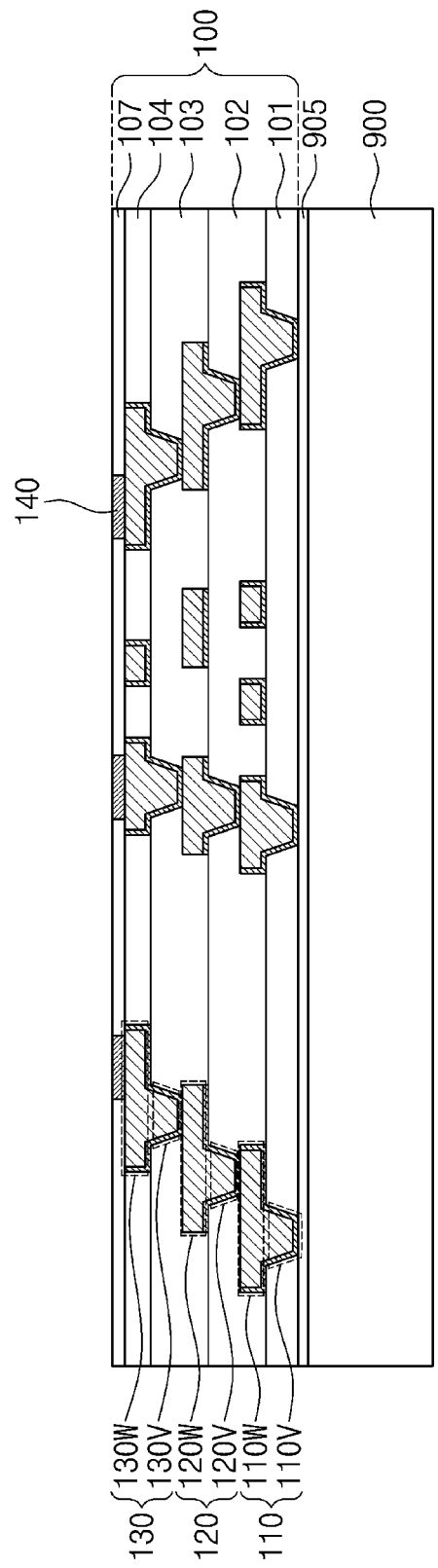

Referring to FIG. 1P, the third resist pattern 173 may be removed to expose the top surface of the third dielectric layer 103 and the sidewall of the third wiring part 130W. The sidewall of the third wiring part 130W may correspond to an outer wall of the third seed pattern 131. A fourth dielectric layer 104 may be formed on the third dielectric layer 103 and be in direct physical contact with the sidewall of the third wiring part 130W. The fourth dielectric layer 104 may expose the third redistribution pattern 130.

A passivation layer 107 may be formed on a top surface of the fourth dielectric layer 104 and the top surface of the third redistribution pattern 130. The passivation layer 107 may expose at least a portion of the top surface of the third redistribution pattern 130.

A conductive pad 140 may be formed on the exposed top surface of the third redistribution pattern 130 and coupled to the third redistribution pattern 130. The conductive pad 140 may not be aligned in a vertical direction with the first via part 110V of the first redistribution pattern 110 electrically connected to the conductive pad 140. For example, in a cross-section view the conductive pad 140 may not vertically overlap with the first via part 110V. The vertical direction may indicate a direction perpendicular to the bottom surface of the first dielectric layer 101. For example, a bottom surface of the first dielectric layer 101 may extend horizontally while a vertical direction may extend perpendicularly to the horizontal direction. The conductive pad 140 may include a metallic material, such as copper, aluminum, and/or tungsten.

A redistribution substrate 100 may be fabricated as disclosed above. The redistribution substrate 100 may include a dielectric pattern, the first, second, and third redistribution patterns 110, 120, and 130, the passivation layer 107, and the conductive pad 140. The dielectric pattern may include the first dielectric layer 101, the second dielectric layer 102, the third dielectric layer 103, and the fourth dielectric layer 104 (that are sequentially stacked on top of one another). A bottom surface of the dielectric pattern may refer to the bottom surface of the first dielectric layer 101. The number of the stacked dielectric layers 101, 102, 103, and 104 may vary and/or be changed, and the same may be true for the redistribution patterns 110, 120, and 130.

Figure 1Q:
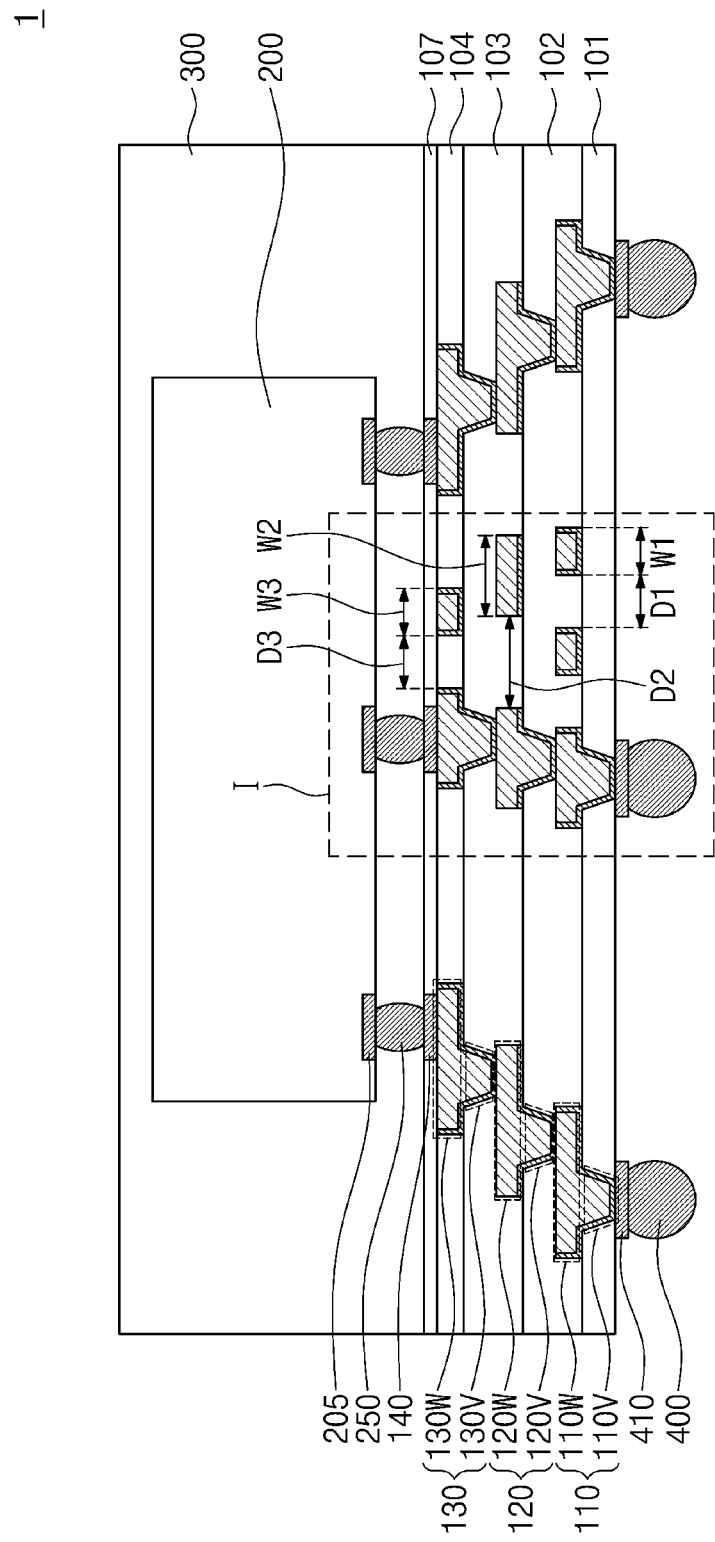
Figure 1R:
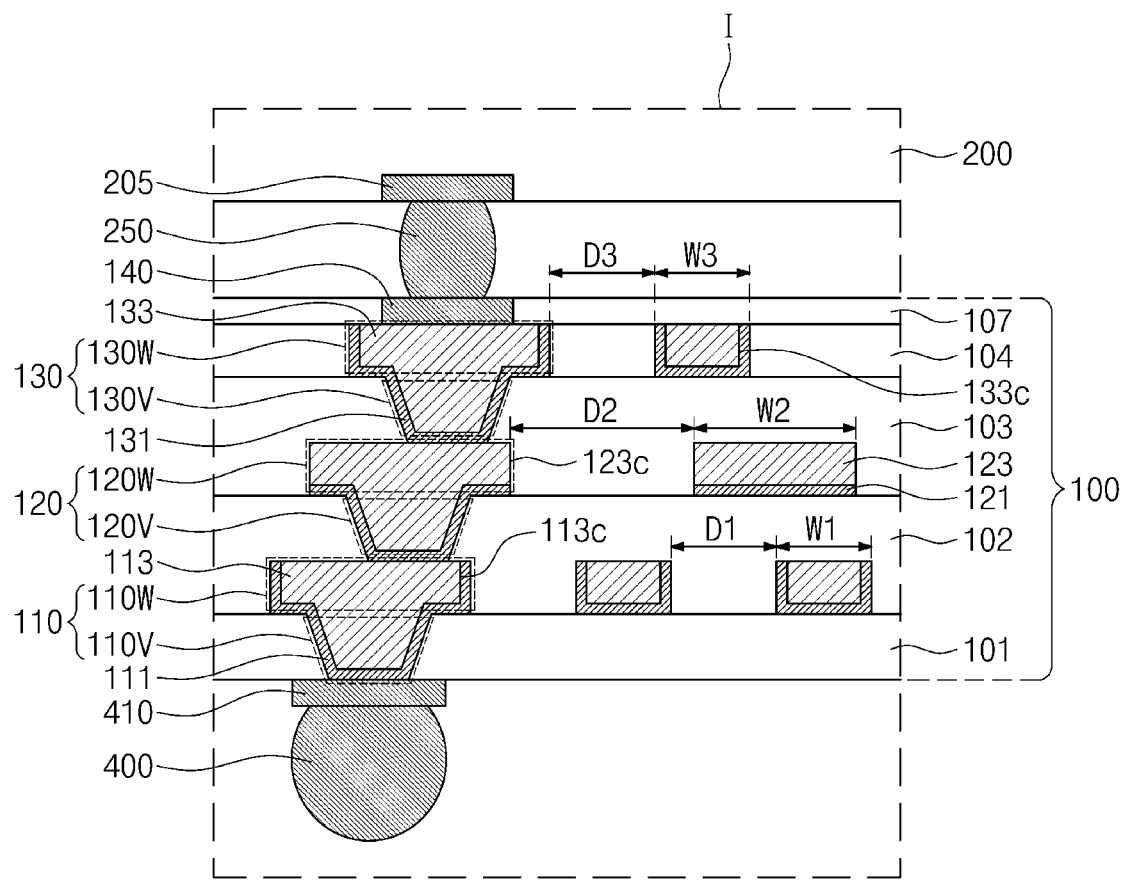
FIG. 1R illustrates an enlarged view showing section I of FIG. 1Q.

Referring to FIGS. 1Q and 1R, a semiconductor chip 200 may be provided on the redistribution substrate 100, for example, on the passivation layer 107. The semiconductor chip 200 may include a semiconductor substrate, an integrated circuit on the semiconductor substrate, a connection line coupled to the integrated circuit, and a chip pad 205 coupled to the connection line. The chip pad 205 may be provided on a first surface of the semiconductor chip 200. The first surface may correspond to a bottom surface of the semiconductor chip 200. The chip pad 205 may include metal, such as aluminum for example. The chip pad 205 may be electrically connected through the connection line to the integrated circuit of the semiconductor chip 200. The phrase "electrically connected/coupled" may include a meaning of being "directly connected/coupled" or "indirectly connected/coupled through other conductive component(s)." Transistors may be included in the integrated circuit of the semiconductor chip 200.

The semiconductor chip 200 may be disposed on the redistribution substrate 100 to allow the chip pad 205 of the semiconductor chip 200 to face the redistribution substrate 100. A connection terminal 250 may be formed between and may electrically connect the conductive pad 140 and the chip pad 205. The semiconductor chip 200 may be electrically connected through the connection terminal 250 to the redistribution substrate 100. In this description, the phrase "electrically connected to the redistribution substrate 100" may mean that the semiconductor chip 200 is "electrically connected to one or more of the first, second, and third redistribution patterns 110, 120, and 130." The connection terminal 250 may include one or more of solder, pillar, and bump type connections. The connection terminal 250 may include a conductive material, such as metal for example.

A molding layer 300 may be formed on the redistribution substrate 100, and may cover the semiconductor chip 200. The molding layer 300 may cover the passivation layer 107. The molding layer 300 may further extend toward a gap between the semiconductor chip 200 and the redistribution substrate 100, and may encapsulate the connection terminal 250. The molding layer 300 may include a dielectric polymer, such as an epoxy molding compound for example. For another example, an under-fill pattern (not shown) may be provided between a gap between the redistribution substrate 100 and the semiconductor chip 200. Afterwards, the carrier substrate 900 and the carrier adhesive layer 905 may be removed to expose a bottom surface of the redistribution substrate 100 or to expose the first dielectric layer 101. In this case, a portion of the first redistribution pattern 110 may further be exposed.

A terminal pad 410 and an external connection terminal 400 may be formed on the bottom surface of the redistribution substrate 100. The external connection terminal 400 may be formed on an exposed bottom surface of the first redistribution pattern 110. The terminal pad 410 may be disposed between the first redistribution pattern 110 and the external connection terminal 400. The terminal pad 410 may include a conductive material, such as metal for example. The external connection terminal 400 may be coupled to the chip pad 205 through the terminal pad 410 and the redistribution patterns 110, 120, and 130. Therefore, the external connection terminal 400 and the chip pad 205 may not be aligned with each other in the vertical direction. For example, the external connection terminal 400 may not vertically overlap with chip pad 205 in the vertical direction. The external connection terminal 400 may be provided in plural, and at least one of the plurality of external connection terminals 400 may not vertically overlap the semiconductor chip 200. For example, there may be a plurality of external connection terminals 400 and at least one of the plurality of external connection terminals may not vertically overlap the semiconductor chip 200. Therefore, the external connection terminal 400 may increase the degree of freedom of arrangement of components. The external connection terminal 400 may include a conductive material, such as metal for example. The external connection terminal 400 may include one or more of solder, pillar, and bump. A semiconductor package 1 may be fabricated through the example embodiments disclosed above. The semiconductor package 1 may be a fan-out semiconductor package for example. According to some embodiments, the semiconductor package 1 may be fabricated by a chip-last process for example. The first, second, and third redistribution patterns 110, 120, and 130 will be further disclosed in detail below.

The first redistribution pattern 110 may include a plurality of first via parts 110V and a plurality of first wiring parts 110W. A relatively small minimum interval D1 may be provided between adjacent first wiring parts 110W of the plurality first wiring parts 110W. For example, minimum interval D1 may correspond to a distance between a closest pair of first wiring parts 110W (nearest two first wiring parts 110W) of a plurality of first wiring parts 110W. Additionally, a relatively small minimum width W1 may be provided to a narrowest first wiring part 110W of the plurality of first wiring parts 110W. The minimum width W1 of the plurality of first wiring parts 110W may refer to the smallest width of the narrowest (smallest) first wiring part 110W of the plurality of first wiring parts 110W. For example, the minimum interval D1 between any adjacent first wiring parts of the first wiring parts 110W may range from 0.1 μm to 5 μm. For example, the minimum interval D1 between a closest pair of first wiring parts 110W of the plurality of first wiring parts 110W may range from 0.1 μm to 5 μm. Furthermore, and for example, the minimum width W1 of the plurality of first wiring parts 110W may range from 0.1 μm to 5 μm. Because the first wiring parts 110W have a relatively small minimum width W1 and minimum interval D1, the first wiring parts 110W may be vulnerable to damage. For example, when the first wiring parts 110W are damaged at sidewalls thereof, the semiconductor package 1 may decrease in reliability.

The first conductive pattern 113 and the second dielectric layer 102 may have a relatively low adhesive force therebetween. When the sidewall 113c of the first conductive pattern 113 is in direct physical contact with the second dielectric layer 102, and when the semiconductor package 1 continuously operates, the first conductive pattern 113 may have damage (e.g., oxidation) to the sidewall 113c thereof. In some embodiments, the sidewall 113c of the first conductive pattern 113 may be peeled off from the second dielectric layer 102.

According to some embodiments, in each of the first wiring parts 110W, the first seed pattern 111 may be provided between the second dielectric layer 102 and the sidewall 113c of the first conductive pattern 113. The first seed pattern 111 may protect the first conductive pattern 113 from external stress. In each of the first wiring parts 110W, the first seed pattern 111 may prevent damage to the sidewall 113c of the first conductive pattern 113. The first seed pattern 111 may have an excellent adhesive force to the second dielectric layer 102. For example, a first adhesive force between the first seed pattern 111 and the second dielectric layer 102 may be greater than a second adhesive force between the first conductive pattern 113 and the second dielectric layer 102. Therefore, the sidewall 113c of the first conductive pattern 113 may be prevented from delaminating from the second dielectric layer 102. According to some embodiments, the redistribution substrate 100 and the semiconductor package 1 may relatively increase in their reliability.

The third redistribution pattern 130 may include a plurality of third via parts 130V and a plurality of third wiring parts 130W. A minimum interval D3 between a pair of closest third wiring parts 130W of the plurality of third wiring parts 130W may range, for example, from 0.1 μm to 5 μm. A minimum width W3 of the narrowest third wiring part 130W of the plurality of third wiring parts 130W may range, for example, from 0.1 μm to 5 μm. The minimum width W3 of the third wiring parts 130W may refer to the smallest width of the various individual widths of the third wiring parts 130W. In some embodiments, because the third wiring parts 130W have a relatively small minimum width W3 and minimum interval D3, when the third wiring parts 130W have damage to sidewalls thereof, the redistribution substrate 100 may decrease in reliability. According to some embodiments, in each third wiring part 130W, the third seed pattern 131 may be provided between the fourth dielectric layer 104 and the sidewall 133c of the third conductive pattern 133. The third seed pattern 131 may prevent damage to the sidewall 133c of the third conductive pattern 133 of each third wiring part 130W. The third seed pattern 131 may prevent delamination between the fourth dielectric layer 104 and the third conductive pattern 133 of each third wiring part 130W. Therefore, the redistribution substrate 100 and the semiconductor package 1 may further increase in their reliability.

No planarization process may be included in the formation of the second redistribution pattern 120 discussed above with reference to FIGS. 1I to 1K. Therefore, it may be possible to simplify the fabrication of the second redistribution pattern 120. In some embodiments, because no planarization process is included in forming the second redistribution pattern 120, the second conductive pattern 123 may have a surface roughness on its top surface greater than a surface roughness on a top surface of the first conductive pattern 113.

In each second wiring part 120W, the second seed pattern 121 may not extend onto the sidewall 123c of the second conductive pattern 123. The sidewall 123c of the second conductive pattern 123 of the second wiring part 120W may be in direct physical contact with the third dielectric layer 103.

The second redistribution pattern 120 may include a plurality of second via parts 120V and a plurality of second wiring parts 120W. A minimum interval D2 between the second wiring parts 120W may be greater than: (1) the minimum interval D1 between the first wiring parts 110W and (2) the minimum interval D3 between the third wiring parts 130W. The minimum interval D2 between the second wiring parts 120W may be greater than 5 μm, for example. For example, the minimum interval D2 between the second wiring parts 120W may be greater than 5 μm and equal to or less than 10 μm. The minimum width W2 of the second wiring parts 120W may be greater than the minimum width W1 of the first wiring parts 110W and than the minimum width W3 of the third wiring parts 130W. The minimum width W2 of the second wiring parts 120W may refer to the smallest width of various widths of the second wiring parts 120W. The minimum width W2 of the second wiring parts 120W may be greater than 5 μm, for example, greater than 5 μm and equal to or less than 10 μm. Because the second wiring parts 120W have the relatively greater minimum width W2 and minimum interval D2, even when at least one of the second wiring parts 120W has damage to the sidewall 123c of the second conductive pattern 123, the damage may have no influence or even extremely slight influence on the reliability of the redistribution substrate 100. For example, damage to the sidewall 123c that may occur during manufacturing processes may have a negligible effect on the overall reliability of the redistribution substrate 100 and/or prevent/suppress the overall reliability of the redistribution substrate 100.

FIGS. 2A to 2F, 2H to 2K, and 2M illustrate cross-sectional views showing a method of fabricating a semiconductor package according to some example embodiments. FIG. 2G illustrates an enlarged view showing section I of FIG. 2F. FIG. 2L illustrates an enlarged view showing section I of FIG. 2K. FIG. 2N illustrates an enlarged view showing section I of FIG. 2M. Duplicate description to that discussed above may be omitted below for ease of explanation and brevity.

Figure 2A:
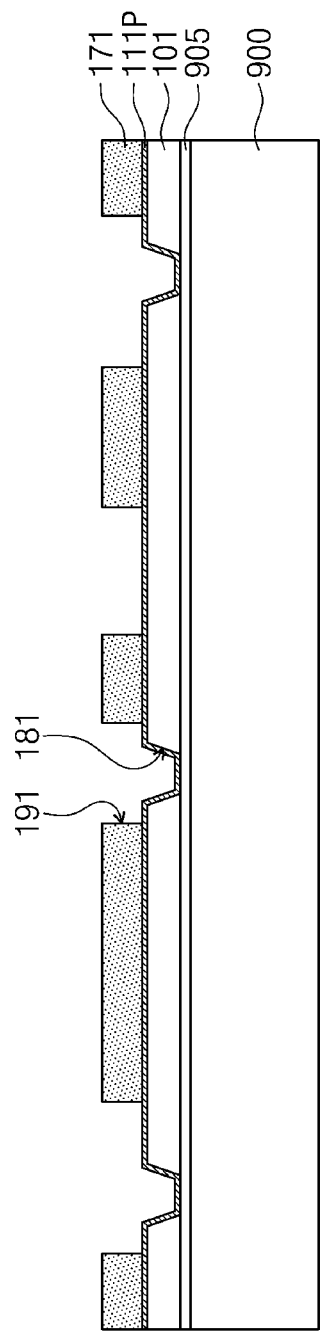
FIGS. 2A to 2F, 2H to 2K, and 2M illustrate cross-sectional views showing a method of fabricating a semiconductor package according to some example embodiments.

Referring to FIG. 2A, a first dielectric layer 101, a first seed layer 111P, and a first resist pattern 171 may be formed on a carrier substrate 900. A carrier adhesive layer 905 may further be interposed between the carrier substrate 900 and the first dielectric layer 101.

According to some embodiments, the first dielectric layer 101 may be formed as discussed above with reference to FIGS. 1A to 1C. A first hole 181 may be formed in the first dielectric layer 101, and the first hole 181 may have a tapered shape.

The first seed layer 111P may be formed in the first hole 181 and on a top surface of the first dielectric layer 101. The first seed layer 111P may conformally cover a bottom surface and a sidewall of the first hole 181 and the top surface of the first dielectric layer 101. The first seed layer 111P may include a conductive material, such as titanium.

The first resist pattern 171 may be formed on the first seed layer 111P. A first trench 191 may be formed in the first resist pattern 171, and may expose a top surface of the first seed layer 111P. When viewed in plan view, at least a portion of the first trench 191 may vertically overlap with the first hole 181. The first trench 191 may have an angle of 85° to 95° between a bottom surface and a sidewall thereof.

Figure 2B:
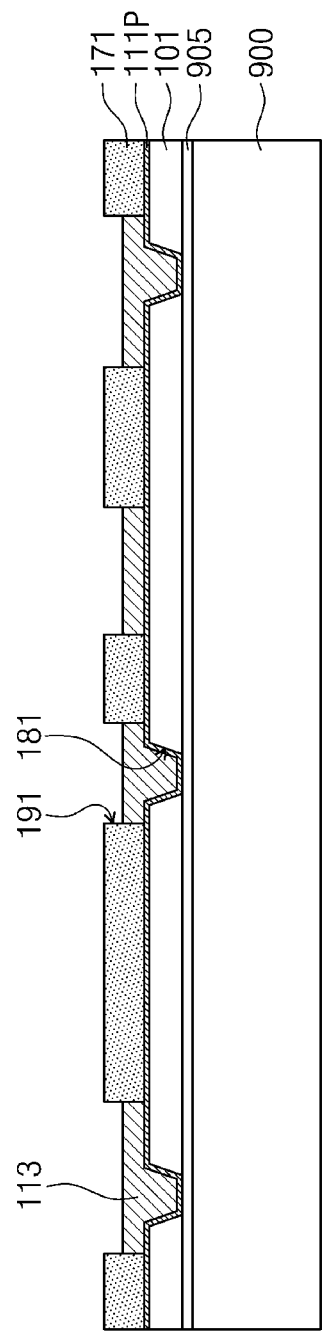

Referring to FIG. 2B, a first conductive pattern 113 may be formed in the first hole 181 and the first trench 191, and may cover the first seed layer 111P. The first conductive pattern 113 may be formed by performing an electroplating process in which the first seed layer 111P is used as an electrode. The first conductive pattern 113 may not extend onto a top surface of the first resist pattern 171. Therefore, no planarization process may be separately required to form the first conductive pattern 113. The first conductive pattern 113 may include metal, such as copper for example.

Figure 2C:
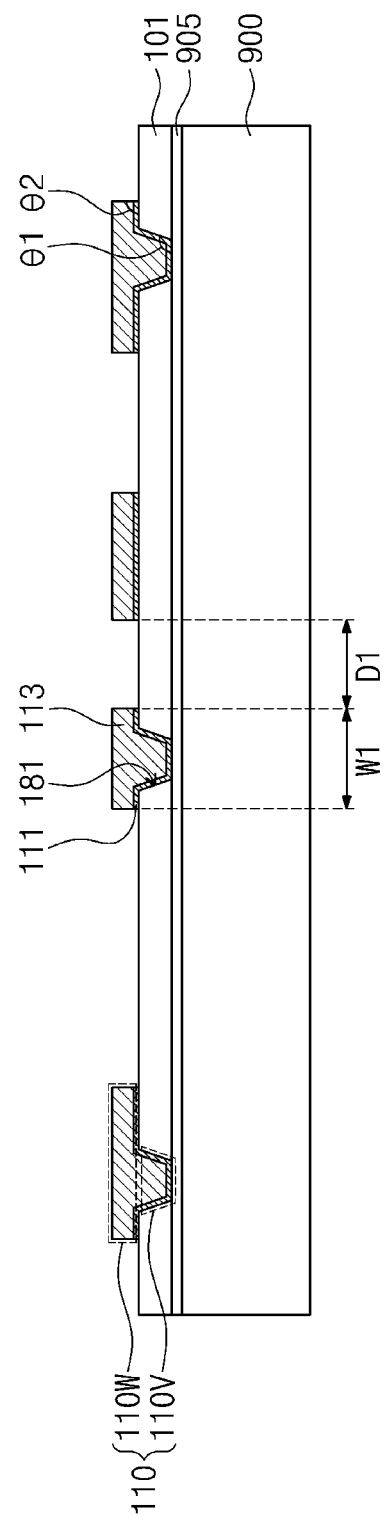

Referring to FIG. 2C, the first resist pattern 171 may be removed to expose a first portion of the first seed layer 111P. The exposed first portion of the first seed layer 111P may be removed by an etching process to expose the top surface of the first dielectric layer 101. In the etching process, the first conductive pattern 113 may have an etch selectivity with respect to the first seed layer 111P. A second portion of the first seed layer 111P may be disposed on a bottom surface of the first conductive pattern 113, and may thus not be removed by the etching process. After the etching process, the remaining second portion of the first seed layer 111P may be formed into a first seed pattern 111. Accordingly, a first redistribution pattern 110 may be formed. The first redistribution pattern 110 may include the first seed pattern 111 and the first conductive pattern 113.

The first redistribution pattern 110 may have a first via part 110V provided in the first hole 181 of the first dielectric layer 101. The first via part 110V may have a shape that corresponds to that of the first hole 181. A first angle θ1 of 100° to 150° may be formed between a bottom surface and a sidewall of the first via part 110V.

The first redistribution pattern 110 may have a first wiring part 110W that is disposed on and connected to the first via part 110V. At least a portion of the first wiring part 110W may extend onto the top surface of the first dielectric layer 101. The first wiring part 110W may have a shape that corresponds to that of the first trench 191 discussed in FIG. 2A. For example, a second angle θ2 between a bottom surface and a sidewall of the first wiring part 110W may be less than the first angle θ1. For example, the second angle θ2 may range from 85° to 95°.

The first redistribution pattern 110 may include a plurality of first wiring parts 110W and a plurality of first via parts 110V. Each of the first wiring parts 110W may have a minimum width W1 of greater than 5 μm and equal to or less than 10 μm. A minimum interval D1 between a pair of closest first wiring parts 110W of the plurality of first wiring parts 110W may be greater than 5 μm and equal to or less than 10 μm. Therefore, even when the first wiring parts 110W incur damage to the sidewalls thereof, the damage may have no influence or extremely slight influence (negligible influence) on the reliability of the first redistribution pattern 110. According to some embodiments, no planarization process may be separately performed in forming the first redistribution pattern 110. Therefore, it may be possible to simplify the fabrication of the first redistribution pattern 110. In each first wiring part 110W, the first seed pattern 111 may not cover a sidewall 113c of the first conductive pattern 113. Hereinafter, a single first wiring part 110W and a single first via part 110V will be explained for brevity of description.

Figure 2D:
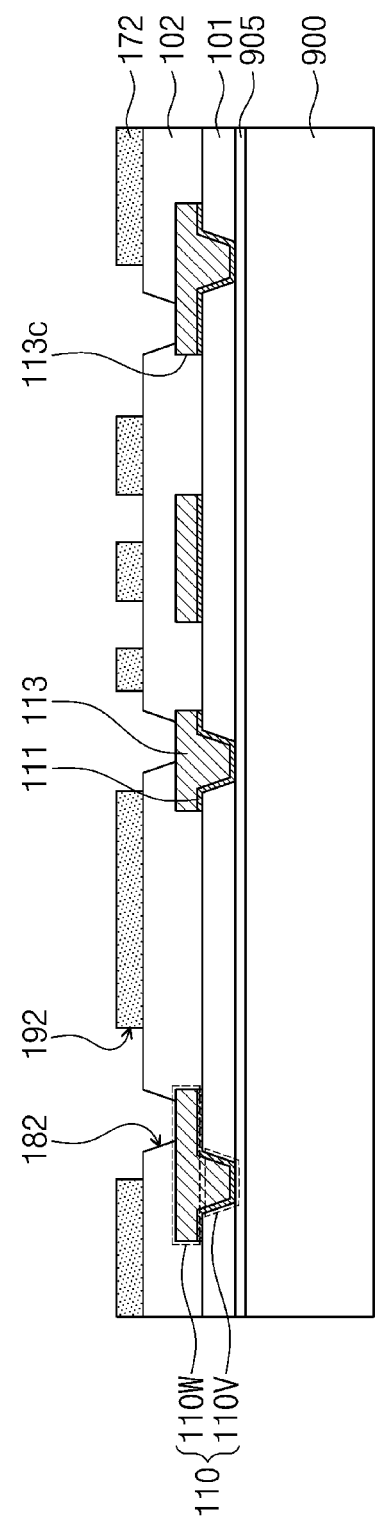

Referring to FIG. 2D, a second dielectric layer 102 may be formed on the first dielectric layer 101, and the second dielectric layer 102 may cover the top surface of the first dielectric layer 101, the sidewall of the first wiring part 110W, and a top surface of the first wiring part 110W. The second dielectric layer 102 may physically contact the sidewall 113c of the first conductive pattern 113 of the first wiring part 110W. For example, the second dielectric layer 102 may directly contact the sidewall 113c of the first conductive pattern 113 of the first wiring part 110W without any intervening elements being present therebetween. The second dielectric layer 102 may include, for example, a photosensitive polymer. A second hole 182 may be formed in the second dielectric layer 102, and may expose a top surface of the first redistribution pattern 110. As a result of a curing process on the second dielectric layer 102, the second hole 182 may have an angle of 110° to 150° between a bottom surface and a sidewall thereof. A second resist pattern 172 may be formed on the second dielectric layer 102. The second resist pattern 172 may have a second trench 192. The second trench 192 may be spatially connected to the second hole 182 and may expose at least a portion of a top surface of the second dielectric layer 102. The second resist pattern 172 may include a photoresist material, and thus no curing process may be separately required in forming the second resist pattern 172. The second resist pattern 172 may have an angle of 85° to 95° between a bottom surface and a sidewall thereof.

Figure 2E:
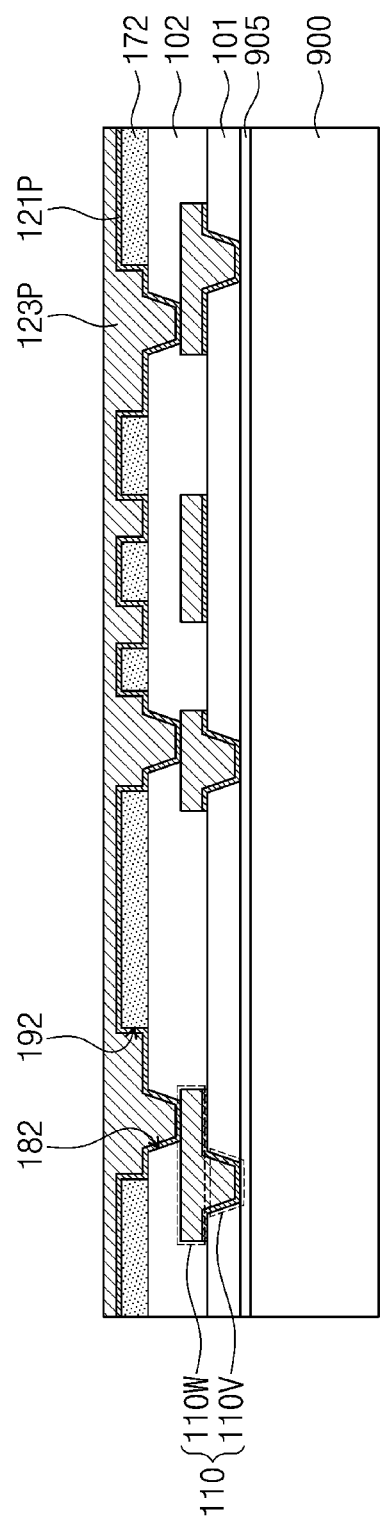

Referring to FIG. 2E, a second seed layer 121P and a second conductive layer 123P may be formed in the second hole 182 and the second trench 192. The second seed layer 121P may conformally cover the exposed top surface of the first redistribution pattern 110, an inner wall and top surface of the second dielectric layer 102, and a top surface of the second resist pattern 172. The second conductive layer 123P may cover the second seed layer 121P, while filling the second hole 182 and the second trench 192. The second conductive layer 123P may be formed by performing an electroplating process in which the second seed layer 121P is used as an electrode, for example. The second conductive layer 123P may extend onto the top surface of the second resist pattern 172. The second seed layer 121P and the second conductive layer 123P may be formed by the same or substantially the same or similar methods used for forming the first seed layer 111P and the first conductive layer 113P, respectively, discussed with reference to FIG. 1D. As used herein, the term "substantially the same" shall be understood as having a meaning of very nearly the same with insubstantial and/or minor differences, e.g., not exactly identical. Additionally, for example, differences may be due to manufacturing tolerances and be regarded as insignificant to a person of ordinary skill in the art.

Figure 2F:
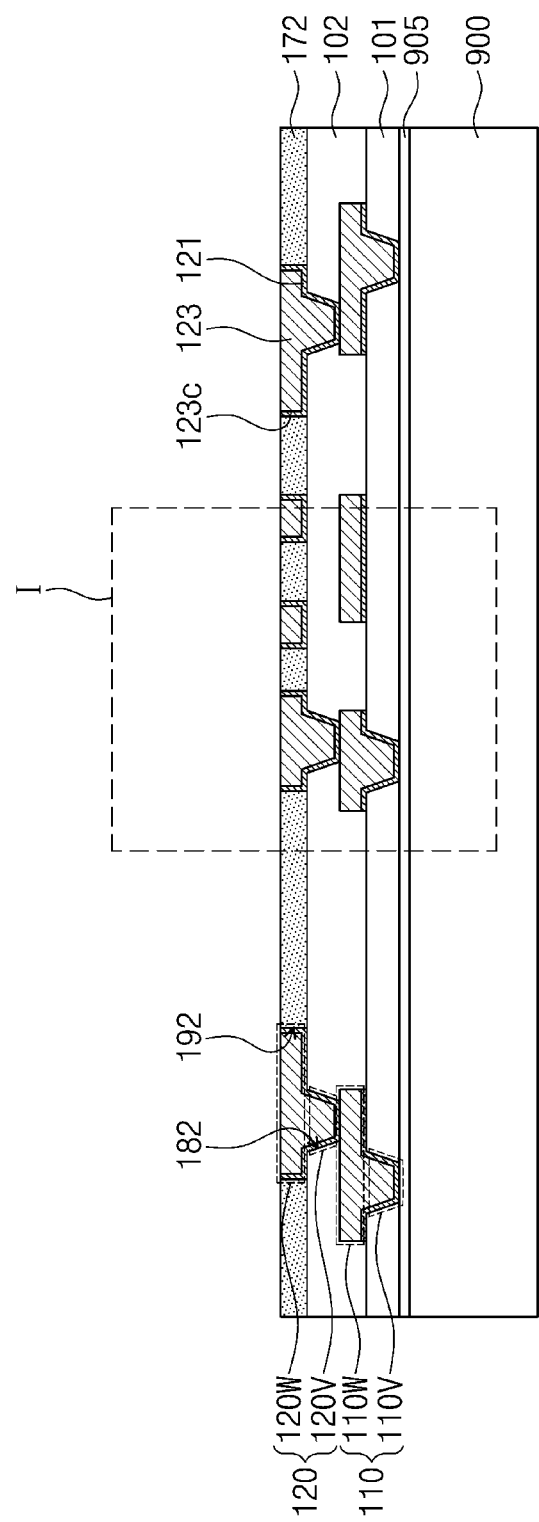
Figure 2G:
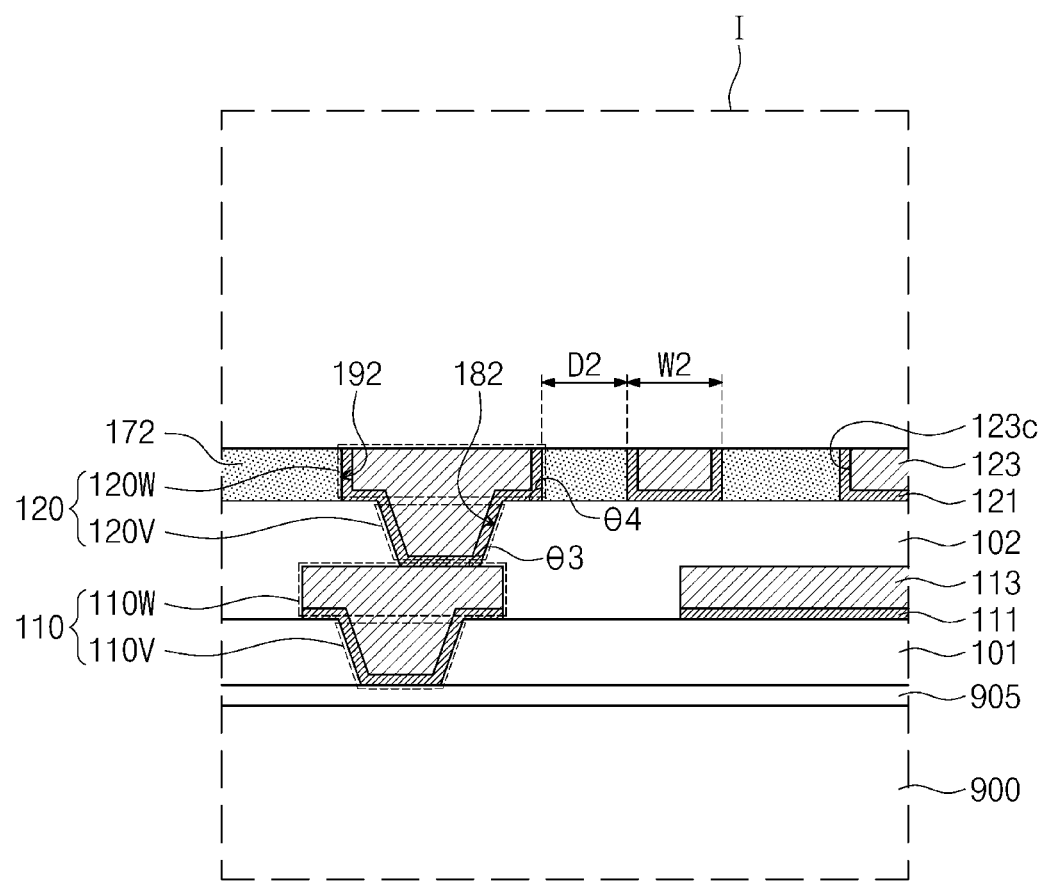
FIG. 2G illustrates an enlarged view showing section I of FIG. 2F.

Referring to FIGS. 2F and 2G, the second seed layer 121P and the second conductive layer 123P may experience a planarization process to form a second seed pattern 121 and a second conductive pattern 123. The planarization process may remove the second seed layer 121P and the second conductive layer 123P that are formed on the second resist pattern 172, thereby forming the second seed pattern 121 and the second conductive pattern 123. Each of the second seed pattern 121 and the second conductive pattern 123 may be confined in the second hole 182 and the second trench 192. Accordingly, a second redistribution pattern 120 may be formed. The second redistribution pattern 120 may include the second seed pattern 121 and the second conductive pattern 123. On the second seed pattern 121, the second conductive pattern 123 may fill the second hole 182 and the second trench 192. The second conductive pattern 123 and the second seed pattern 121 may include the same or similar materials as those of the second conductive pattern 123 and the second seed pattern 121, respectively, discussed above.

The second redistribution pattern 120 may include a plurality of second via parts 120V and a plurality of second wiring parts 120W. The second via parts 120V and the second wiring parts 120W may be similar to those discussed above with reference to FIGS. 1J and 1K. For example, as shown in FIG. 2G, a third angle θ3 between a bottom surface and a sidewall of each second via part 120V may be greater than a fourth angle θ4 between a bottom surface and a sidewall of each second wiring part 120W. The third angle θ3 may range from 110° to 150°, and the fourth angle θ4 may range from 85° to 95°.

In some embodiments, as shown in FIG. 2G, a relatively small minimum interval D2 may be provided between the second wiring parts 120W, and a relatively small minimum width W2 may be provided in the second wiring parts 120W. For example, the minimum interval D2 between a closest pair of second wiring parts 120W of the plurality of second wiring parts 120W may range from 0.1 μm to 5 μm. The minimum width W2 of the narrowest second wiring part 120W of the plurality of second wiring parts 120W may range, for example, from 0.1 μm to 5 μm. Each of the second via parts 120V may include the second seed pattern 121 and the second conductive pattern 123, and each of the second wiring parts 120W may include the second seed pattern 121 and the second conductive pattern 123. In each of the second wiring parts 120W, the second seed pattern 121 may cover a sidewall 123c of the second conductive pattern 123, and thus the second conductive pattern 123 may be prevented from damage to the sidewall 123c.

Figure 2H:
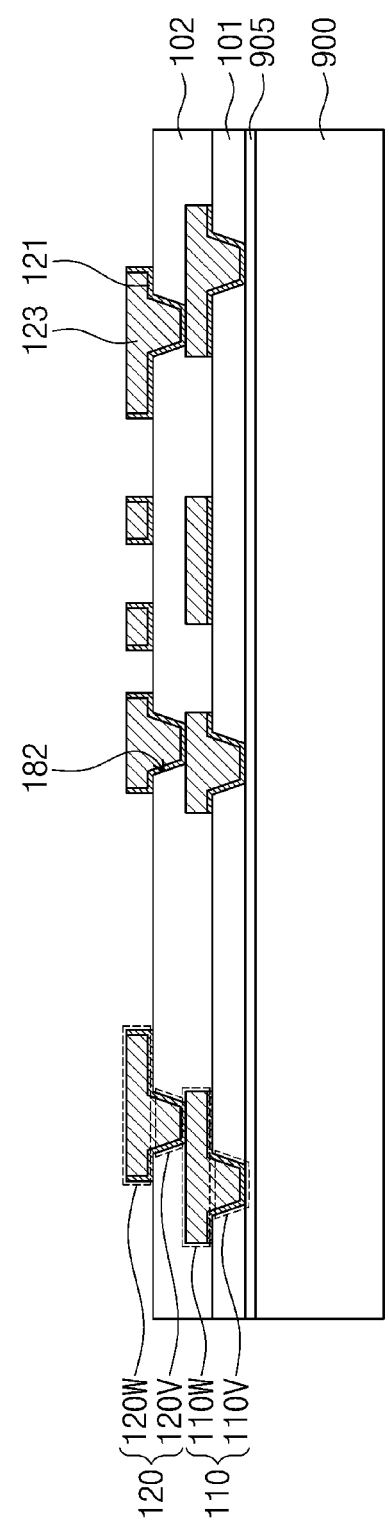

Referring to FIG. 2H, the second resist pattern 172 may be removed to expose the sidewalls of the second wiring parts 120W and the top surface of the second dielectric layer 102. The sidewall of the second wiring part 120W may correspond to an outer wall of the second seed pattern 121.

Figure 2I:
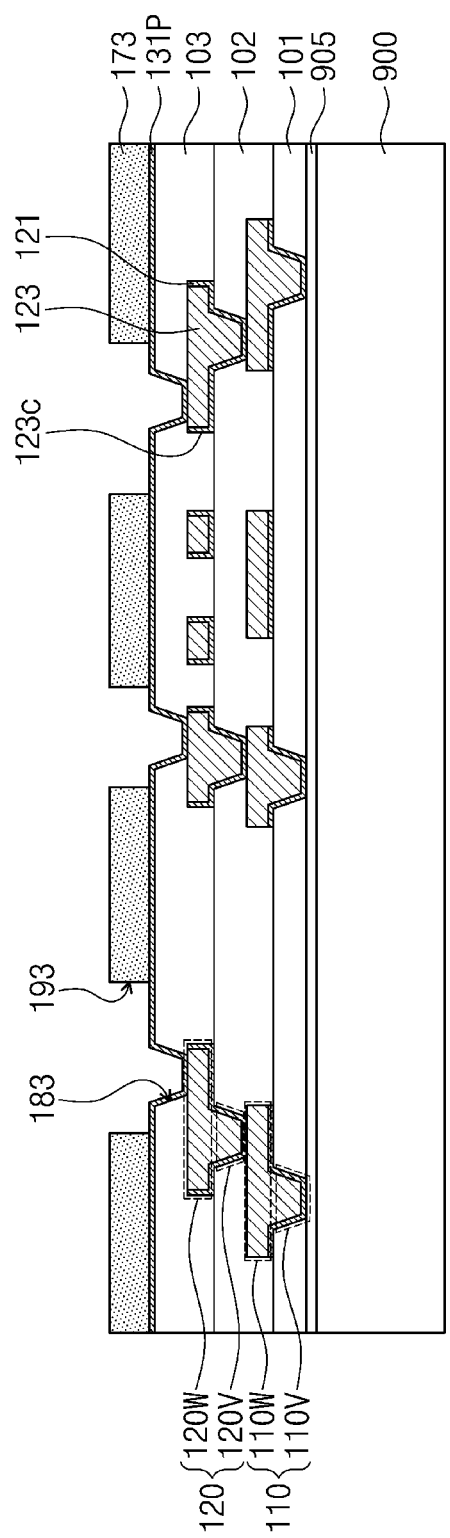

Referring to FIG. 2I, a third dielectric layer 103 may be formed on the second dielectric layer 102, and may cover the top surface of the second dielectric layer 102 and a top surface of the second redistribution pattern 120. The second seed pattern 121 may be interposed between the third dielectric layer 103 and the sidewall 123c of the second conductive pattern 123. A third hole 183 may be formed in the third dielectric layer 103, and may expose the top surface of the second redistribution pattern 120. The third dielectric layer 103 and the third hole 183 may be formed by the same or substantially the same method or similar methods discussed above with reference to FIG. 1M. The third hole 183 may have a tapered shape.

A third seed layer 131P may be conformally formed on a bottom surface and a sidewall of the third hole 183 and on a top surface of the third dielectric layer 103.

A third resist pattern 173 may be formed on the third seed layer 131P. A third trench 193 may be formed in the third resist pattern 173. The third trench 193 may overlap the third hole 183 and may expose the third seed layer 131P. It may not be required that a curing process be performed on the third resist pattern 173. Therefore, the third resist pattern 173 may have an angle of about 85° to about 95° between a sidewall and a bottom surface thereof.

Figure 2J:
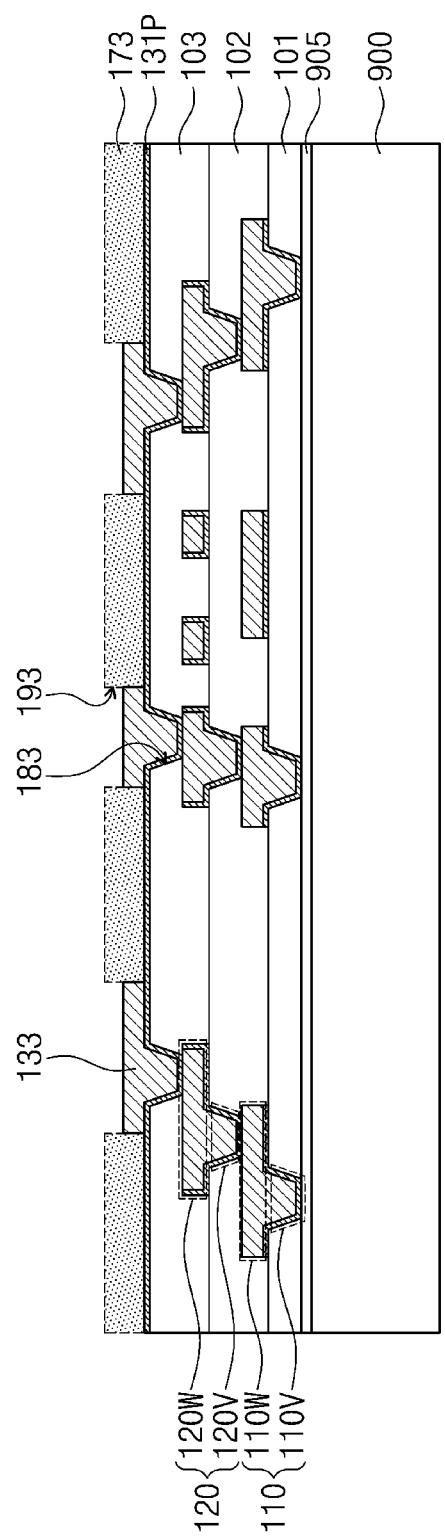

Referring to FIG. 2J, a third conductive pattern 133 may be formed in the third hole 183 and the third trench 193, and may cover the third seed layer 131P. The third conductive pattern 133 may be formed by performing an electroplating process in which the third seed layer 131P is used as an electrode. The third conductive pattern 133 may fill the third hole 183, and may not extend onto a top surface of the third resist pattern 173. The third resist pattern 173 may be removed as expressed by a dotted line, and thus a first portion of the third seed layer 131P may be exposed.

Figure 2K:
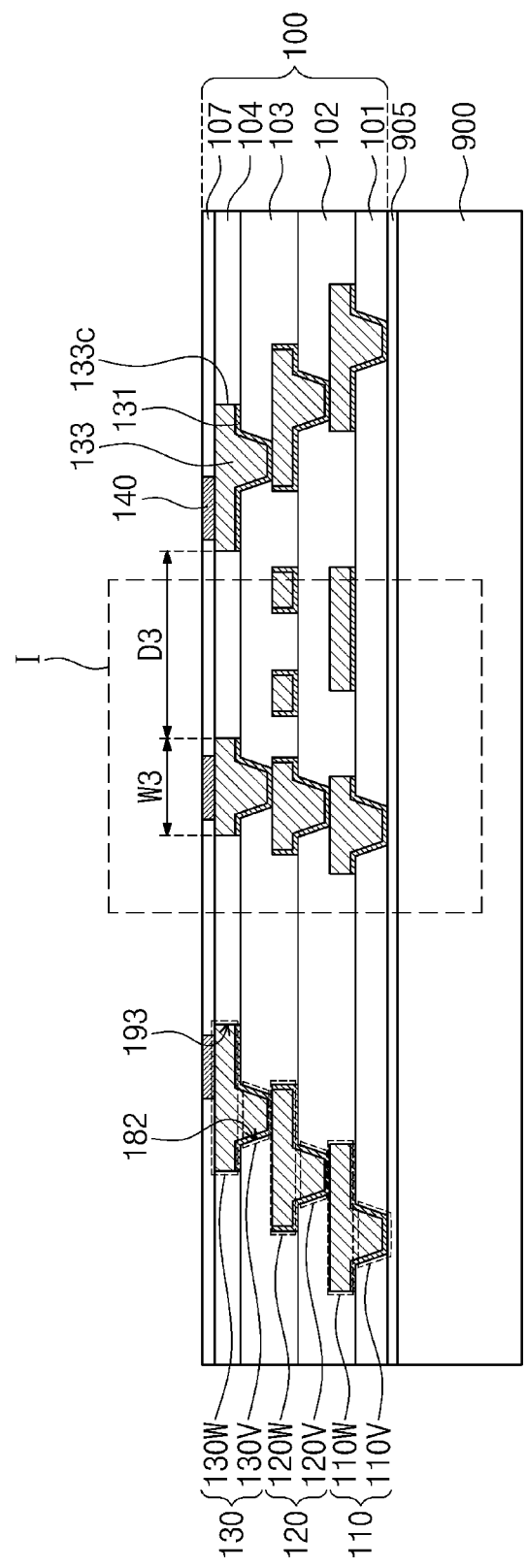
Figure 2L:
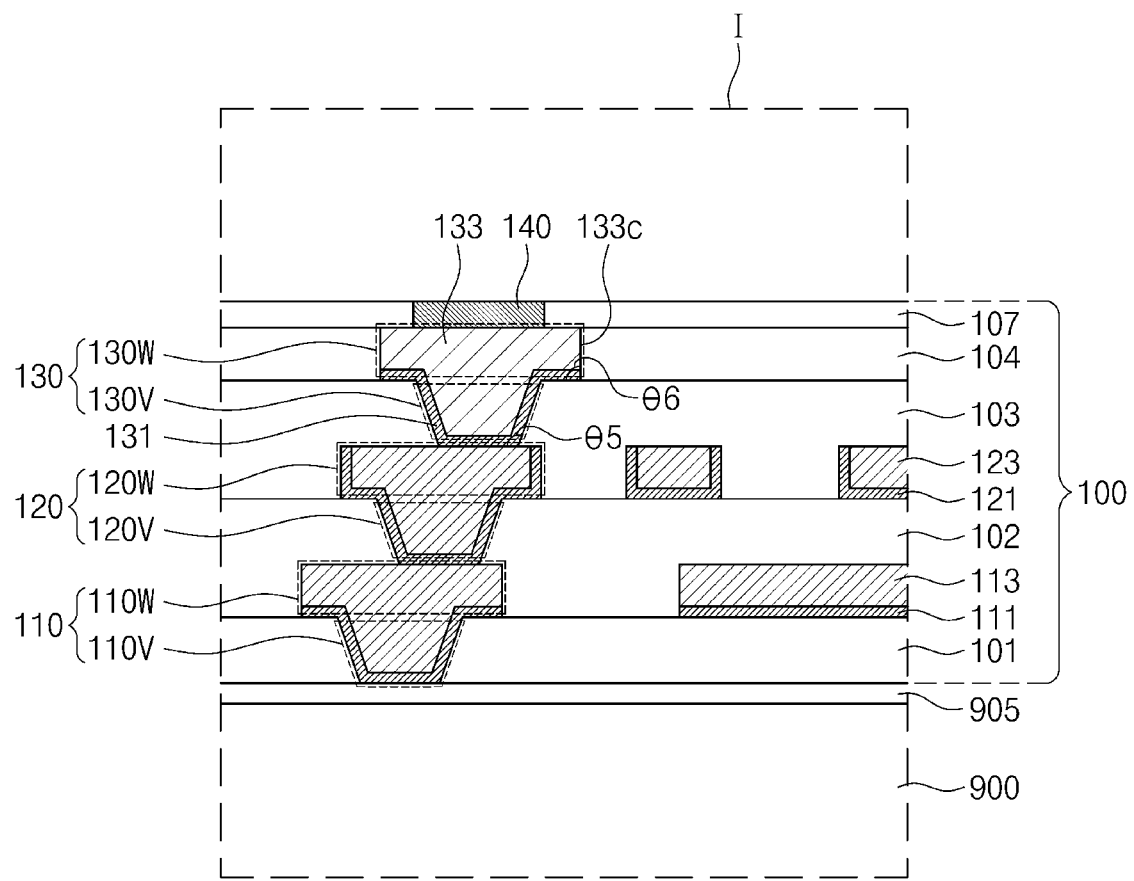
FIG. 2L illustrates an enlarged view showing section I of FIG. 2K.

Referring to FIGS. 2K and 2L, the exposed first portion of the third seed layer 131P may be removed by an etching process to expose a top surface of the third dielectric layer 103. In the etching process, the third conductive pattern 133 may have an etch selectivity with respect to the third seed layer 131P. The third conductive pattern 133 may cause the third seed layer 131P to have a second portion that is not exposed to the etching process. After the etching process, the remaining second portion of the third seed layer 131P may be formed into a third seed pattern 131. Accordingly, a third redistribution pattern 130 may be formed. The third redistribution pattern 130 may include the third seed pattern 131 and the third conductive pattern 133. As shown in FIG. 2L, the third via part 130V may have a fifth angle θ5 of about 100° to about 150° between a bottom surface and a sidewall thereof. The third wiring part 130W may have a sixth angle θ6 between a bottom surface and a sidewall thereof, and the sixth angle θ6 may be less than the fifth angle θ5. For example, the sixth angle θ6 may range from about 85° to about 95°.

According to some embodiments, no planarization process may be separately performed in forming the third redistribution pattern 130. Therefore, it may be possible to simplify the fabrication of the third redistribution pattern 130. In each of the third wiring parts 130W, the third seed pattern 131 may not cover a sidewall 133c of the third conductive pattern 133 of the third wiring part 130W.

The third redistribution pattern 130 may include a plurality of third wiring parts 130W and a plurality of third via parts 130V. As shown in FIG. 2K, a relatively large minimum width W3 may be provided to the third wiring parts 130W, and a relatively large minimum interval D3 may be provided between the third wiring parts 130W. For example, the minimum width W3 of the third wiring parts 130W may be greater than 5 μm and equal to or less than 10 μm. For example, the minimum width W3 of a narrowest (smallest) third wiring part 130W of the third wiring parts 130W may be greater than 5 μm and equal to or less than 10 μm. The minimum interval D3 between the third wiring parts 130W may be greater than 5 μm and equal to or less than 10 μm. For example, the minimum interval D3 between a closest pair of third wiring parts 130W of a plurality of third wiring parts 130W may be greater than 5 μm and equal to or less than 10 μm. In each of the third wiring parts 130W, the third seed pattern 131 does not cover the sidewall 133c of the third conductive pattern 133. Therefore, if a manufacturing process were to inadvertently damage a sidewall 133c, no influence or extremely slight influence may be exerted on the characteristics (reliability) of the third redistribution pattern 130.

A fourth dielectric layer 104 may be formed on the third dielectric layer 103. The fourth dielectric layer 104 may be in direct physical contact with the sidewall 133c of the third conductive pattern 133 of each third wiring part 130W.

A passivation layer 107 may be formed on a top surface of the fourth dielectric layer 104 and a top surface of the third redistribution pattern 130. The passivation layer 107 may expose at least a portion of the top surface of the third redistribution pattern 130. A conductive pad 140 may be formed on the exposed top surface of the third redistribution pattern 130 and coupled (connected) to the third redistribution pattern 130. The passivation layer 107 and the conductive pad 140 may be the same or substantially the same as those discussed above with reference to FIG. 1P.

A redistribution substrate 100 may be fabricated as mentioned above. The redistribution substrate 100 may include a dielectric pattern, the first, second, and third redistribution patterns 110, 120, and 130, the passivation layer 107, and the conductive pad 140. The dielectric pattern may include the first, second, third, and fourth dielectric layers 101, 102, 103, and 104. The number of the stacked dielectric layers 101, 102, 103, and 104 and the number of the redistribution patterns 110, 120, and 130 are not limited to those shown, but may vary and/or be changed.

Differently from that shown by FIG. 2L, the first seed pattern 111 may further extend between the second dielectric layer 102 and the sidewall 113c of the first conductive pattern 113 of the first wiring part 110W. In some embodiments, the third seed pattern 131 may further extend between the fourth dielectric layer 104 and the sidewall 133c of the third conductive pattern 133 of the third wiring part 130W.

Figure 2M:
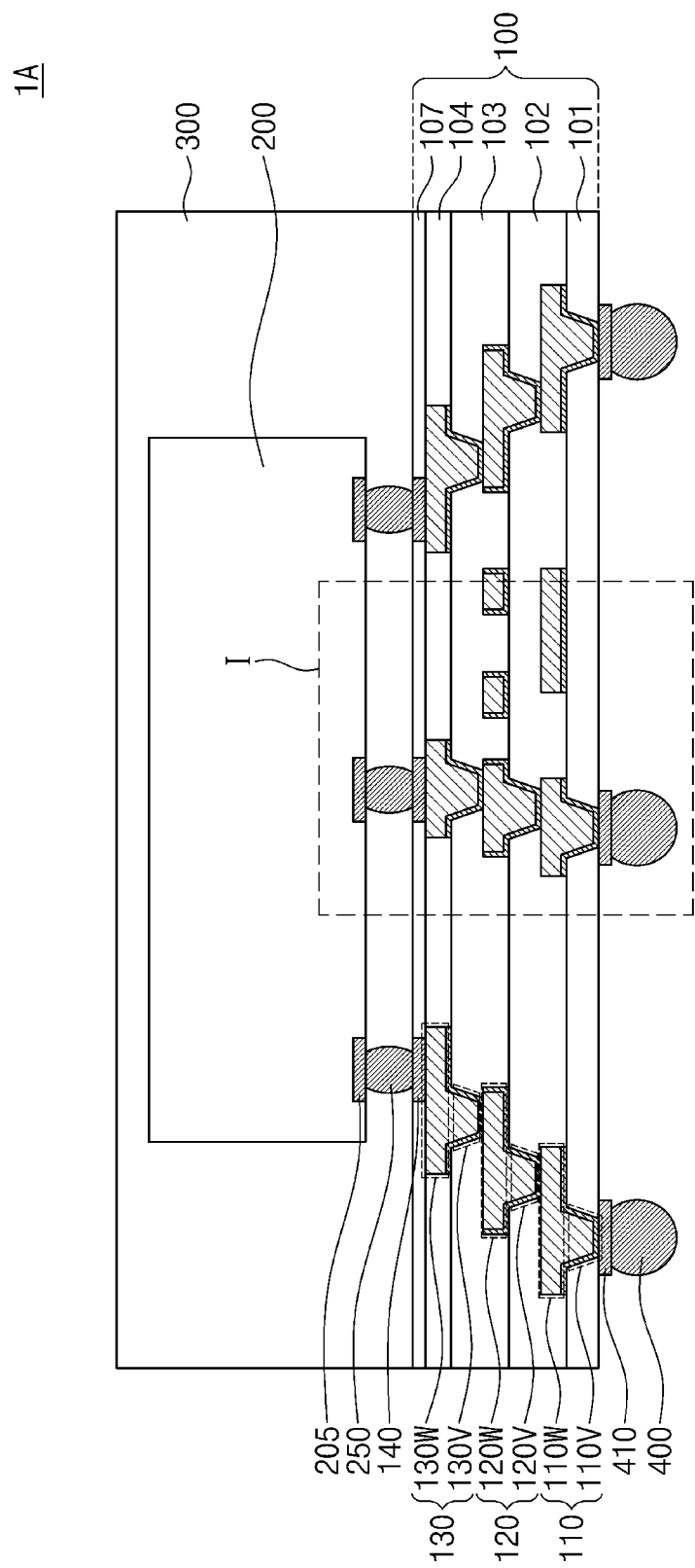
Figure 2N:
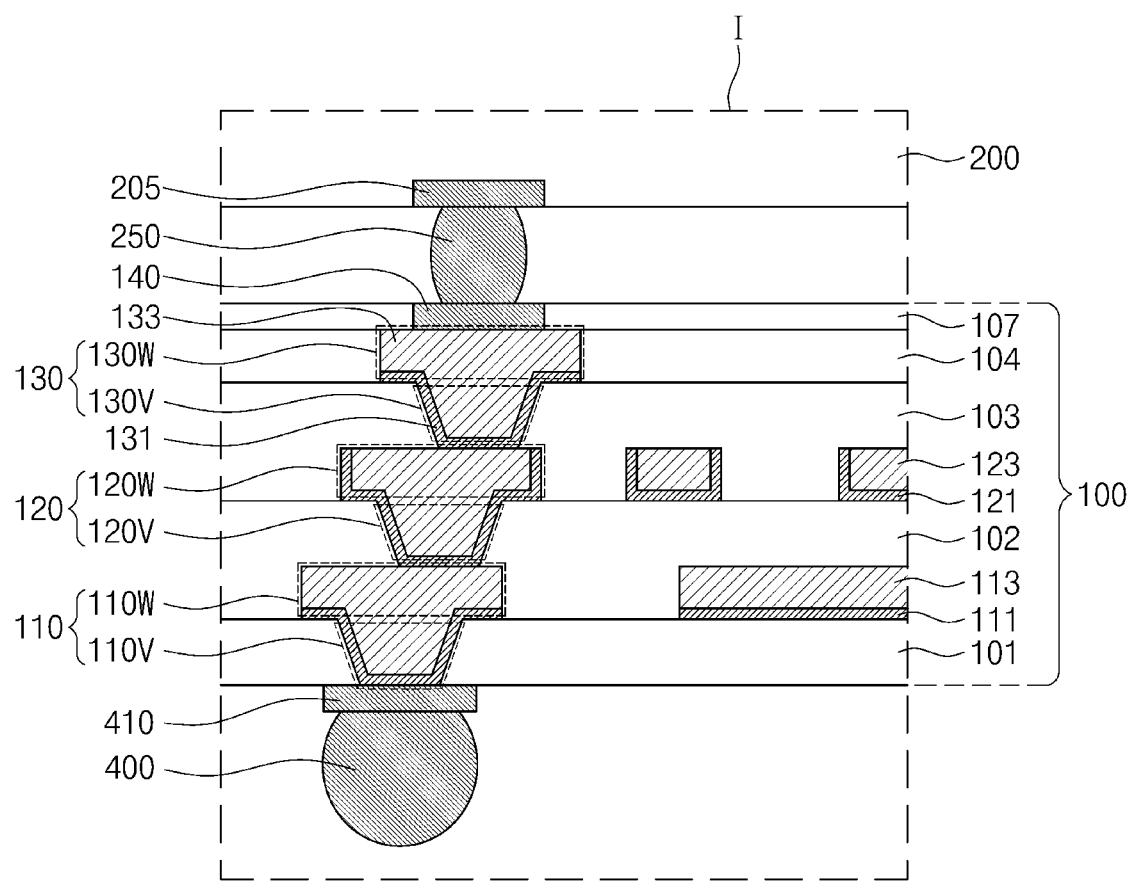
FIG. 2N illustrates an enlarged view showing section I of FIG. 2M.

Referring to FIGS. 2M and 2N, a semiconductor chip 200 may be disposed on the redistribution substrate 100 to allow a chip pad 205 of the semiconductor chip 200 to face the redistribution substrate 100. A connection terminal 250 may be formed between the conductive pad 140 and the chip pad 205.

A molding layer 300 may be formed on the redistribution substrate 100, and may cover the semiconductor chip 200. The molding layer 300 may cover the passivation layer 107. The molding layer 300 may further extend into a gap between the semiconductor chip 200 and the passivation layer 107, and may encapsulate the connection terminal 250.

Afterwards, the carrier substrate 900 and the carrier adhesive layer 905 may be removed to expose a bottom surface of the redistribution substrate 100, for example, to expose the first dielectric layer 101 and the first redistribution pattern 110. A terminal pad 410 and an external connection terminal 400 may be formed on the bottom surface of the redistribution substrate 100. The arrangement of the semiconductor chip 200, the formation of the molding layer 300, and the formation of the external connection terminal 400 may be the same or substantially the same as those discussed with reference to FIGS. 1Q and 1R. A semiconductor package 1A may be fabricated through the processes discussed above.

Figure 3A:
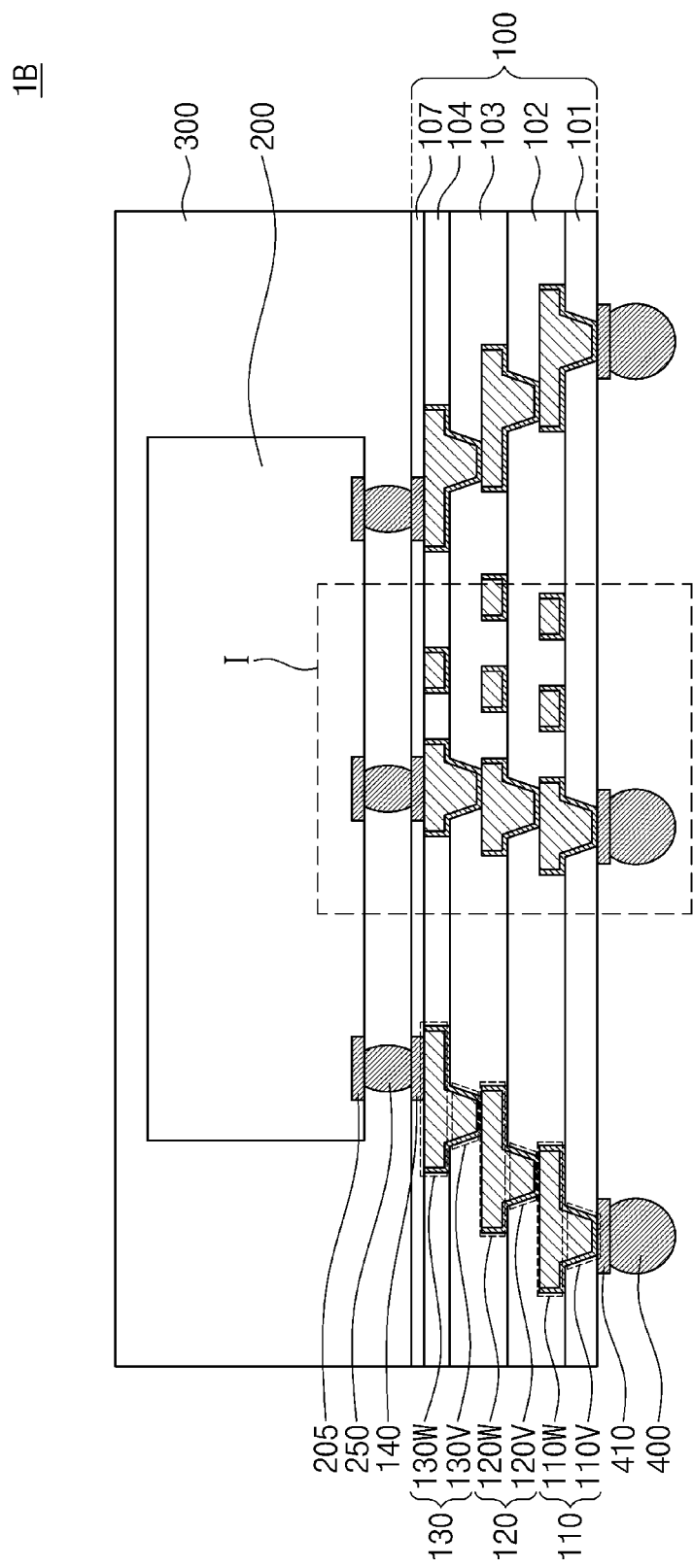
FIG. 3A illustrates a cross-sectional view showing a semiconductor package according to some example embodiments.
Figure 3B:
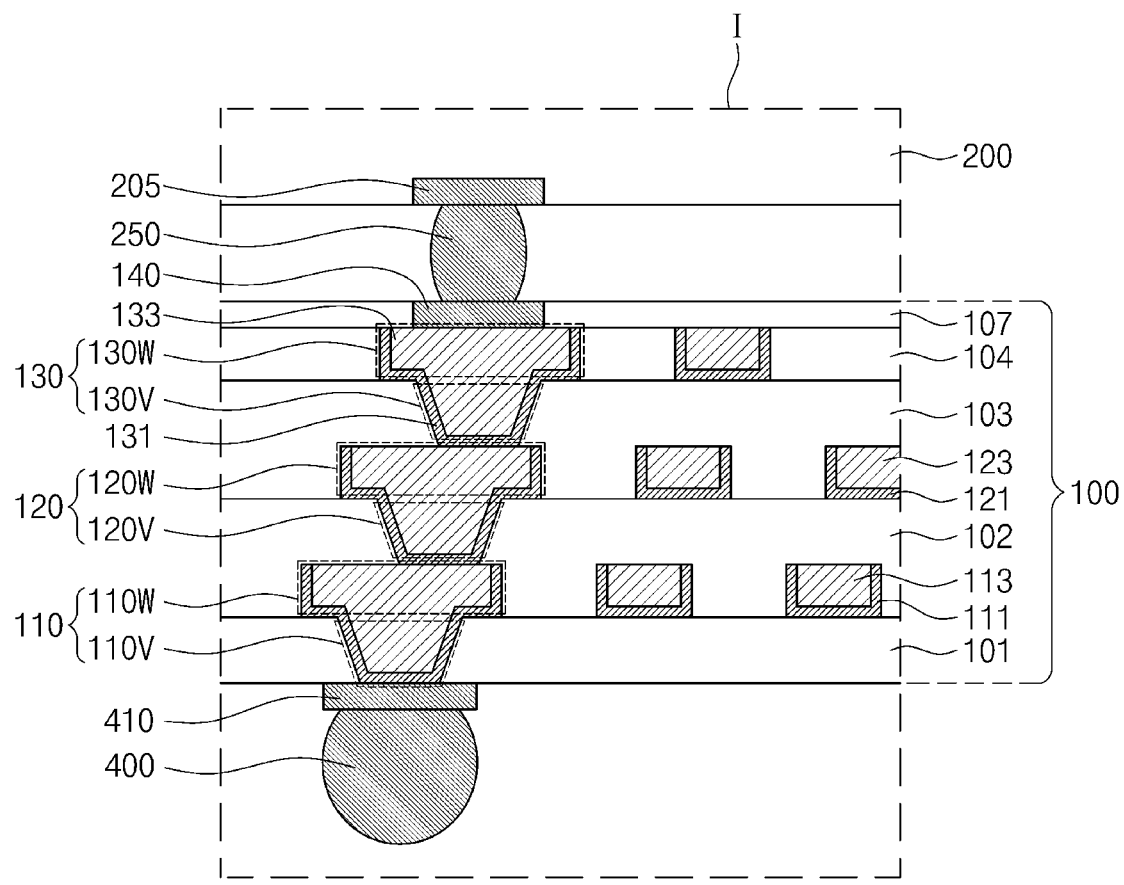
FIG. 3B illustrates an enlarged view showing section I of FIG. 3A.

FIG. 3A illustrates a cross-sectional view showing a semiconductor package according to some example embodiments. FIG. 3B illustrates an enlarged view showing section I of FIG. 3A. A duplicate description of like parts discussed above will be omitted below.

Referring to FIGS. 3A and 3B, a semiconductor package 1B may include the redistribution substrate 100, the semiconductor chip 200, the molding layer 300, and the external connection terminal 400. The redistribution substrate 100 may include the dielectric pattern, the first, second, and third redistribution patterns 110, 120, and 130, the passivation layer 107, and the conductive pad 140. The dielectric pattern may include the first, second, third, and fourth dielectric layers 101, 102, 103, and 104 that are stacked. The first and third redistribution patterns 110 and 130 may be the same or substantially the same as or similar to those discussed above with reference to FIGS. 1Q and 1R. For example, in each of the first wiring parts 110W, the first seed pattern 111 may be interposed between the second dielectric layer 102 and the sidewall of the first conductive pattern 113, and thus the second dielectric layer 102 may not be in physical contact with the sidewall of the first conductive pattern 113. In each of the third wiring parts 130W, the third seed pattern 131 may be interposed between the fourth dielectric layer 104 and the sidewall of the third conductive pattern 133. The second redistribution pattern 120 may be the same or substantially the same as or similar to that discussed above with reference to FIGS. 2M and 2N. For example, in each of the second wiring parts 120W, the second seed pattern 121 may be interposed between the third dielectric layer 103 and the sidewall of the second conductive pattern 123, and thus the third dielectric layer 103 may not be in direct physical contact with the sidewall of the second conductive pattern 123. The semiconductor chip 200, the molding layer 300, and the external connection terminal 400 may be the same or substantially the same as or similar to those discussed above with reference to FIGS. 1Q and 1R.

Figure 4A:
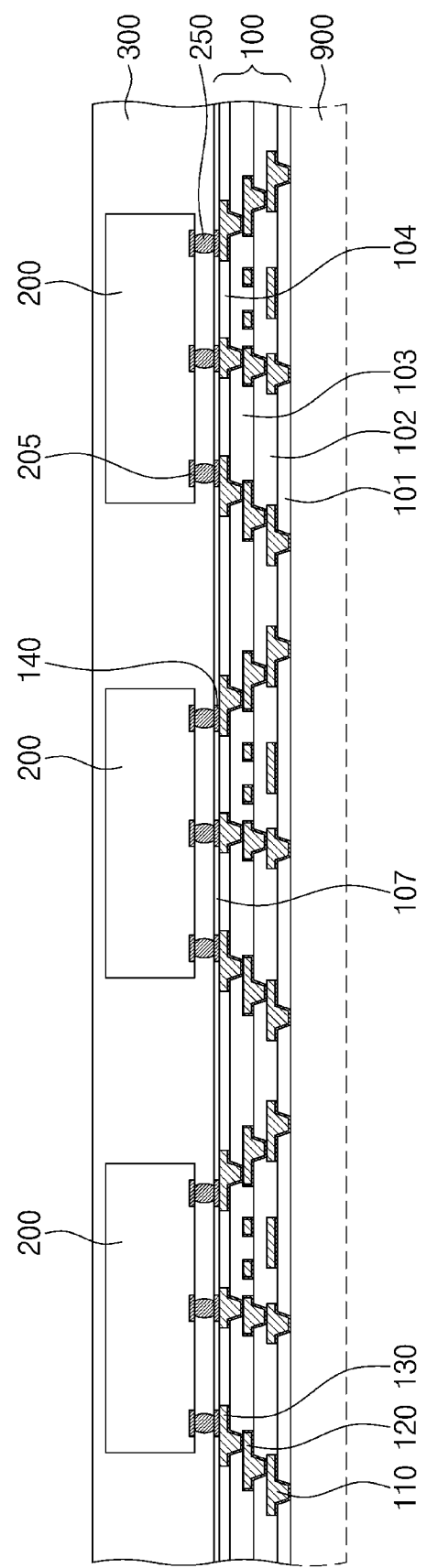
FIGS. 4A and 4B illustrate cross-sectional views showing a method of fabricating a semiconductor package according to some example embodiments.
Figure 4B:
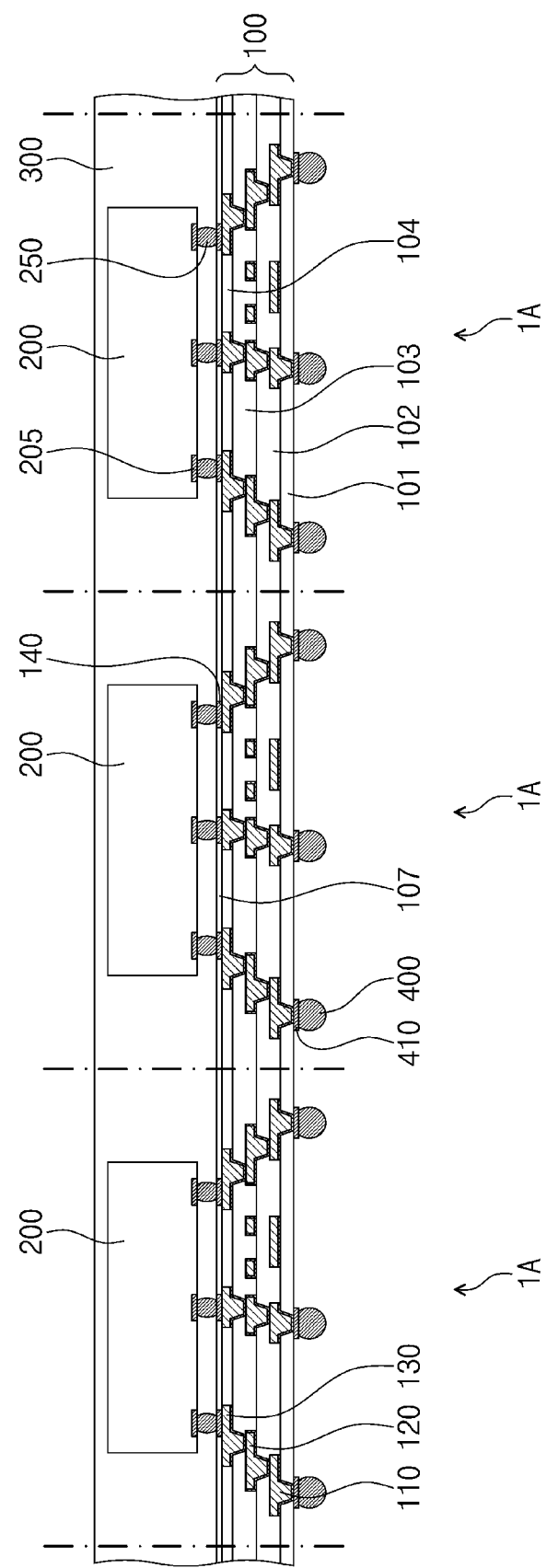

FIGS. 4A and 4B illustrate cross-sectional views showing a method of fabricating a semiconductor package according to some example embodiments. A duplicate description will be omitted below.

Referring to FIG. 4A, the redistribution substrate 100 may be formed on the carrier substrate 900. The redistribution substrate 100 may include the first, second, third, and fourth dielectric layers 101, 102, 103, and 104, the first, second, and third redistribution patterns 110, 120, and 130, the conductive pad 140, and the passivation layer 107. The formation of the redistribution substrate 100 may be the same or substantially the same as or similar to that discussed above with reference to FIGS. 2A to 2L. In some embodiments, the redistribution substrate 100 may be formed in a panel or wafer level, for example.

The semiconductor chip 200 may be provided on the redistribution substrate 100 to cause the chip pad 205 of the semiconductor chip 200 to face the redistribution substrate 100. The connection terminal 250 may be formed between the conductive pad 140 and the chip pad 205. In this case, a plurality of semiconductor chips 200 may be mounted on the redistribution substrate 100. The semiconductor chips 200 may be disposed laterally and spaced apart from each other in the horizontal direction. The molding layer 300 may be provided on a top surface of the redistribution substrate 100, and may cover the semiconductor chips 200. Afterwards, the carrier substrate 900 may be removed to expose a bottom surface of the first dielectric layer 101 and a bottom surface of the first redistribution pattern 110.

Referring to FIG. 4B, the terminal pad 410 and the external connection terminal 400 may be formed on the exposed bottom surface of the redistribution substrate 100. The molding layer 300 and the redistribution substrate 100 may be diced along the dotted-and-dashed lines, and therefore a plurality of semiconductor packages 1A may be separated from each other. Differently from that shown in FIG. 4B, the redistribution substrate 100 may be formed by the same or substantially the same or similar method discussed above with reference to FIGS. 1A to 1P. In this case, the semiconductor package 1 discussed above with reference to FIGS. 1Q and 1R may be formed in plural.

In this description, semiconductor packages may be fabricated at a chip, panel, or wafer level. The following will explain a single semiconductor package for convenience and brevity of description, but methods of fabricating semiconductor packages are not limited to the chip-level fabrication.

FIGS. 5A to 5D and 5F to 5J each illustrate a cross-sectional view showing a method of fabricating a semiconductor package according to some example embodiments.

Figure 5A:
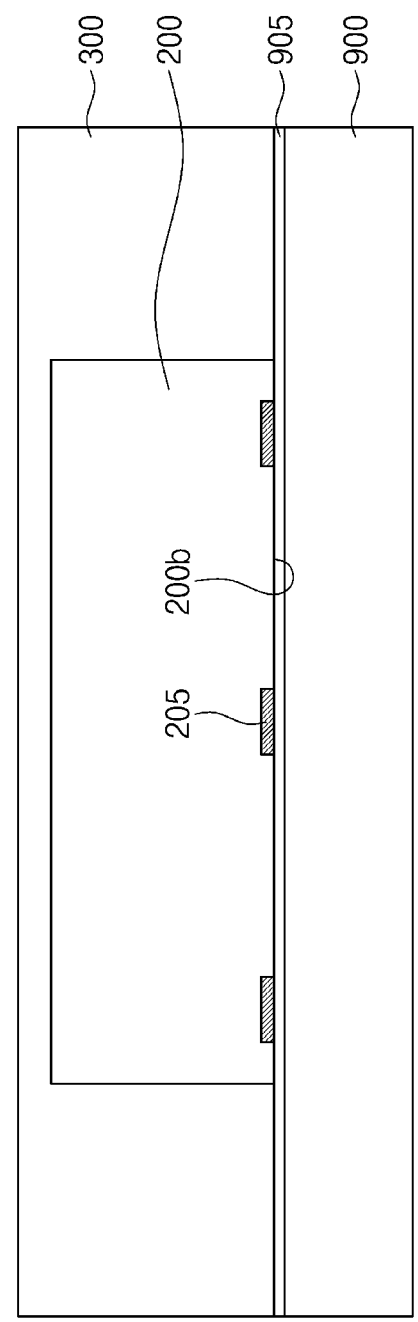
FIGS. 5A to 5D and 5F to 5J illustrate cross-sectional view showing a method of fabricating a semiconductor package according to some example embodiments.
Figure 5B:
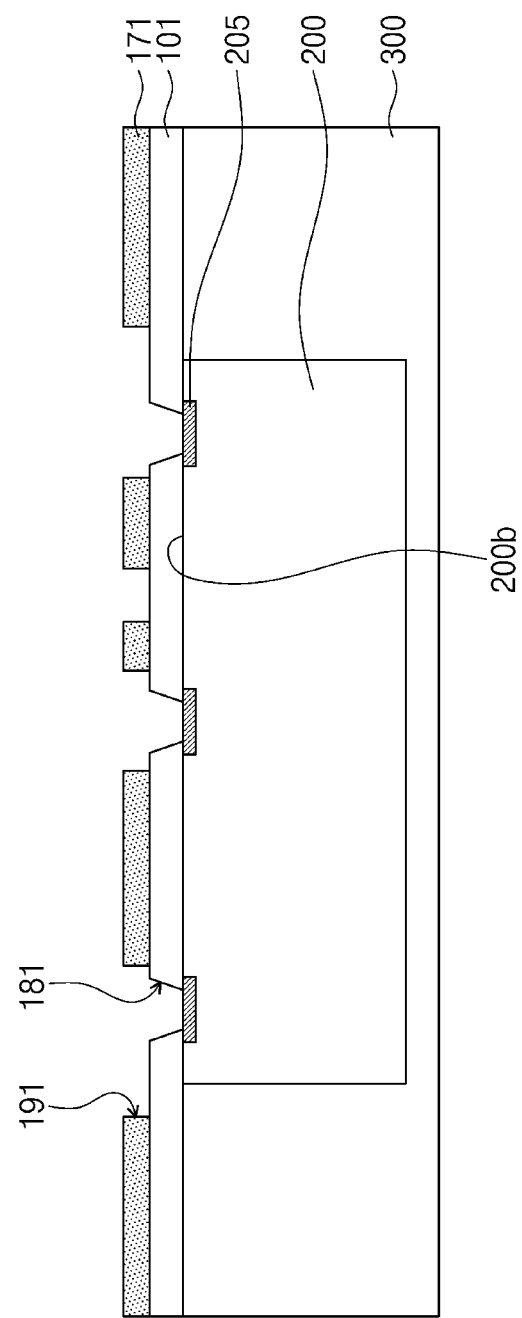
Figure 5C:
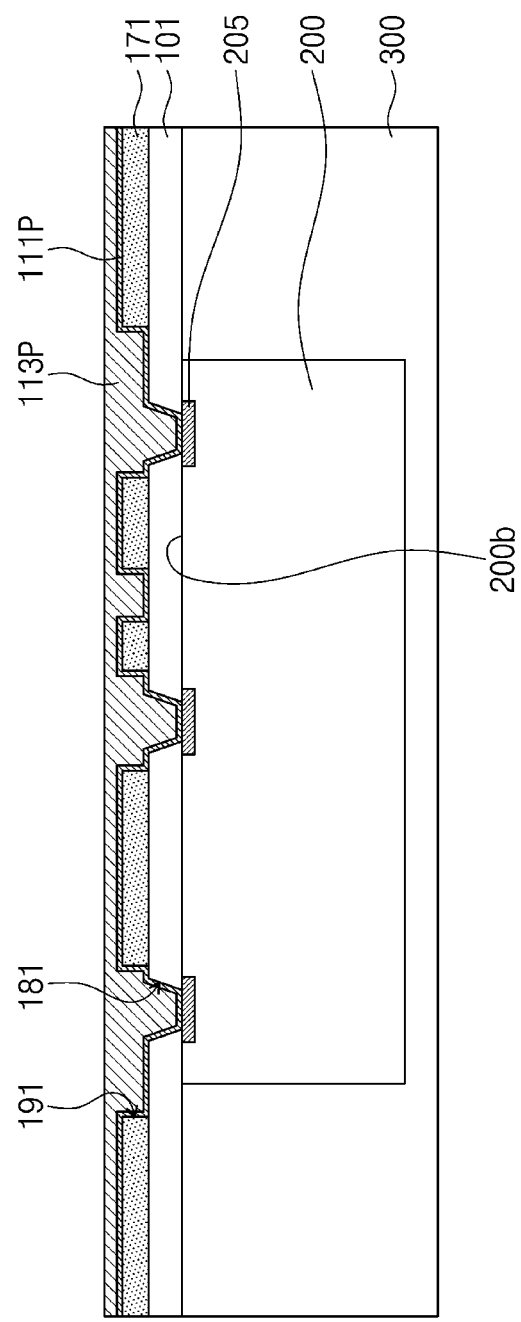
Figure 5D:
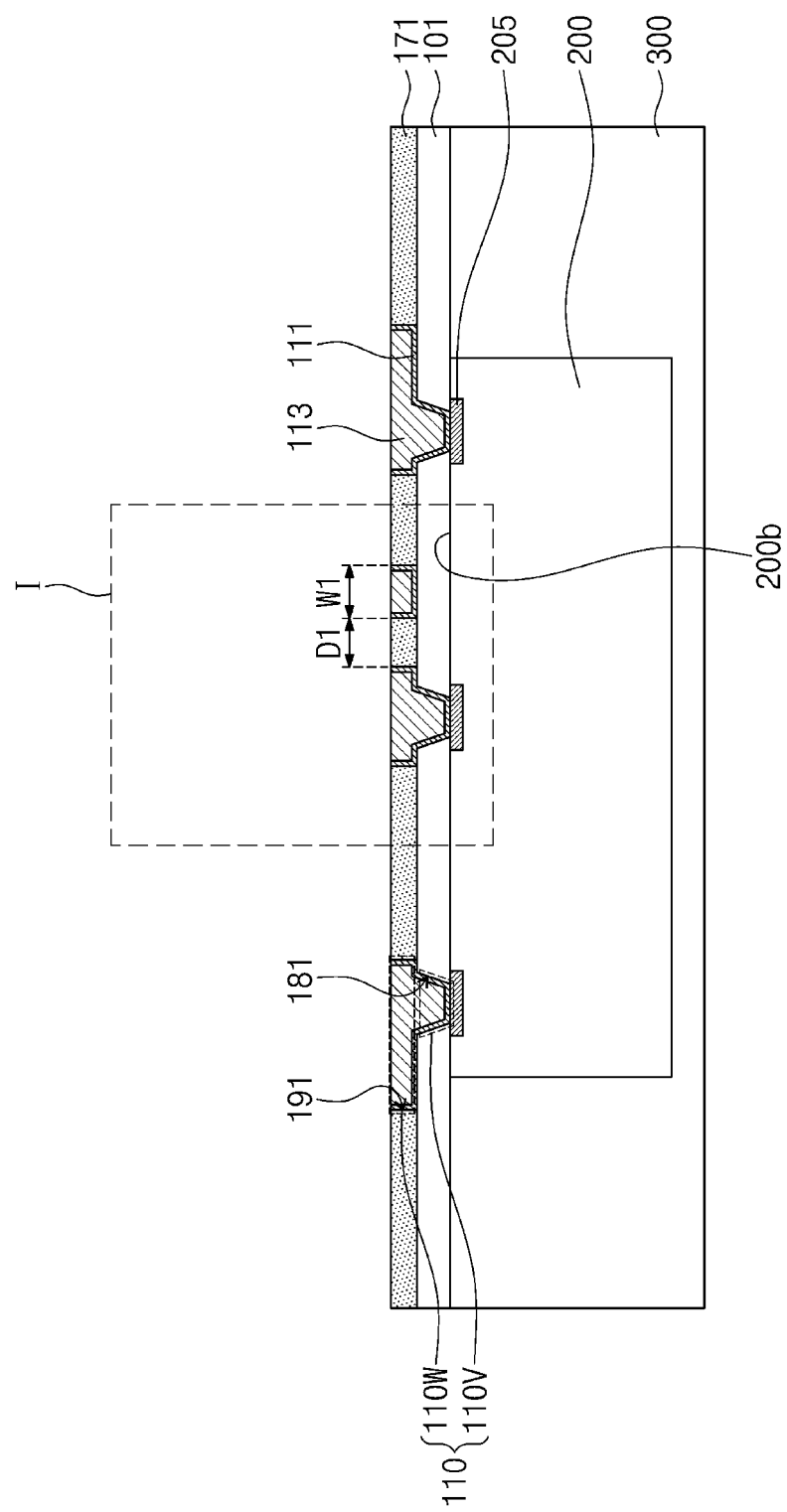
Figure 5E:
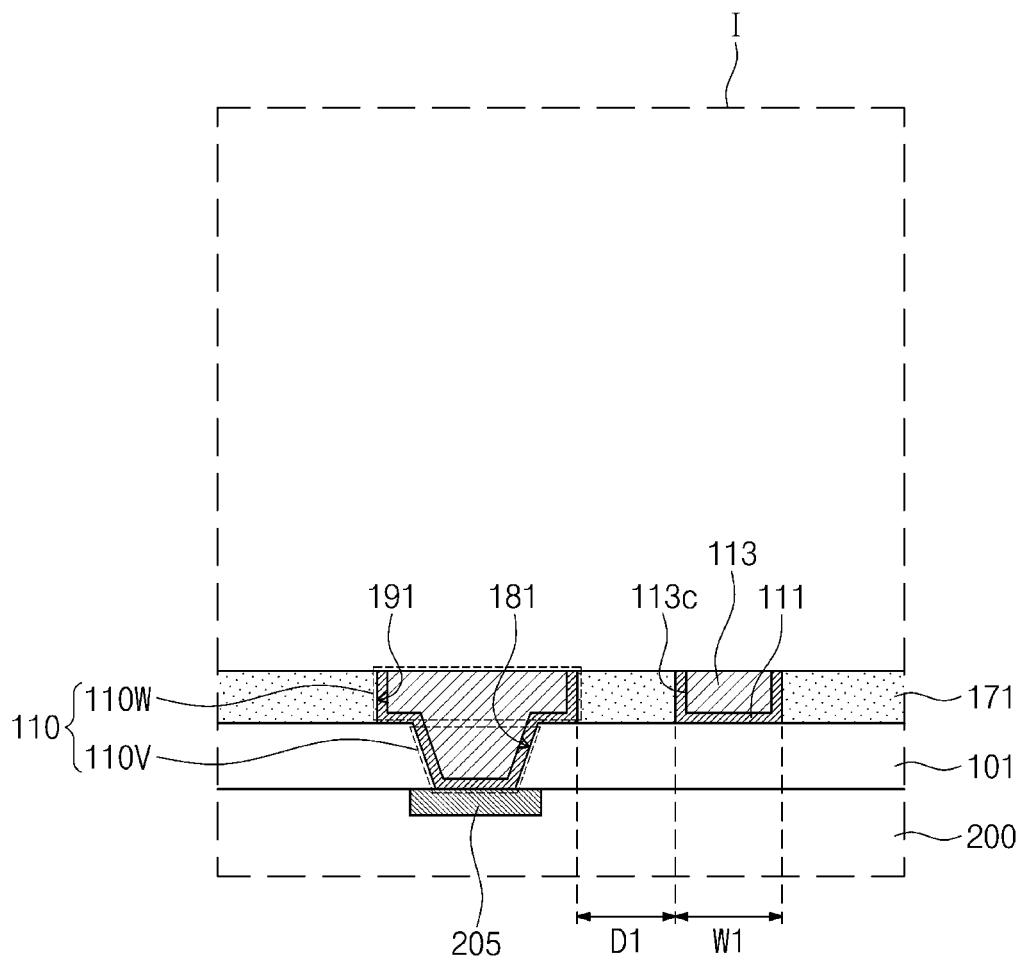
FIG. 5E illustrates an enlarged view showing section I of FIG. 5D.

FIG. 5E illustrates an enlarged view showing section I of FIG. 5D. FIG. 5K illustrates an enlarged view showing section I of FIG. 5J. For convenience of description, in explaining FIGS. 5A to 5K, top and bottom surfaces of a certain component will be discussed based on a figure that illustrates the certain component. A duplicate description of like components will be omitted below.

Referring to FIG. 5A, the semiconductor chip 200 and the molding layer 300 may be disposed on the carrier substrate 900. The semiconductor chip 200 may have a first surface 200b that faces the carrier substrate 900. A plurality of chip pads 205 may be disposed on the first surface 200b of the semiconductor chip 200. The first surface 200b may correspond to a bottom surface of the semiconductor chip 200. The molding layer 300 may be formed on the carrier substrate 900, and may cover at least a portion of the semiconductor chip 200. For example, the molding layer 300 may cover top and lateral surfaces of the semiconductor chip 200. Differently from that shown in FIG. 5A, the molding layer 300 may cover the lateral surface of the semiconductor chip 200, but may expose the top surface of the semiconductor chip 200. Afterwards, the carrier substrate 900 may be removed to expose the first surface 200b of the semiconductor chip 200 and a bottom surface of the molding layer 300. The semiconductor chip 200 and the molding layer 300 may be turned upside down.

Referring to FIG. 5B, the first dielectric layer 101 and the first resist pattern 171 may be formed on the molding layer 300 and the first surface 200b of the semiconductor chip 200. The first hole 181 may be formed in the first dielectric layer 101, and may expose the chip pad 205 of the semiconductor chip 200. The first resist pattern 171 may be formed on the first dielectric layer 101. The first trench 191 may be formed in the first resist pattern 171, and may be spatially connected to the first hole 181. The first trench 191 may expose a portion of the first dielectric layer 101. The formation of the first dielectric layer 101, the first hole 181, the first resist pattern 171, and the first trench 191 may be the same or substantially the same as or similar to that discussed above with reference to FIGS. 1A to 1C.

Referring to FIG. 5C, the first seed layer 111P and the first conductive layer 113P may be formed in the first hole 181 and the first trench 191. The first seed layer 111P and the first conductive layer 113P may extend onto a top surface of the first resist pattern 171. The formation of the first seed layer 111P and the first conductive layer 113P may be the same or substantially the same as or similar to that discussed above with reference to FIG. 1D. In some embodiments, the first seed layer 111P may physically contact the chip pad 205.

Referring to FIGS. 5D and 5E, the first seed layer 111P and the first conductive layer 113P may experience a planarization process to form the first seed pattern 111 and the first conductive pattern 113. As a result of the planarization process, the first seed layer 111P and the first conductive layer 113P may be removed from the top surface of the first resist pattern 171, which may result in the formation of the first seed pattern 111 and the first conductive pattern 113. Accordingly, the first redistribution pattern 110 may be formed. The first redistribution pattern 110 may include the first seed pattern 111 and the first conductive pattern 113. On the first seed pattern 111, the first conductive pattern 113 may fill the first hole 181 and the first trench 191.

The first redistribution pattern 110 may include a plurality of first via parts 110V and a plurality of first wiring parts 110W. The first via parts 110V and the first wiring parts 110W may be the same or substantially the same as or similar to those discussed above with reference to FIGS. 1E and 1F. For example, a minimum width W1 of the first wiring part 110W may range from 0.1 μm to 5 μm. For example, a minimum width W1 of a narrowest (smallest) first wiring part 110W of the plurality of first wiring parts 110W may range from 0.1 μm to 5 μm. A minimum interval D1 between the first wiring parts 110W may range from 0.1 μm to 5 μm. For example, a minimum interval D1 between the closest pair of first wiring parts 110W of the plurality of first wiring parts 110W may range from 0.1 μm to 5 μm. In each of the first wiring parts 110W, the first seed pattern 111 may cover the sidewall 113c of the first conductive pattern 113. However, differently from illustrated by FIGS. 1E and 1F, the first via parts 110V may be electrically connected to corresponding chip pads 205. Hereinafter, a single first wiring part 110W and a single first via part 110V will be explained for convenience and brevity of description.

Figure 5F:
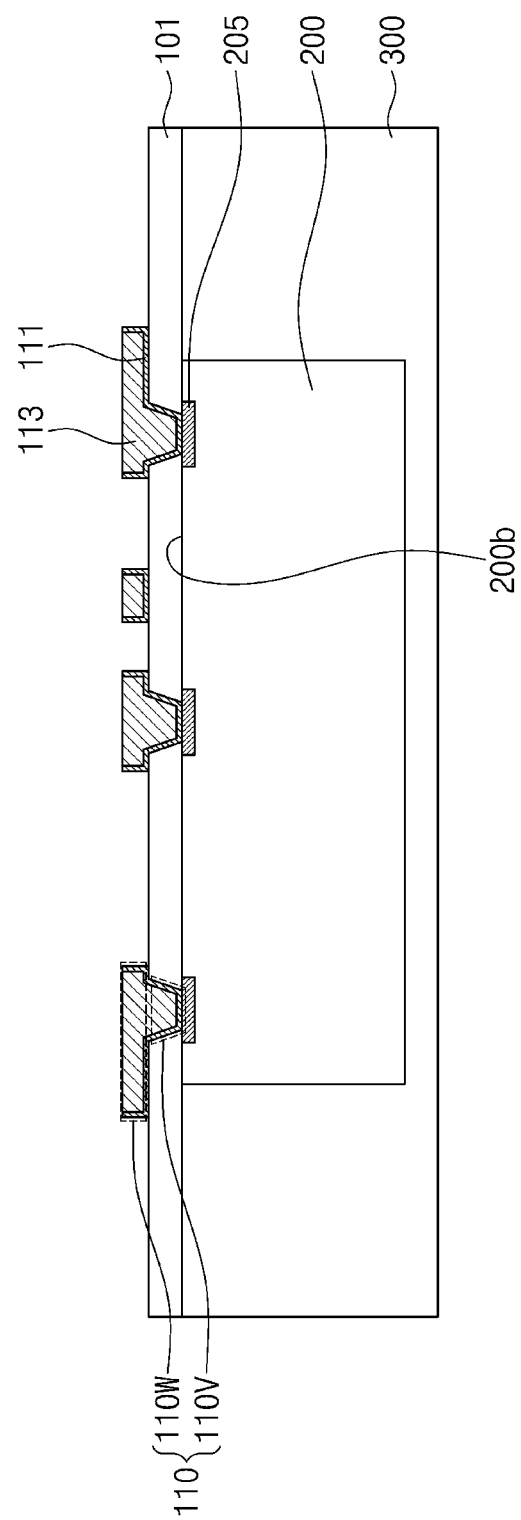

Referring to FIG. 5F, the first resist pattern 171 may be removed to expose a top surface of the first dielectric layer 101 and a sidewall of the first wiring part 110W.

Figure 5G:
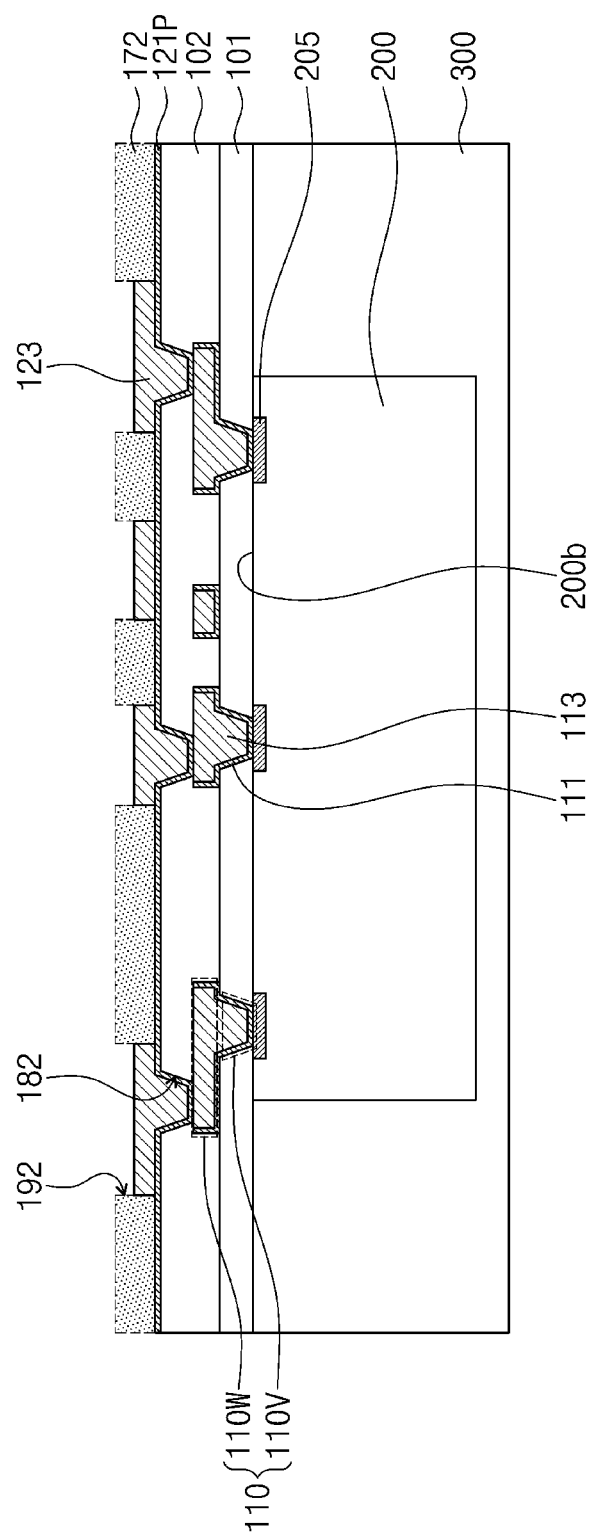

Referring to FIG. 5G, the second dielectric layer 102 may be formed on the first dielectric layer 101, and may cover the top surface of the first dielectric layer 101, the sidewall of the first wiring part 110W, and a top surface of the first wiring part 110W. The first seed pattern 111 may be interposed between the second dielectric layer 102 and the sidewall 113c of the first conductive pattern 113 of the first wiring part 110W. The second hole 182 may be formed in the second dielectric layer 102, and may expose a top surface of the first redistribution pattern 110.

The second seed layer 121P may be formed on the first dielectric layer 101. The second resist pattern 172 may be formed on the second seed layer 121P. The second resist pattern 172 may have the second trench 192 that exposes the second seed layer 121P. At least a portion of the second trench 192 may vertically overlap with the second hole 182. The second dielectric layer 102, the second hole 182, the second seed layer 121P, the second resist pattern 172, and the second trench 192 may be formed by the same or substantially the same or similar methods discussed above with reference to FIGS. 1H to 1J.

The second conductive pattern 123 may be formed in the second trench 192 and the second hole 182, and may cover the second seed layer 121P. The second conductive pattern 123 may not extend onto a top surface of the second resist pattern 172. Afterwards, the second resist pattern 172 may be removed as illustrated by the dashed line, and thus a first portion of the second seed layer 121P may be exposed at a top surface thereof and the second wiring part 120W may be exposed at a sidewall thereof.

Figure 5H:
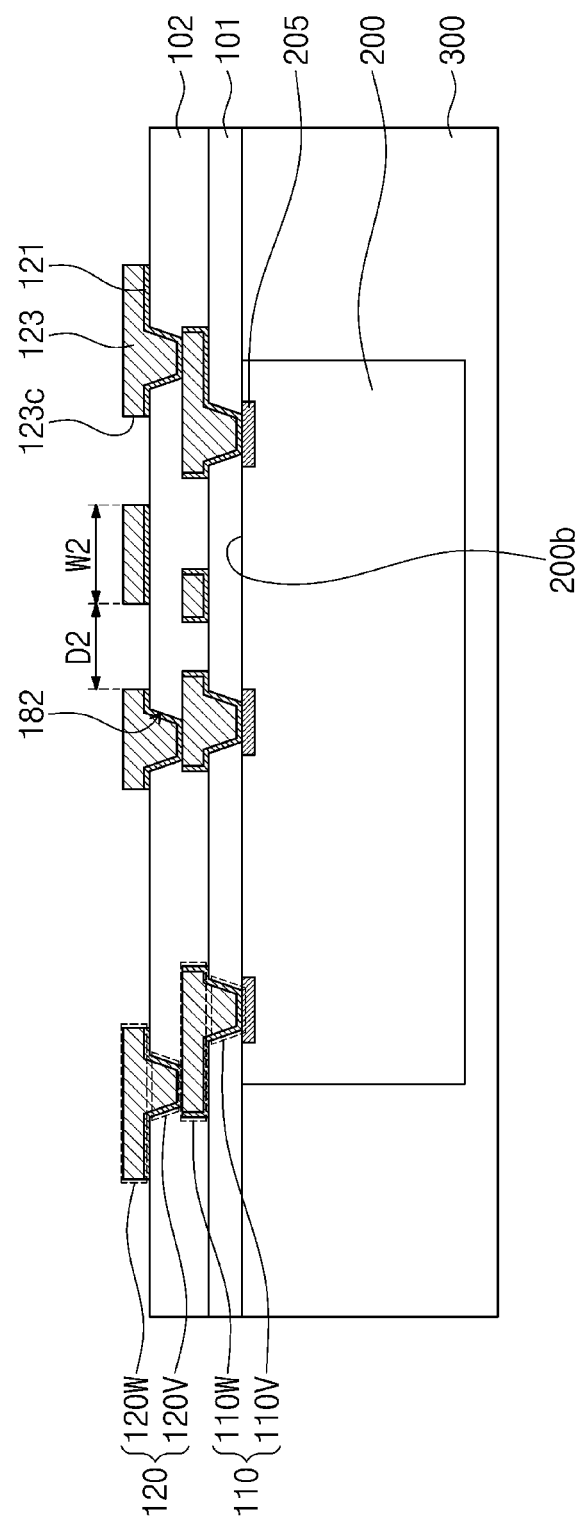

Referring to FIG. 5H, the exposed first portion of the second seed layer 121P may be etched to expose the second dielectric layer 102. After the etching process, a remaining second portion of the second seed layer 121P may be formed into the second seed pattern 121. The second seed pattern 121 may be disposed between the second conductive pattern 123 and the second dielectric layer 102. Accordingly, the second redistribution pattern 120 may be formed.

The second redistribution pattern 120 may include a plurality of second via parts 120V and a plurality of second wiring parts 120W. A minimum interval D2 between a pair of second wiring parts 120W of the plurality of second wiring parts 120W may be greater than 5 μm and equal to or less than 10 μm. The narrowest second wiring part 120W of the plurality of second wiring parts 120W may have a minimum width W2 of greater than 5 μm and equal to or less than 10 μm. According to some embodiments, no planarization process may be separately performed in forming the second redistribution pattern 120, which may result in the simplification of the fabrication of the second redistribution pattern 120. In each of the second wiring parts 120W, the second seed pattern 121 may not cover the sidewall 123c of the second conductive pattern 123. For example, each vertical sidewall surface of each second wiring part 120W may not be covered by the second seed pattern 121.

Figure 5I:
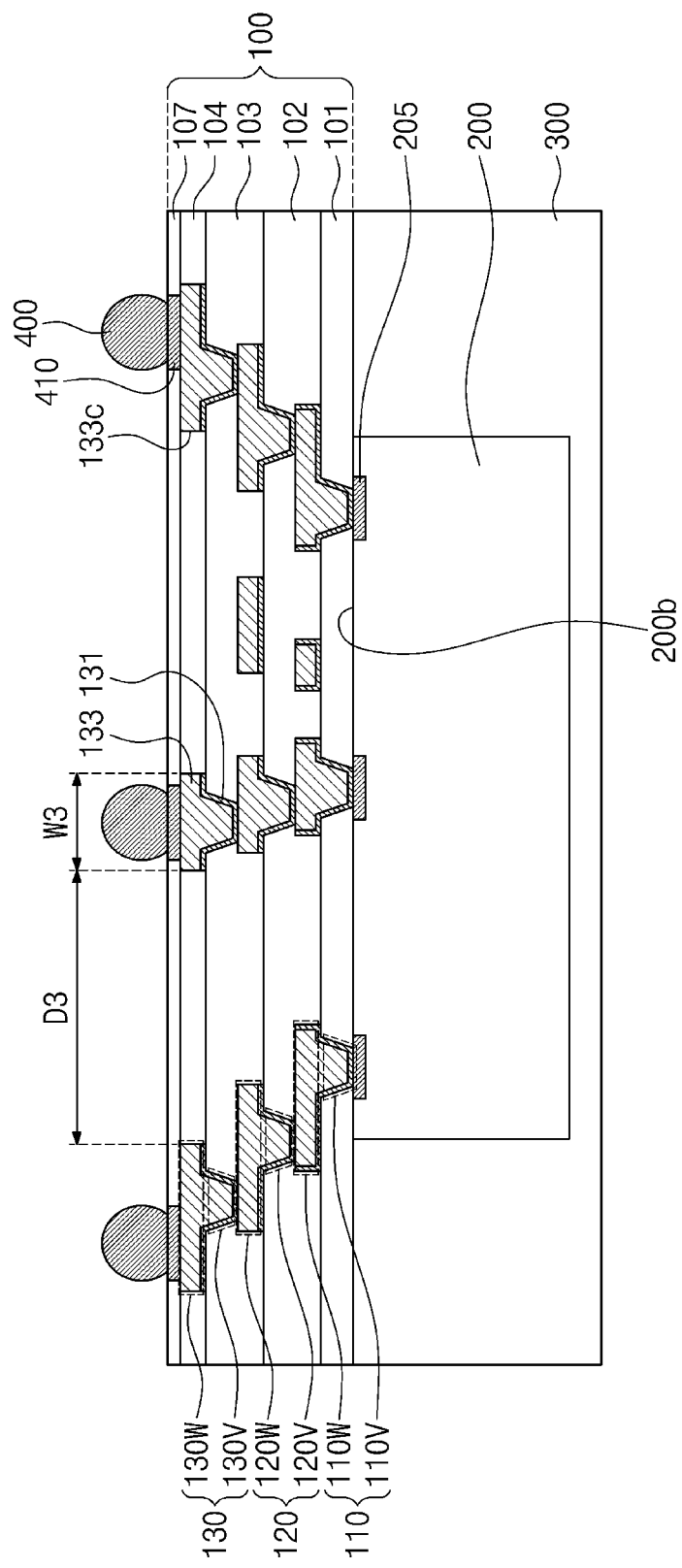

Referring to FIG. 5I, the fourth dielectric layer 104, the third redistribution pattern 130, and the passivation layer 107 may be formed on the third dielectric layer 103. The fourth dielectric layer 104, the third redistribution pattern 130, and the passivation layer 107 may be formed by the same or substantially the same method discussed in FIG. 1P. For example, the third redistribution pattern 130 may include a plurality of third via parts 130V and a plurality of third wiring parts 130W. A minimum interval D3 between a pair of closest third wiring parts 130W of the plurality of third wiring parts 130W may be greater than 5 μm and equal to or less than 10 μm. A narrowest third wiring part 130W of the plurality of third wiring parts 130W may have a minimum width W3 of greater than 5 μm and equal to or less than 10 μm. According to some embodiments, no planarization process may be separately performed in forming the third redistribution pattern 130, which may result in the simplification of the fabrication of the third redistribution pattern 130. In each of the third wiring parts 130W, the third seed pattern 131 may not cover the sidewall 133c of the third conductive pattern 133. For example, each vertical sidewall surface of each third wiring part 130W may not be covered by the third seed pattern 131.

The redistribution substrate 100 may be fabricated through the examples discussed above. The redistribution substrate 100 may include the dielectric pattern, the first, second, and third redistribution patterns 110, 120, and 130, and the passivation layer 107. The dielectric pattern may include the first, second, third, and fourth dielectric layers 101, 102, 103, and 104. The terminal pad 410 may be formed on the third redistribution pattern 130 exposed by the passivation layer 107. The external connection terminal 400 may be formed on the terminal pad 410.

Figure 5J:
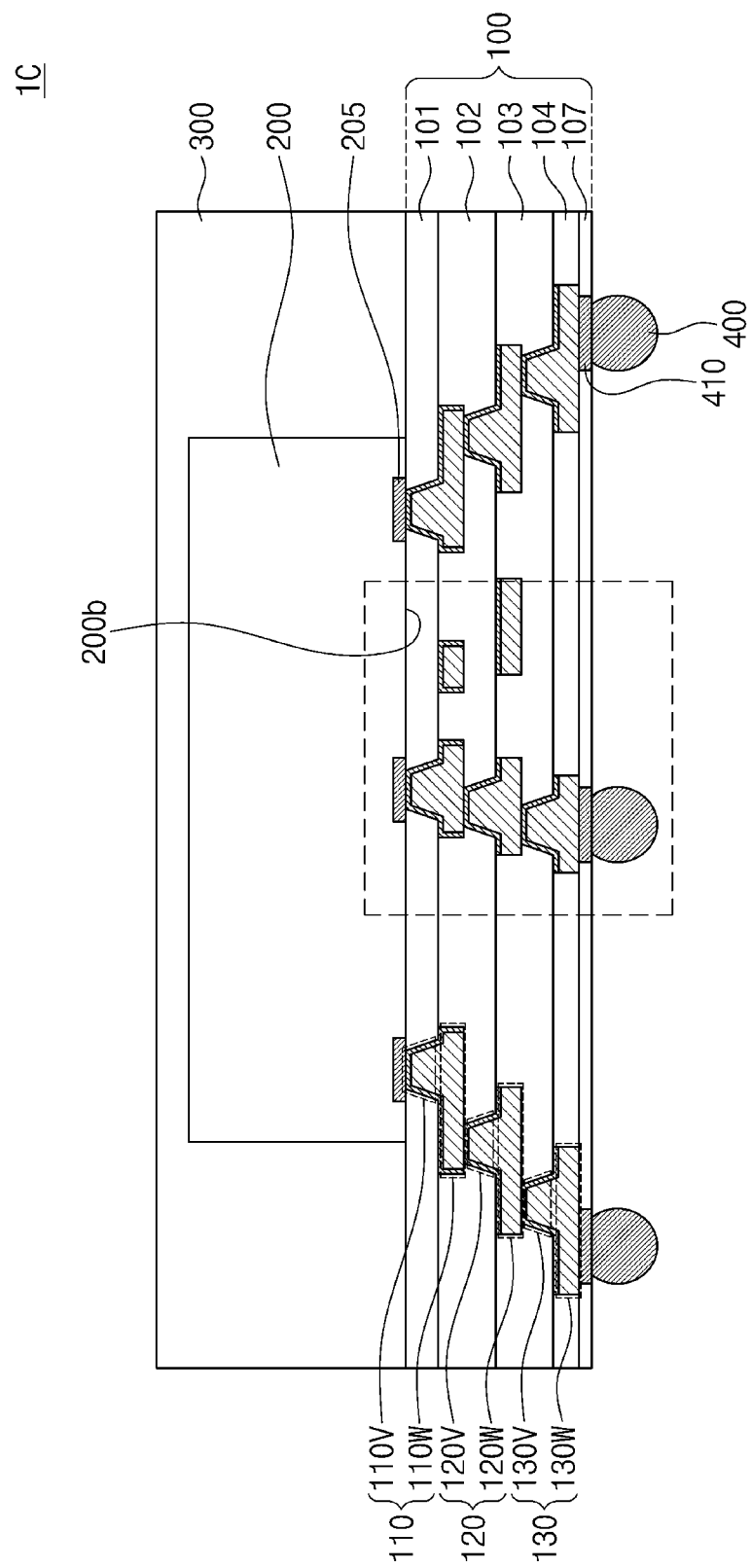
Figure 5K:
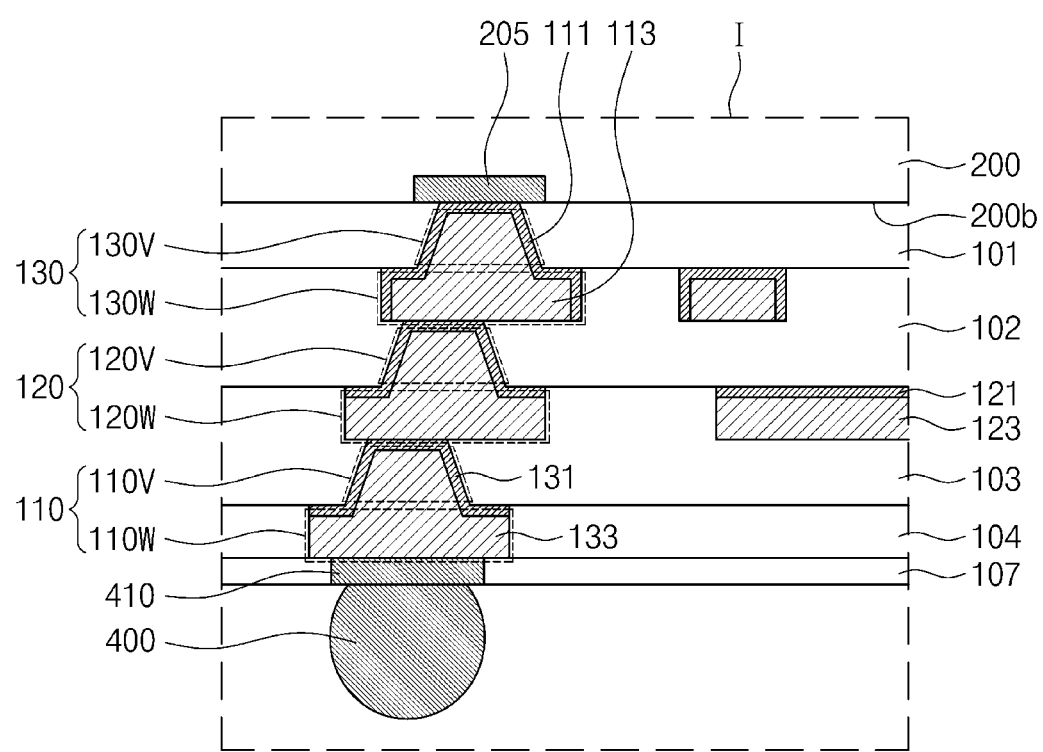
FIG. 5K illustrates an enlarged view showing section I of FIG. 5J.

Referring to FIGS. 5J and 5K, the redistribution substrate 100, the semiconductor chip 200, and the molding layer 300 may be turned upside down to cause the redistribution substrate 100 to face downwardly. A semiconductor package 1C may thus be fabricated.

According to some embodiments, the semiconductor package 1C may be fabricated by a chip-first process, for example. The first redistribution pattern 110 may directly contact the chip pad 205. A minimum interval between the second seed pattern 121 and the semiconductor chip 200 may be less than a minimum interval between the second conductive pattern 123 and the semiconductor chip 200. A minimum interval between the third seed pattern 131 and the semiconductor chip 200 may be less than a minimum interval between the third conductive pattern 133 and the semiconductor chip 200.

Figure 6A:
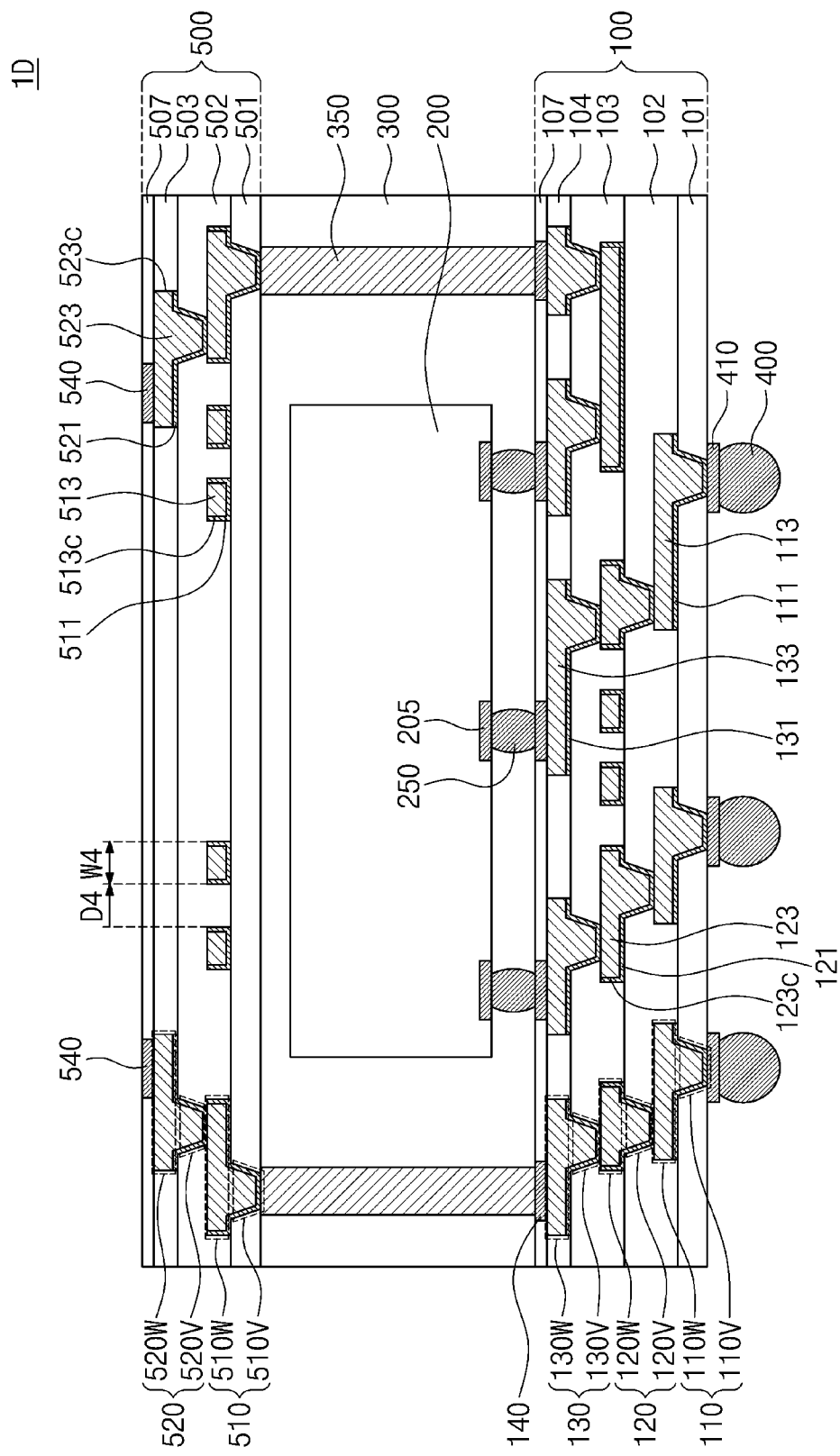
FIG. 6A illustrates a cross-sectional view showing a semiconductor package according to some example embodiments.

FIG. 6A illustrates a cross-sectional view showing a semiconductor package according to some example embodiments. A duplicate description of like components discussed above will be omitted below.

Referring to FIG. 6A, a semiconductor package 1D may include the redistribution substrate 100, the semiconductor chip 200, and the molding layer 300, and may further include a conductive structure 350. The redistribution substrate 100 may include the dielectric layers 101, 102, 103, and 104, the redistribution patterns 110, 120, and 130, and a plurality of conductive pads 140. The redistribution substrate 100 may be fabricated by the method discussed above with reference to FIGS. 2A to 2L, for example. In some embodiments, the redistribution substrate 100 may be fabricated by the method discussed above with reference to FIGS. 1A to 1P. In some embodiments, the redistribution substrate 100 may be the same or substantially the same as that discussed with reference to FIGS. 3A and 3B.

The semiconductor chip 200 and the molding layer 300 may be the same or substantially the same as or similar to those discussed above with reference to FIGS. 1Q and 1R. For example, the semiconductor chip 200 may be electrically connected through the connection terminal 250 to at least one of the conductive pads 140.

The conductive structure 350 may be provided on the redistribution substrate 100 and in the molding layer 300. The conductive structure 350 may be disposed laterally and spaced apart from the semiconductor chip 200. The conductive structure 350 may be coupled to conductive pads 140. The conductive structure 350 may be electrically connected through the redistribution patterns 110, 120, and 130 to either the external connection terminal 400 or the semiconductor chip 200. The conductive structure 350 may include a metal pillar, for example.

The molding layer 300 may be formed on the redistribution substrate 100, and may cover the semiconductor chip 200. The molding layer 300 may cover a sidewall of the conductive structure 350, and may expose a top surface of the conductive structure 350.

The semiconductor package 1D may further include an upper redistribution layer 500. The upper redistribution layer 500 may be disposed on a top surface of the molding layer 300 and the top surface of the conductive structure 350. The upper redistribution layer 500 may include an upper dielectric pattern, a first upper redistribution pattern 510, a second upper redistribution pattern 520, and an upper pad 540. The upper dielectric pattern may include a first upper dielectric layer 501, a second upper dielectric layer 502, and a third upper dielectric layer 503 that are stacked. The first upper dielectric layer 501 may cover the molding layer 300. The first, second, and third upper dielectric layers 501, 502, and 503 may include a photosensitive polymer.

The first upper redistribution pattern 510 may include first upper via parts 510V and first upper wiring parts 510W. The first upper via parts 510V may be disposed in the first upper dielectric layer 501 and be coupled (connected) to the conductive structure 350. The first upper wiring parts 510W may be disposed on the first upper via parts 510V and the first upper dielectric layer 501. The first upper wiring parts 510W may be provided on and connected to corresponding first upper via parts 510V. Each first upper wiring parts 510W may have a width or length that is greater than a width or length of the corresponding first upper via parts 510V. Additionally, some first upper wiring parts 510W may not have a corresponding first upper via part 510V, in a cross-section view. For example, as illustrated in FIG. 6A, there are four upper wiring parts 510W (center of page) that do not have a corresponding first upper via part 510V, in a cross-section view. A minimum width W4 of the first upper wiring parts 510W may range from 0.1 μm to 5 μm, for example. The minimum width W4 of the first upper wiring parts 510W may refer to the smallest width of one first upper wiring part 510w of the plurality of first upper wiring parts 510W. A minimum interval D4 between a closest pair of first upper wiring parts 510W may range from 0.1 μm to 5 μm, for example. Each of the first upper wiring parts 510W may include a first upper seed pattern 511 and a first upper conductive pattern 513. Each of the first upper via parts 510V may include a first upper seed pattern 511 and a first upper conductive pattern 513. The first upper conductive pattern 513 may include metal, such as copper for example. The corresponding first upper conductive pattern 513 of each corresponding first upper via parts 510V may be directly connected to the first upper conductive pattern 513 of a corresponding first upper wiring part 510W. The first upper seed pattern 511 may not be interposed between the first upper conductive pattern 513 of the first upper via part 510W and the first upper conductive pattern 513 of the first upper wiring part 510W.

The first upper seed pattern 511 may be interposed between the first upper conductive pattern 513 and the conductive structure 350 and be between the first upper conductive pattern 513 and the first upper dielectric layer 501, and may be provided on a sidewall 513c of the first upper conductive pattern 513 of the first upper wiring part 510W. The first upper seed pattern 511 may prevent physical contact (direct physical contact) between the first upper dielectric layer 501 and the sidewall 513c of the first upper conductive pattern 513 of the first upper wiring part 510W. Therefore, the first upper conductive pattern 513 may be prevented from causing damage to the sidewall 513c thereof. The first upper seed pattern 511 may include metal, such as titanium and/or tantalum for example. The first upper redistribution pattern 510 may be formed by the same or substantially the same or similar method used for forming the first redistribution pattern 110 discussed above with reference to FIGS. 1A to 1E.

The second upper redistribution pattern 520 may be disposed in the second upper dielectric layer 502 and third upper dielectric layer 503, and be disposed on the first upper dielectric layer 501 and electrically connected to the first upper redistribution pattern 510. For example, second upper wiring parts 520W may be disposed in the third upper dielectric layer 503 and be on the second upper dielectric layer 502. Additionally, second upper via parts 520V may be disposed in the second upper dielectric layer 502 and be on the first upper dielectric layer 501. The second upper redistribution pattern 520 may be formed by the same or substantially the same or similar method used for forming the second redistribution pattern 120 discussed above with reference to FIGS. 1H to 1L. The second upper redistribution pattern 520 may include second upper via parts 520V and second upper wiring parts 520W. The second upper via parts 520V may be provided in the second upper dielectric layer 502. The second upper via parts 520V may be disposed on and coupled to (connected to) the first upper wiring parts 510W. Each of the second upper via parts 520V may include a second upper seed pattern 521 and a second upper conductive pattern 523.

The second upper wiring parts 520W may be disposed on the second upper via parts 520V and a top surface of the second upper dielectric layer 502. The second upper wiring parts 520W may be provided on and connected to corresponding second upper via parts 520V. The second upper wiring parts 520W may each have a width or length in the horizontal direction that is greater than those of the corresponding second upper via parts 520V. Each of the second upper wiring parts 520W may have a minimum width W1 of greater than 5 μm and equal to or less than 10 μm for example. A minimum interval between a pair of the closest second upper wiring parts 520W may be greater than 5 μm and equal to or less than 10 μm for example. Each of the second upper wiring parts 520W may include a second upper seed pattern 521 and a second upper conductive pattern 523. The second upper seed pattern 521 may be interposed between the second upper conductive pattern 523 and the first upper redistribution pattern 510 and be between the second upper conductive pattern 523 and the second upper dielectric layer 502. The second upper seed pattern 521 may not extend onto a sidewall 523c of the second upper seed pattern 521 of the second upper wiring part 520W. The sidewall 523c of the second upper conductive pattern 523 of the second upper wiring part 520W may be in direct physical contact with the third upper dielectric layer 503. The second upper seed pattern 521 may include metal, such as titanium and/or tantalum for example.

The second upper conductive pattern 523 may be disposed on the second upper seed pattern 521. The second upper conductive pattern 523 of each of the second upper via parts 520V may be directly connected to the second upper conductive pattern 523 of a corresponding second upper wiring part 520W. The second upper seed pattern 521 may not be interposed between the second upper conductive pattern 523 of the second upper via part 520V and the second upper conductive pattern 523 of the second upper wiring part 520W. For example, see the dashed lines in FIG. 6A between the second upper wiring part 520W (left side) and the second upper via part 520V (left side) indicating a corresponding region where the second upper seed pattern 521 "may not be interposed" as explained previously. The second upper conductive pattern 523 may include metal, such as copper for example.

The second upper redistribution pattern 520 may be formed by the same or substantially the same or similar method used for forming the second redistribution pattern 120 discussed above with reference to FIGS. 1A to 1E. For example, no planarization process may be separately performed in forming the second upper redistribution pattern 520. Therefore, the formation of the second upper redistribution pattern 520 may be simplified.

For another example, the second upper seed pattern 521 may further cover the sidewall 523c of the second upper conductive pattern 523 of the second upper wiring part 520W (not illustrated in FIG. 6A).

The upper pad 540 may be formed on and be coupled to (connected to) the second upper redistribution pattern 520. The upper pad 540 may include a conductive material, such as metal for example.

The upper redistribution layer 500 may further include an upper passivation layer 507. The upper passivation layer 507 may cover a top surface of the third upper dielectric layer 503 and a top surface of the second upper redistribution pattern 520. The upper passivation layer 507 may include, for example, a dielectric polymer. In other embodiments, the semiconductor package 1D may not include the upper redistribution layer 500 and/or components of the upper redistribution layer 500.

Figure 6B:
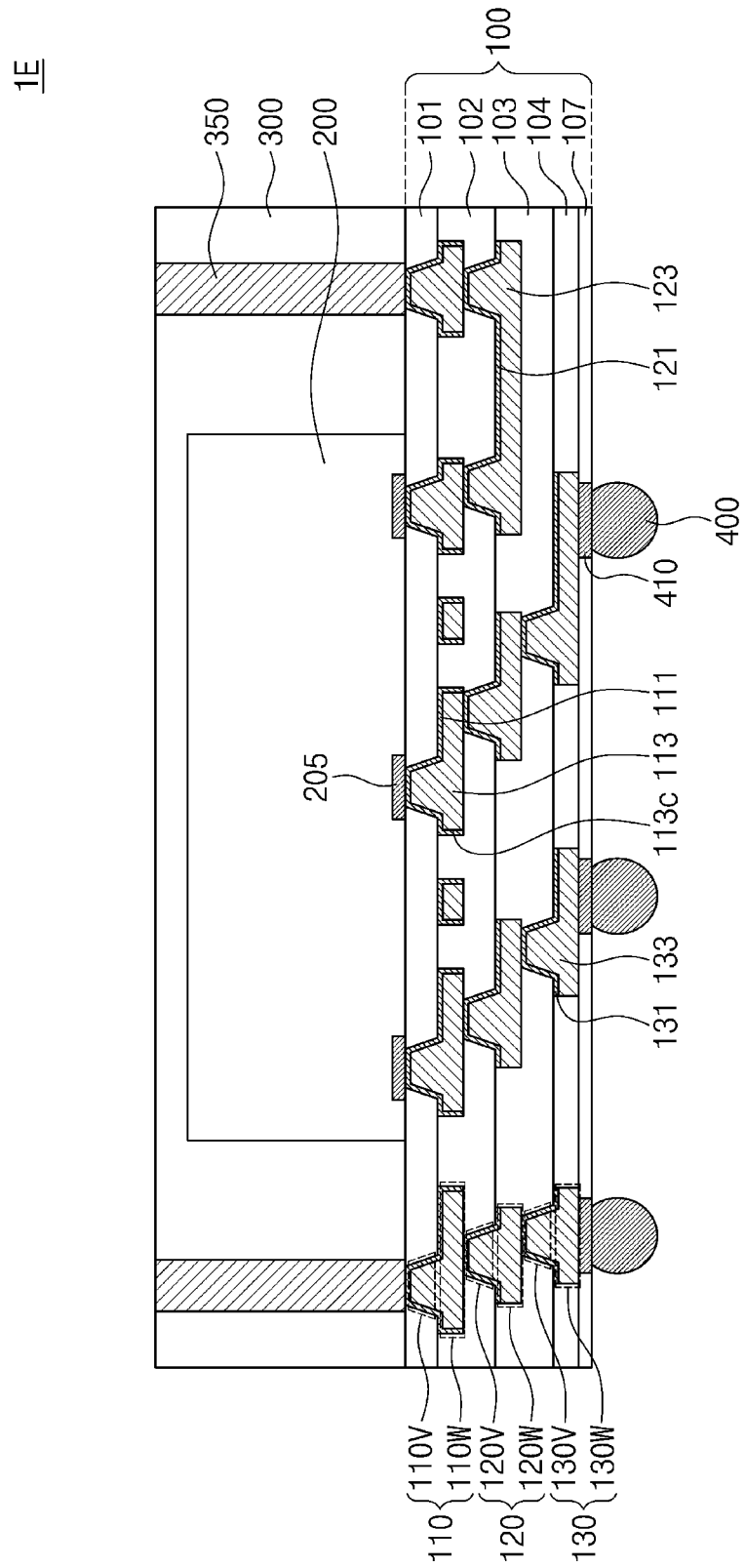
FIG. 6B illustrates a cross-sectional view showing a semiconductor package according to some example embodiments.

FIG. 6B illustrates a cross-sectional view showing a semiconductor package according to some example embodiments. A duplicate description will be omitted below.

Referring to FIG. 6B, a semiconductor package 1E may include the redistribution substrate 100, the semiconductor chip 200, and the molding layer 300, and may further include a conductive structure 350. The conductive structure 350 may be the same or substantially the same or similar as that discussed above with reference to FIG. 6A. The semiconductor chip 200, the molding layer 300, and the redistribution substrate 100 may be formed by the same or substantially the same or similar methods discussed above with reference to FIGS. 5A to 5K.

The first redistribution pattern 110 may include a plurality of first via parts 110V. One of the first via parts 110V may be directly coupled (directly connected) to the chip pad 205 of the semiconductor chip 200. For example, at least one of the first via parts 110V may be directly coupled (directly connected) to the chip pad 205 of the semiconductor chip 200. In some embodiments, some of the first via parts 110V of a plurality of first via parts 110V may be directly coupled (directly connected) to the chip pad 205 of the semiconductor chip 200 and the remaining first via parts 110V of the plurality of first via parts 110V may be coupled (connected) with the conductive structure 350. The first seed pattern 111 may be interposed between the first conductive pattern 113 and the chip pad 205. Additionally, some first via parts 110V that are not coupled to chip pad(s) 205 may be directly coupled to the conductive structure 350. The first dielectric layer 101 may be in direct physical contact with the molding layer 300 and the semiconductor chip 200.

Although not shown, the upper redistribution layer 500 discussed with reference to FIG. 6A may further be provided on a top surface of the molding layer 300.

Figure 6C:
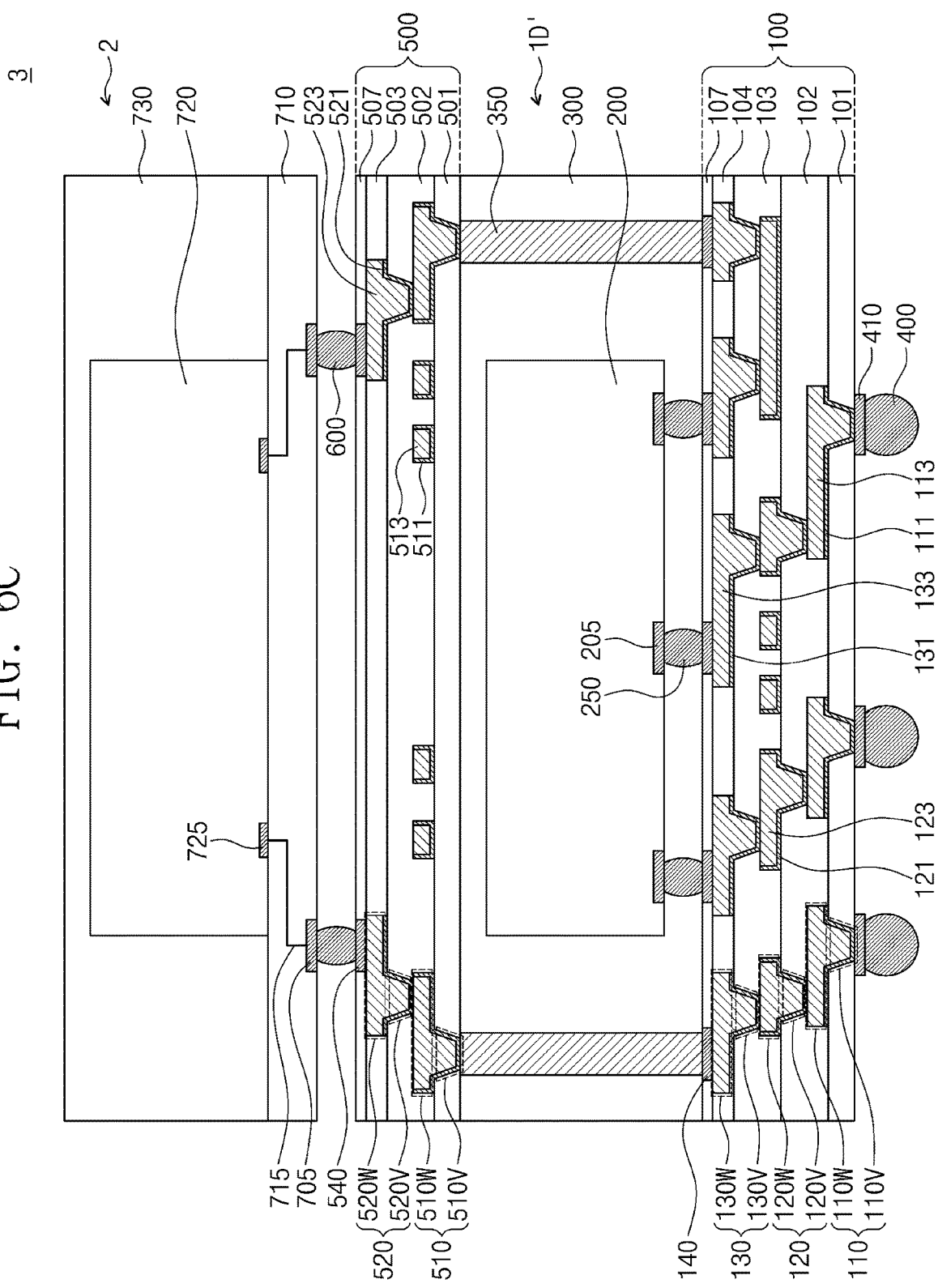
FIG. 6C illustrates a cross-sectional view showing a semiconductor package according to some example embodiments.

FIG. 6C illustrates a cross-sectional view showing a semiconductor package according to some example embodiments. A duplicate description of like components given above will be omitted below.

Referring to FIG. 6C, a semiconductor package 3 may include a first semiconductor package 1D', a second semiconductor package 2, and a conductive terminal 600. The semiconductor package 1D discussed above with reference to FIG. 6A may be used as the first semiconductor package 1D'. For example, the first semiconductor package 1D' may include the redistribution substrate 100, the semiconductor chip 200, the molding layer 300, the conductive structure 350, and the upper redistribution layer 500.

The second semiconductor package 2 may be disposed on the first semiconductor package 1D'. The second semiconductor package 2 may include a package substrate 710, an upper semiconductor chip 720, and an upper molding layer 730. The package substrate 710 may be a printed circuit board, for example. Alternatively, the package substrate 710 may be a redistribution layer, for example. The second semiconductor package 2 may be the same or substantially the same as or similar to one of the semiconductor package (s) 1 fabricated as discussed above with reference to FIGS. 1A to 1R, the semiconductor package 1A fabricated as discussed above with respect to FIGS. 2A to 2N, the semiconductor package 1B fabricated as discussed above with respect to FIGS. 3A and 3B, and the semiconductor package 1C fabricated as discussed above with respect to FIGS. 5A to 5K. A metal pad 705 may be disposed on a bottom surface of the package substrate 710.

The upper semiconductor chip 720 may be disposed on the package substrate 710. The upper semiconductor chip 720 may include integrated circuits, and the integrated circuits may include a memory circuit, a logic circuit, or a combination thereof. The upper semiconductor chip 720 may be of a different type from the semiconductor chip 200. The upper semiconductor chip 720 may be electrically connected to the metal pad 705 through an inner connection line 715 in the package substrate 710. FIG. 6C schematically illustrates the inner connection line 715, and those with skill in the art will understand that the shape and arrangement of the inner connection line 715 may vary and/or be changed. The package substrate 710 may be provided thereon with the upper molding layer 730 that covers the upper semiconductor chip 720. The upper molding layer 730 may include a dielectric polymer, such as an epoxy-based polymer for example.

A conductive terminal 600 may be provided between the first semiconductor package 1D' and the second semiconductor package 2. The conductive terminal 600 may be interposed between and electrically connect the upper pad 540 and the metal pad 705. In such a configuration, the second semiconductor package 2 may be electrically connected to the semiconductor chip 200 and the external connection terminal 400 through the conductive terminal 600, the upper redistribution layer 500, and the conductive structure 350.

The electrical connection of the second semiconductor package 2 may include an electrical connection with integrated circuits in the upper semiconductor chip 720. Providing the upper redistribution layer 500 may increase the degree of freedom in designing the inner connection line 715 in the package substrate 710 and the integrated circuits in the upper semiconductor chip 720.

In other embodiments, the first semiconductor package 1D' may not include the upper redistribution layer 500. In such cases, the conductive structure 350 may be provided thereon with the conductive terminal 600 that is coupled to the conductive structure 350 and the metal pad 705. Alternatively, the semiconductor package 1E discussed above with respect to FIG. 6B may be used as the first semiconductor package 1D'.

According to the present inventive concepts, a redistribution substrate may include a wiring part and a via part. A seed pattern of the wiring part may cover a sidewall of a conductive pattern of the wiring part. The seed pattern may prevent damage to the sidewall of the conductive pattern of the wiring part. A sidewall of the wiring part may be prevented from delamination from a dielectric pattern. Consequently, the redistribution substrate and a semiconductor package may increase in reliability.

This detailed description of the present inventive concepts should not be construed as limited to the embodiments set forth herein, and it is intended that the present inventive concepts cover various combinations of the embodiments set forth herein, and the modifications and variations of this invention without departing from the spirit and scope of the present inventive concepts.

What is claimed is:

1. A method of fabricating a semiconductor package comprising:
    forming on a carrier substrate a first dielectric layer comprising a first hole exposing the carrier substrate;
    forming on the first dielectric layer a first resist pattern comprising a first trench;
    forming a first seed pattern conformally covering a bottom surface and a sidewall of the first hole, and a first conductive pattern filling in the first hole and the first trench to form a first redistribution pattern;
    removing the first resist pattern;
    forming on the first dielectric layer a second dielectric layer comprising a second hole which exposes the first redistribution pattern;
    forming a seed layer conformally covering a top surface of second dielectric layer, a bottom surface and a sidewall of the second hole;
    forming on the seed layer a second resist pattern comprising a second trench;
    forming a second conductive pattern filling in the second hole and the second trench to form a second redistribution pattern;
    removing the second resist pattern and a portion of the seed layer below the second resist pattern to form a second seed pattern;

forming on the second dielectric layer a third dielectric layer comprising a third hole which exposes the second redistribution pattern;
forming on the third dielectric layer a third resist pattern comprising a third trench;
forming a third seed pattern conformally covering a bottom surface and a sidewall of the third hole, and a third conductive pattern filling in the third hole and the third trench to form a third redistribution pattern;
removing the third resist pattern; and
forming a fourth dielectric layer on the third dielectric layer, the fourth dielectric layer exposes the third redistribution pattern,
wherein the second dielectric layer is in contact with a sidewall of the first seed pattern,
the third dielectric layer is in contact with a sidewall of the second conductive pattern,
the fourth dielectric layer is in contact with a sidewall of the third seed pattern.

2. The method of claim 1,
wherein the first redistribution pattern includes:
a first wiring part having a first wiring seed pattern and a first wiring conductive pattern on the first wiring seed pattern; and
a first via part having a first via seed pattern and a first via conductive pattern on the first via seed pattern, the first wiring part being disposed on the first via part,
wherein the first via conductive pattern is directly connected to the first wiring conductive pattern, and
wherein the first wiring seed pattern being between the first wiring conductive pattern and the second dielectric layer.

3. The method of claim 2, wherein the first via seed pattern being between the first via conductive pattern and the first dielectric layer, and
the first wiring seed pattern being between a bottom surface of the first wiring conductive pattern and the first dielectric layer, and between a sidewall of the first wiring conductive pattern and the second dielectric layer.

4. The method of claim 2, wherein a first angle between a bottom surface of the first via part and a sidewall of the first via part is greater than a second angle between a bottom surface of the first wiring part and a sidewall of the first wiring part.

5. The method of claim 1,
wherein the second redistribution pattern includes:
a second wiring part having a second wiring seed pattern and a second wiring conductive pattern on the second wiring seed pattern; and
a second via part having a second via seed pattern and a second via conductive pattern on the second via seed pattern, the second wiring part being disposed on the second via part,
wherein the second via conductive pattern is directly connected to the second wiring conductive pattern, and
wherein a sidewall of the second wiring conductive pattern is in contact with the third dielectric layer.

6. The method of claim 5, wherein the second via seed pattern being between the second via conductive pattern and the second dielectric layer, and
the second wiring seed pattern being between a bottom surface of the second wiring conductive pattern and the second dielectric layer.

7. The method of claim 1,
wherein the third redistribution pattern includes:
a third wiring part having a third wiring seed pattern and a third wiring conductive pattern on the third wiring seed pattern, the third wiring seed pattern being between a bottom surface of the third wiring conductive pattern and the third dielectric layer; and
a third via part having a third via seed pattern and a third via conductive pattern on the third via seed pattern, the third wiring part being disposed on the third via part,
wherein the third via conductive pattern is directly connected to the third wiring conductive pattern, and
wherein the third wiring seed pattern being between the third wiring conductive pattern and the fourth dielectric layer.

8. The method of claim 7, wherein the third via seed pattern being between the third via conductive pattern and the third dielectric layer, and
the third wiring seed pattern being between a bottom surface of the third wiring conductive pattern and the third dielectric layer, and between a sidewall of the third wiring conductive pattern and the fourth dielectric layer.

9. The method of claim 1, wherein the first hole disposed within an area corresponding to the first trench,
wherein the second hole disposed within an area corresponding to the second trench, and
wherein the third hole disposed within an area corresponding to the third trench.

10. The method of claim 1, further comprises:
forming on the fourth dielectric layer a passivation layer exposing the third redistribution pattern;
forming a conductive pad on the exposed top surface of the third redistribution pattern, the conductive pad coupled to the third redistribution pattern; and
forming a terminal pad on a bottom surface of the first dielectric layer after removing the carrier substrate, the terminal pad coupled to the first redistribution pattern.

11. The method of claim 10, further comprises:
mounting a semiconductor chip on the conductive pad;
forming a molding layer on the fourth dielectric layer to cover the semiconductor chip; and
forming an external connection terminal on the terminal pad.

12. A method of fabricating a semiconductor package comprising:
forming on a carrier substrate a first dielectric layer comprising a first hole exposing the carrier substrate;
forming a first seed layer conformally covering a top surface of first dielectric layer, a bottom surface and a sidewall of the first hole;
forming on the first seed layer a first resist pattern comprising a first trench;
forming a first conductive pattern filling in the first hole and the first trench to form a first redistribution pattern;
removing the first resist pattern and a portion of the first seed layer below the first resist pattern to form a first seed pattern;
forming on the first dielectric layer a second dielectric layer comprising a second hole which exposes the first redistribution pattern;
forming on the second dielectric layer a second resist pattern comprising a second trench;
forming a second seed pattern conformally covering a bottom surface and a sidewall of the second hole, and a second conductive pattern filling in the second hole and the second trench to form a second redistribution pattern;

removing the second resist pattern;

forming on the second dielectric layer a third dielectric layer comprising a third hole which exposes the second redistribution pattern;

forming a second seed layer conformally covering a top surface of third dielectric layer, a bottom surface and a sidewall of the third hole;

forming on the second seed layer a third resist pattern comprising a third trench;

forming a third conductive pattern filling in the third hole and the third trench to form a third redistribution pattern;

removing the third resist pattern and a portion of the second seed layer below the third resist pattern to form a third seed pattern; and forming a fourth dielectric layer on the third dielectric layer, the fourth dielectric layer exposes the third redistribution pattern, wherein the second dielectric layer is in contact with a sidewall of the first conductive pattern, the third dielectric layer is in contact with a sidewall of the second seed pattern, the fourth dielectric layer is in contact with a sidewall of the third conductive pattern.

13. The method of claim 12,
wherein the first redistribution pattern includes:
a first wiring part having a first wiring seed pattern and a first wiring conductive pattern on the first wiring seed pattern; and
a first via part having a first via seed pattern and a first via conductive pattern on the first via seed pattern, the first wiring part being disposed on the first via part,
wherein the first via conductive pattern is directly connected to the first wiring conductive pattern, and
wherein a sidewall of the first wiring conductive pattern is in contact with the second dielectric layer.

14. The method of claim 13, wherein the first via seed pattern being between the first via conductive pattern and the first dielectric layer, and
the first wiring seed pattern being between a bottom surface of the first wiring conductive pattern and the first dielectric layer.

15. The method of claim 12,
wherein the second redistribution pattern includes:
a second wiring part having a second wiring seed pattern and a second wiring conductive pattern on the second wiring seed pattern; and
a second via part having a second via seed pattern and a second via conductive pattern on the second via seed pattern, the second wiring part being disposed on the second via part,
wherein the second via conductive pattern is directly connected to the second wiring conductive pattern, and
wherein the second wiring seed pattern being between the second wiring conductive pattern and the third dielectric layer.

16. The method of claim 15, wherein the second via seed pattern being between the second via conductive pattern and the second dielectric layer, and
the second wiring seed pattern being between a bottom surface of the second wiring conductive pattern and the second dielectric layer, and between a sidewall of the second wiring conductive pattern and the third dielectric layer.

17. The method of claim 12,
wherein the third redistribution pattern includes:
a third wiring part having a third wiring seed pattern and a third wiring conductive pattern on the third wiring seed pattern; and
a third via part having a third via seed pattern and a third via conductive pattern on the third via seed pattern, the third wiring part being disposed on the third via part,
wherein the third via conductive pattern is directly connected to the third wiring conductive pattern, and
wherein a sidewall of the third wiring conductive pattern is in contact with the fourth dielectric layer.

18. The method of claim 17, wherein the third via seed pattern being between the third via conductive pattern and the third dielectric layer, and
the third wiring seed pattern being between a bottom surface of the third wiring conductive pattern and the third dielectric layer.

19. A method of fabricating a semiconductor package comprising:
providing a semiconductor chip on a carrier substrate;
forming on the carrier substrate a molding layer to cover the semiconductor chip;
removing the carrier substrate to expose a chip pad of semiconductor chip;
forming on a bottom surface of semiconductor chip a first dielectric layer comprising a first hole exposing the chip pad;
forming on the first dielectric layer a first resist pattern comprising a first trench;
forming a first seed pattern conformally covering a bottom surface and a sidewall of the first hole, and a first conductive pattern filling in the first hole and the first trench to form a first redistribution pattern, the first seed pattern is between the first conductive pattern and the first resist pattern;
removing the first resist pattern;
forming on the first dielectric layer a second dielectric layer comprising a second hole which exposes the first conductive pattern;
forming a second seed pattern conformally covering a bottom surface and a sidewall of the second hole;
forming on the second dielectric layer a second resist pattern comprising a second trench;
forming on the second seed pattern a second conductive pattern filling in the second hole and the second trench to form a second redistribution pattern, the second conductive pattern contacts with the second resist pattern;
removing the second resist pattern;
forming on the second dielectric layer a third dielectric layer comprising a third hole which exposes the second conductive pattern;
forming on the third dielectric layer a third resist pattern comprising a third trench;
forming a third seed pattern conformally covering a bottom surface and a sidewall of the third hole, and a third conductive pattern filling in the third hole and the third trench to form a third redistribution pattern, the third seed pattern is between the third conductive pattern and the third resist pattern;

removing the third resist pattern; and forming a fourth dielectric layer on the third dielectric layer, the fourth dielectric layer exposes the third redistribution pattern.

20. The method of claim 19, wherein the first redistribution pattern includes:
- a first wiring part having a first wiring seed pattern and a first wiring conductive pattern on the first wiring seed pattern; and
- a first via part having a first via seed pattern and a first via conductive pattern on the first via seed pattern, the first wiring part being disposed on the first via part,
- wherein the first wiring seed pattern being between the first wiring conductive pattern and the second dielectric layer, wherein the second redistribution pattern includes:
- a second wiring part having a second wiring seed pattern and a second wiring conductive pattern on the second wiring seed pattern; and
- a second via part having a second via seed pattern and a second via conductive pattern on the second via seed pattern, the second wiring part being disposed on the second via part,
- wherein a sidewall of the second wiring conductive pattern is in contact with the third dielectric layer.

\* \* \* \* \*